US012807036B2

(12) United States Patent
Kagami et al.

(10) Patent No.: US 12,807,036 B2
(45) Date of Patent: Nov. 24, 2026

(54) POWER SUPPLY SYSTEM AND PROGRAM

(71) Applicant: DENSO CORPORATION, Kariya-city (JP)

(72) Inventors: Yoshihiro Kagami, Kariya-city (JP); Taisuke Kurachi, Kariya-city (JP); Ryoya Kazaoka, Kariya-city (JP); Shunichi Kubo, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 19/209,893

(22) Filed: May 16, 2025

(65) Prior Publication Data

US 2025/0276612 A1 Sep. 4, 2025

Related U.S. Application Data

(63) Continuation of application No. PCT/JP2023/040374, filed on Nov. 9, 2023.

(30) Foreign Application Priority Data

Dec. 9, 2022 (JP) ................................ 2022-197450

(51) Int. Cl.

| | |
|---|---|
| ***B60L 58/20*** | (2019.01) |
| ***B60L 1/00*** | (2006.01) |
| ***B60L 50/60*** | (2019.01) |
| ***B60L 58/19*** | (2019.01) |
| ***G01R 19/165*** | (2006.01) |
| ***G01R 31/40*** | (2020.01) |
| ***H02M 1/14*** | (2006.01) |
| ***H02M 7/5387*** | (2007.01) |

(52) U.S. Cl.

CPC ............... *B60L 58/20* (2019.02); *B60L 1/003* (2013.01); *B60L 50/60* (2019.02); *B60L 58/19* (2019.02); *G01R 19/16538* (2013.01); *G01R 31/40* (2013.01); *H02M 1/14* (2013.01); *H02M 7/53871* (2013.01); *B60L 2210/12* (2013.01); *B60L 2210/14* (2013.01)

(58) Field of Classification Search

CPC ....................................................... B60L 58/20
USPC ........................................................ 307/10.1
See application file for complete search history.

(56) References Cited

U.S. PATENT DOCUMENTS

| | | | | |
|---|---|---|---|---|
| 3,707,668 | A * | 12/1972 | Johnston | H02M 7/5155 363/58 |
| 2020/0023794 | A1 | 1/2020 | Maekawa | |
| 2020/0317059 | A1 * | 10/2020 | Mikami | B60K 6/24 |
| 2021/0231707 | A1 | 7/2021 | Ock et al. | |
| 2023/0253805 | A1 | 8/2023 | Wang et al. | |
| 2024/0235206 | A1 * | 7/2024 | Preindl | H02M 3/158 |

FOREIGN PATENT DOCUMENTS

| | | | |
|---|---|---|---|
| JP | 2020-099129 | A | 6/2020 |
| WO | 2014/077522 | A1 | 5/2014 |

* cited by examiner

*Primary Examiner* — Joseph Chang
(74) *Attorney, Agent, or Firm* — Oliff PLC

(57) ABSTRACT

A power supply system includes a third-X electrical path which has a portion defined as a common path shared with at least portions of a second-X electrical path and a second-Y electrical path. The common path has a shared current sensor therein.

7 Claims, 40 Drawing Sheets

FIG.10

| SW3a | SW3b | A13 |
|---|---|---|
| ON | ON | DEPENDING ON DC/DC |
| OFF | ON | = 0 |
| OFF | OFF | = 0 |

FIG.11

| SW2a | SW2b | V1 | V2 | A12 | A13 |
|---|---|---|---|---|---|
| OFF | OFF | DEPENDING ON INV | DEPENDING ON INV | = −A11 | = 0 |
| ON | OFF | DEPENDING ON INV | DEPENDING ON INV | = −A11 | = 0 |
| ON | ON | 612V | 212V | DEPENDING ON INV | >0 |

FIG.13

| SW3a | SW3b | A13 |
|---|---|---|
| ON | ON | DEPENDING ON DC/DC |
| ON | OFF | = 0 |
| OFF | OFF | = 0 |

FIG.14

| SW3a | SW3b | A13 | V100 |
|---|---|---|---|
| ON | ON | DEPENDING ON DC/DC | DEPENDING ON DC/DC |
| OFF | ON | = 0 | 12V |
| OFF | OFF | = 0 | 12V |

FIG.15

| SW3a | SW3b | A13 | V100 |
|---|---|---|---|
| ON | ON | DEPENDING ON DC/DC | DEPENDING ON DC/DC |
| ON | OFF | = 0 | 12V |
| OFF | OFF | = 0 | 12V |

| SW3a | SW3b | V13 | A13 |
|---|---|---|---|
| ON | ON | DEPENDING ON DC/DC | >0 |
| OFF | ON | 12V | ≒0 |
| OFF | OFF | INCONSTANT | ≒0 |

| SW3a | SW3b | V13 | A13 |
|---|---|---|---|
| ON | ON | DEPENDING ON DC/DC | >0 |
| ON | OFF | INCONSTANT | ≒0 |
| OFF | OFF | INCONSTANT | ≒0 |

FIG.19

| SW2a | SW2b | V1 | V2 | A12 | A13 |
|---|---|---|---|---|---|
| OFF | OFF | DEPENDING ON INV | DEPENDING ON INV | = −A1 | = 0 |
| OFF | ON | DEPENDING ON INV | DEPENDING ON INV | = −A1 | = 0 |
| ON | ON | 612V | 212V | DEPENDING ON INV | >0 |

FIG.20

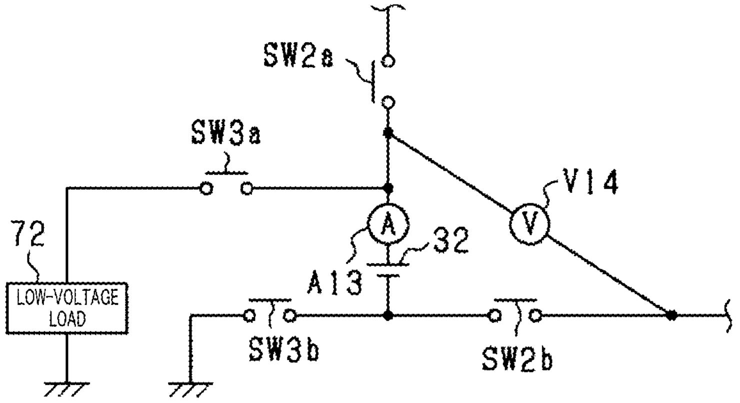

FIG.21

| SW2a | SW2b | V1 | V2 | V14 | A12 | A13 |
|---|---|---|---|---|---|---|
| OFF | OFF | DEPENDING ON INV | DEPENDING ON INV | INCONSTANT | = −A11 | = 0 |
| ON | OFF | DEPENDING ON INV | DEPENDING ON INV | V2−200 | = −A11 | = 0 |
| ON | ON | 612V | 212V | 12V | DEPENDING ON INV | >0 |

FIG.22

| SW2a | SW2b | V1 | V2 | V14 | A12 | A13 |
|---|---|---|---|---|---|---|
| OFF | OFF | DEPENDING ON INV | DEPENDING ON INV | INCONSTANT | = −A11 | = 0 |
| OFF | ON | DEPENDING ON INV | DEPENDING ON INV | 12V | = −A11 | = 0 |
| ON | ON | 612V | 212V | 12V | DEPENDING ON INV | >0 |

FIG.36(a)

| SW1d | SW2b | V1 | V2 | A12 | A11 | A13 |
|---|---|---|---|---|---|---|
| OFF | OFF | 400V | DEPENDING ON INV | = 0 | >0 | = 0 |
| ON | OFF | 400V | DEPENDING ON INV | = 0 | >0 | = 0 |
| ON | ON | DEPENDING ON INV | 212V | >0 | DEPENDING ON INV | >0 |

FIG.36(b)

| SW1d | SW2b | V1 | V2 | A12 | A11 | A13 |
|---|---|---|---|---|---|---|
| OFF | OFF | 400V | DEPENDING ON INV | = 0 | >0 | = 0 |
| OFF | ON | 400V | DEPENDING ON INV | >0 | = 0 | = 0 |
| ON | ON | DEPENDING ON INV | 212V | >0 | DEPENDING ON INV | >0 |

FIG.37(a)

| SW1d | SW2b | V1 | V2 | V14 | A12 | A11 | A13 |
|---|---|---|---|---|---|---|---|
| OFF | OFF | 400V | DEPENDING ON INV | INCONSTANT | = 0 | >0 | = 0 |
| ON | OFF | 400V | DEPENDING ON INV | V2-200 | = 0 | >0 | = 0 |
| ON | ON | DEPENDING ON INV | 212V | 12V | >0 | DEPENDING ON INV | >0 |

FIG.37(b)

| SW1d | SW2b | V1 | V2 | V14 | A12 | A11 | A13 |
|---|---|---|---|---|---|---|---|
| OFF | OFF | 400V | DEPENDING ON INV | INCONSTANT | = 0 | >0 | = 0 |
| OFF | ON | 400V | DEPENDING ON INV | 12V | = 0 | >0 | = 0 |
| ON | ON | DEPENDING ON INV | 212V | 12V | >0 | DEPENDING ON INV | >0 |

POWER SUPPLY SYSTEM AND PROGRAM

CROSS REFERENCE TO RELATED DOCUMENT

The present application claims the benefit of priority of Japanese Patent Application No. 2022-197450 filed on Dec. 9, 2022, the disclosure of which is incorporated in its entirety herein by reference.

TECHNICAL FIELD

This disclosure generally relates to a power supply system and a program.

BACKGROUND ART

The first patent literature shown below discloses a power supply system for vehicles which teaches how to detect occurrence of thermal sticking of a main relay installed in the power supply system.

PRIOR ART DOCUMENT

Patent Literature

FIRST PATENT LITERATURE: Japanese Patent First Publication No. 2020-99129

SUMMARY OF THE INVENTION

Power supply systems are in development which include a plurality of storage batteries, disconnect at least one of the storage batteries from a high-voltage circuit, and then connect it to a low-voltage circuit to deliver electrical power to the low-voltage circuit. Diagnosis of such power supply systems requires a plurality of current sensors installed therein. There is still room for improvement on a circuit structure of the power supply systems.

It is an object of this disclosure to provide a power supply system and a program which enable a required number of current sensors to be minimized.

There is provided a first power supply system capable of achieving the above-described object. The first power supply system is connected to a high-voltage circuit through a high-voltage power supply line and a high-voltage ground line, also connected to a low-voltage circuit through a low-voltage power supply line and a low-voltage ground line, and includes a plurality of electrical accumulators. The first power supply system comprises: (a) a first switch which is configured to selectively establish or block an electrical connection of a first electrical accumulator that s one of the electrical accumulators to the high-voltage circuit; (b) a second switch which is configured to selectively establish or block an electrical connection of a second accumulator that is one of the electrical accumulators to the first electrical accumulator; (c) a third switch which is configured to selectively establish or block an electrical connection between the second electrical accumulator and the low-voltage circuit; and (d) a switch controller which is configured to control operations of the first switch, the second switch, and the third switch. The second switch includes a second-X switch and a second-Y switch. The second-X switch works to selectively connect or disconnect a second-X electrical path connecting between a first end of the second electrical accumulator and the first electrical accumulator. The second-Y switch works to electrically connect or disconnect a second-Y electrical path extending between a second end of the second electrical accumulator which is located away from the first end of the second electrical accumulator and one of the high-voltage power supply line and the high-voltage ground line. The third switch includes a third-X switch and a third-Y switch. The third-X switch works to electrically connect or disconnect a third-X electrical path extending between a positive terminal of the second electrical accumulator and the low-voltage power supply line. The third-Y switch works to electrically connect or disconnect a third-Y electrical path extending between a negative terminal of the second electrical accumulator and the low-voltage ground line. At least one of the third-X electrical path and the third-Y electrical path has a common path. The common path of the third-X electrical path is shared with at least portions of the second-X electrical path and the second-Y electrical path. The common path of the third-Y electrical path is shared with at least portions of the second-X electrical path and the second-Y electrical path. The common path has a shared current sensor disposed therein.

The above structure enables the required number of current sensors to be decreased.

There is provided a first program which is capable of achieving the above-described object. The first program is executable by a controller installed in a power supply system which is connected to a high-voltage circuit through a high-voltage power supply line and a high-voltage ground line, also connected to a low-voltage circuit through a low-voltage power supply line and a low-voltage ground line, and includes a plurality of electrical accumulators. The power supply system comprises: (a) a first switch which is configured to selectively establish or block an electrical connection of a first electrical accumulator that is one of the electrical accumulators to the high-voltage circuit; (b) a second switch which is configured to selectively establish or block an electrical connection of a second accumulator that is one of the electrical accumulators to the first electrical accumulator; and (c) a third switch which is configured to selectively establish or block an electrical connection between the second electrical accumulator and the low-voltage circuit. The second switch includes a second-X switch and a second-Y switch. The second-X switch works to selectively connect or disconnect a second-X electrical path connecting between a first end of the second electrical accumulator and the first electrical accumulator. The second-Y switch works to electrically connect or disconnect a second-Y electrical path extending between a second end of the second electrical accumulator which is located away from the first end of the second electrical accumulator and one of the high-voltage power supply line and the high-voltage ground line. The third switch includes a third-X switch and a third-Y switch. The third-X switch works to electrically connect or disconnect a third-X electrical path extending between a positive terminal of the second electrical accumulator and the low-voltage power supply line. The third-Y switch works to electrically connect or disconnect a third-Y electrical path extending between a negative terminal of the second electrical accumulator and the low-voltage ground line. The program performs (a) a switch control task to control operations of the first switch, the second switch, and the third switch, and (b) a malfunction diagnosis task to diagnose malfunctions of the first switch, the second switch, and the third switch. At least one of the third-X electrical path and the third-Y electrical path has a common path. The common path of the third-X electrical path is shared with at least portions of the second-X electrical path and the second-Y electrical path. The common path of the third-Y electrical path is shared with at least portions of the second-X electrical path and the second-Y electrical path. The common path has a shared current sensor disposed therein. The malfunction diagnosis task works to analyze an output from the shared current sensor obtained when the second switch is changed between an on-state and an off-state thereof to determine whether the second switch is malfunctioning. The malfunction diagnosis task also works to analyze an output from the shared current sensor obtained when the third switch is changed between an on-state and an off-state thereof to determine whether the third switch is malfunctioning.

The above structure enables a required number of current sensors to be minimized.

BRIEF DESCRIPTION OF THE DRAWINGS

The above-described object, other objects, features, or beneficial advantages in this disclosure will be apparent from the following detailed discussion with reference to the drawings.

In the drawings:

FIG. 10 is a table representing a relation of on- or off-states of third switches and corresponding sensor outputs when the third switches are properly operating;

FIG. 11 is a table representing a relation of on- or off-states of second switches and corresponding sensor outputs when the second switches are properly operating;

FIG. 13 is a table representing a relation of on- or off-states of third switches and corresponding sensor outputs when the third switches are properly operating in the first modification;

FIG. 14 is a table representing a relation of on- or off-states of third switches and corresponding sensor outputs when the third switches are properly operating in the second modification;

FIG. 15 is a table representing a relation of on- or off-states of third switches and corresponding sensor outputs when the third switches are properly operating in the third modification;

FIG. 19 is a table representing a relation of on- or off-states of second switches and corresponding sensor outputs when the second switches are properly operating in the seventh modification;

FIG. 20 is a circuit diagram which illustrates a fourth voltage sensor installed in a power supply system in the eighth modification;

FIG. 21 is a table representing a relation of on- or off-states of second switches and corresponding sensor outputs when the third switches are properly operating in the eighth modification;

FIG. 22 is a table representing a relation of on- or off-states of second switches and corresponding sensor outputs when the second switches are properly operating in the ninth modification;

FIGS. 36(*a*) and 36(*b*) are tables each of which represents a relation of on- or off-states of switches and corresponding sensor outputs in the seventeenth modification;

FIGS. 37(*a*) and 37(*b*) are tables each of which represents a relation of on- or off-states of switches and corresponding sensor outputs in the seventeenth modification;

MODE FOR CARRYING OUT THE INVENTION

Embodiments and modifications thereof will be described below with reference to the drawings. Parts of the embodiments or the modifications functionally or structurally corresponding to each other or associated with each other will be denoted by the same reference numbers or by reference numbers which are different in the hundreds place from each other. The corresponding or associated parts may refer to the explanation in the other embodiments.

First Embodiment

A power supply system according to the first embodiment of this disclosure will be described below with reference to the drawings. The power supply system in this embodiment is installed in a vehicle, such as an electric vehicle or a hybrid vehicle and functions as an in-vehicle system.

Figure 1:
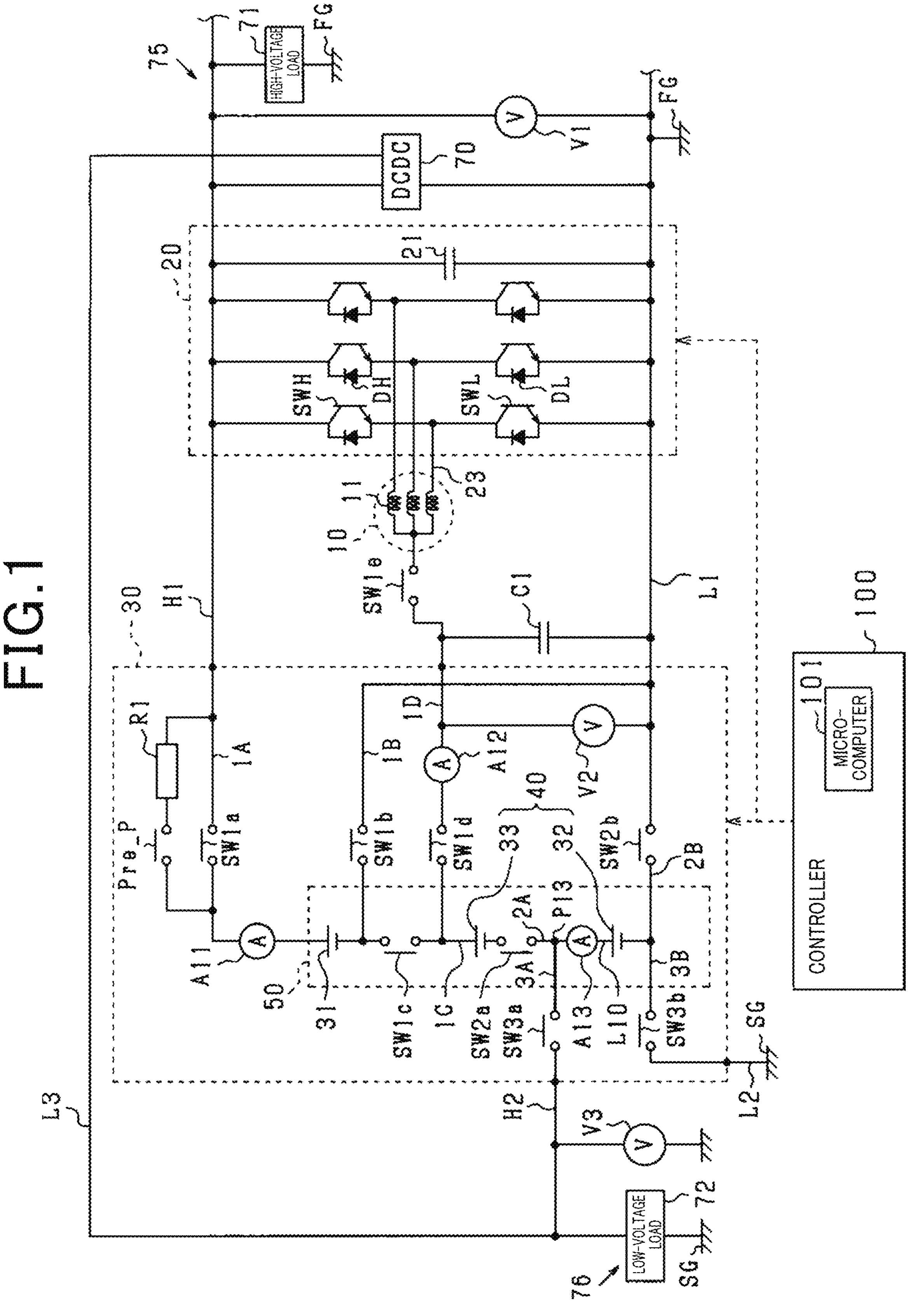
FIG. 1 is a structural view which shows an in-vehicle system according to the first embodiment.

The in-vehicle system, as illustrated in FIG. 1, includes the motor 10, the inverter 20 (i.e., an inverter circuit), the high-voltage power supply line H1, the high-voltage ground line L1, the low-voltage power supply line H2, the low-voltage ground line L2, the power supply system 30, and the DC-to-DC converter 70 (i.e., voltage-converter).

The motor 10 is designed as a three-phase synchronous machine which includes a rotor (not shown) and a U-phase, a V-phase, and a W-phase armature windings 11 which are star-connected together. The U-phase, V-phase, and W-phase armature windings 11 are shifted or offset by an electrical angle of 120° from each other. The motor 10 is implemented by, for example, a permanent magnet synchronous machine. The rotor of the motor 10 is capable of transmitting power to drive wheels of the vehicle. In other words, the motor 10 works as a torque source to move the vehicle.

The inverter 20 includes series-connected units of upper arm switches SWH and lower arm switches SWL for three phases. The upper arm diodes DH that are freewheel diodes are connected in reverse parallel to the upper arm switches SWH. Similarly, the lower arm diodes DL that are freewheel diodes are connected in reverse parallel to the lower arm switches SWL. In this embodiment, each of the switches SWH and SWL is implemented by an IGBT.

The inverter 20 includes the smoothing capacitor 21 (which will also be referred to below as a first smoothing capacitor). The smoothing capacitor 21 has a high-potential terminal connecting with a first end of the high-voltage power supply line H1. The smoothing capacitor 21 also has a low-potential terminal connecting with a first end of the high-voltage ground line L1. The smoothing capacitor 21 may be disposed outside the inverter 20.

Each of the U-phase, V-phase, and W-phase upper arm switches SWH has a low-potential terminal (i.e., an emitter). Each of the U-phase, V-phase, and W-phase lower arm switches SWL has a high-potential terminal (i.e., a collector). The joint of the high-potential terminal of each of the U-phase, V-phase, and W-phase upper arm switches SWH and the low-potential terminal of a corresponding one of the U-phase, V-phase, and W-phase lower arm switches SWL is connected to a first end of a corresponding one of the U-phase, V-phase, and W-phase armature windings 11 using one of the conductors 23, such as busbars. The armature windings 11 have second ends connected together at a neutral point. In this embodiment, the U-phase, V-phase, and W-phase armature windings 11 are identical in number of turns with each other, so that inductances thereof are identical with each other.

The collector of each of the U-phase, V-phase, and W-phase upper arm switches SWH connects with the high-voltage power supply line H1. The emitter of each of the U-phase, V-phase, and W-phase lower arm switches SWL connects with the high-voltage ground line L1. The high-voltage ground line L1 connects with the first ground FG. The motor 10, therefore, connects with the high-voltage power supply line H1 through the inverter 20. Either or both of the motor 10 and the inverter 20 may be included or not included in the power supply system 30.

The high-voltage load 71 including a variety of high-voltage devices (not shown) is disposed between the high-voltage power supply line H1 and the high-voltage ground line L1. The high-voltage load 71 is an electrical load, such as an air compressor, which requires a high voltage level to operate. The motor 10 or the DC-to-DC converter 70 which will be described later in detail is a type of the high-voltage load 71. In this embodiment, the motor 10, the inverter 20, the high-voltage load 71, and an electrical path connecting them form the high-voltage circuit 75. The high-voltage circuit 75 connects with the power supply system 30 through the high-voltage power supply line H1 and the high-voltage ground line L1.

The low-voltage load 72 including a variety of low-voltage devices is disposed between the low-voltage power supply line H2 and the low-voltage ground line L2. The low-voltage load 72 is an electrical load, such as a controller, e.g., an electronic control unit (ECU), which requires a low voltage level to operate which is lower than that required by the high-voltage load 71. The low-voltage load 72 includes an electrical device, such as an ECU, which requires a dark current (i.e. a standby current) to operate. The low-voltage ground line L2 is connected to the second ground SG. The second ground SG is electrically isolated from the first ground FG. The low-voltage load 72 and an electrical path connecting to it form the low-voltage circuit 76. The low-voltage circuit 76 connects with the power supply system 30 through the low-voltage power supply line H2 and the low-voltage ground line L2.

The DC-to-DC converter 70 functions to convert an inputted electrical power from one voltage to another. The DC-to-DC converter 70 is disposed or connected between the high-voltage power supply line H1 and the high-voltage ground line L1 and works to step-down a voltage level of electrical power inputted thereinto from the high-voltage power supply line H1 and deliver it to the low-voltage circuit 76. The low-voltage circuit 76 includes the low-voltage load 72 connecting with the low-voltage power supply line H2 through the power transmission line L3.

The DC-to-DC converter 70 also works to step-up a voltage level of electrical power inputted thereinto from the low-voltage power supply line H2 through the power transmission line L3 and deliver it the high-voltage load 71 connecting with the high-voltage power supply line H1. The DC-to-DC converter 70 is controlled in operation by the controller 100 which will be described later in detail. The DC-to-DC converter 70 may be included in or installed outside the power supply system 30. The DC-to-DC converter 70 in the first embodiment may be designed not to include the step-up function.

The power supply system 30 will be described below. The power supply system 30 includes the first storage battery 31 (also referred to below as a first electrical accumulator), the second storage battery 32 (also referred to below as a second electrical accumulator), and the third storage battery 33 (also referred to below as a third electrical accumulator). The storage batteries 31, 32, and 33 serve as power sources for use in rotating a rotor of the motor 10. Each of the storage batteries is implemented by an assembled battery made of electrical cells connected in series with each other. The electrical cells are made of secondary batteries, such as lithium-ion batteries.

The first storage battery 31 is the highest in output voltage among the storage batteries (which will also be referred to below as electrical accumulators) 31, 32, and 33 and configured to output a voltage of, for example, 400V. The second storage battery 32 is lower in output voltage than the first storage battery 31 and configured to output a voltage of, for example, 12V. The output voltage developed by the third storage battery 33 may be optionally determined, e.g., 200V in this embodiment. A voltage appearing across terminals (which will also be referred to below as a terminal voltage) of each of the storage batteries 31, 32, and 33 may be optionally set.

The power supply system 30 also includes the first-A switch SW1*a* disposed in the first-A electrical path 1A which connects between a positive terminal of the first storage battery 31 and the high-voltage power supply line H1. The first-A switch SW1*a* works to establish or block an electrical connection between the positive terminal of the first storage battery 31 and the high-voltage power supply line H1, in other words, electrically connect or disconnect the first-A electrical path 1A.

A series-connected assembly of the pre-charge switch Pref_P and the resistor R1 may be, as illustrated in FIG. 1, connected to the first-A switch SW1*a*. The first-A switch SW1*a* serves as a high-potential main system relay switch.

The power supply system 30 also includes the first-B switch SW1*bw* disposed in the first-B electrical path 1B connecting between a negative terminal of the first storage battery 31 and the high-voltage ground line L1. The first-B switch SW1*b* works to establish or block an electrical connection between the negative terminal of the first storage battery 31 and the high-voltage ground line L1, in other words, electrically connect or disconnect the first-B electrical path 1B.

The power supply system 30 also includes the first-C switch SW1*c* disposed in the first-C electrical path 1C connecting between the negative terminal of the first storage battery 31 and the positive terminal of the first series-connected assembly 40 which includes the second storage battery 32 and the third storage battery 33. The first-C switch SW1*c* works to establish or block an electrical connection between the negative terminal of the first storage battery 31 and the positive terminal of the first series-connected assembly 40, in other words, electrically connect or disconnect the first-C electrical path 1C.

The first series-connected assembly 40 is created by a series connection of the negative terminal of the third storage battery 33 and the positive terminal of the second storage battery 32. The positive terminal of the first series-connected assembly 40, therefore, corresponds to the positive terminal of the third storage battery 33, while the negative terminal of the first series-connected assembly 40 corresponds to the negative terminal of the second storage battery 32. The first-C switch SW1*c* works to establish or block an electrical connection between the first storage battery 31 and the second storage battery 32.

The power supply system 30 also includes the first-D switch SW1*d* and the first-E switch SW1*e* which are disposed in the first-D electrical path 1D connecting between the neutral point of the armature windings 11 of the motor 10 and the positive terminal of the first series-connected assembly 40. The first-D electrical path 1D has a first end which connects with a connection between the first-C switch SW1*c* and the positive terminal of the third storage battery 33 in the first-C electrical path 1C. The first-D switch SW1*d* and the first-E switch SW1*e* function to electrically connect or disconnect the first-D electrical path 1D.

The first-E switch SW1*e* is arranged in a portion of the first-D electrical path 1D which is located close to the neutral point. The neutral point-side smoothing capacitor C1, which will also be referred to below as a second smoothing capacitor, is disposed between the first-D electrical path 1D and the high-voltage ground line L1. The neutral point-side smoothing capacitor C1 has a high-potential terminal connecting between the first-D switch SW1*d* and the first-E switch SW1*e* in the first-D electrical path 1D.

The motor 10 has the armature windings 11 which are, as clearly illustrated in FIG. 1, connected to the high-voltage ground line L1 through the inverter 20. When each of the lower arm switches SWL of the inverter 20 is turned on, it connects the first-D electrical path 1D with the high-voltage ground line L1. The first-C switch SW1*c*, the first-D switch SW1*d*, and the first-E switch SW1*e*, therefore, function to selectively connect or disconnect between the negative terminal of the first storage battery 31 and the high-voltage ground line L1.

The power supply system 30 also includes the second-A switch SW2*a* disposed in the second-A electrical path 2A which connects the negative terminal of the third storage battery 33 and the positive terminal of the second storage battery 32. The second-A switch SW2*a* works to selectively establish or block an electrical connection between the negative terminal of the third storage battery 33 and the positive terminal of the second storage battery 32. In other words, the second-A switch SW2*a* serves to electrically connect or disconnect the second-A electrical path 2A.

The first-C switch SW1*c*, the third storage battery 33, and the second-A switch SW2*a* are, as can be seen in FIG. 1, connected in series with each other between the first storage battery 31 and the second storage battery 32. In operation, when the first-C switch SW1*c* is turned on, the second-A switch SW2*a* functions to establish or block an electrical connection between the first storage battery 31 and the second storage battery 32 instead of the first-C switch SW1*c*.

The power supply system 30 also includes the second-B switch SW2*b* disposed in the second-B electrical path 2B connecting the negative terminal of the first series-connected assembly 40 and the high-voltage ground line L1 together. The second-B switch SW2*b* works to electrically connect or disconnect the second-B electrical path 2B, in other words, selectively establish or block an electrical connection between the negative terminal of the first series-connected assembly and the high-voltage ground line L1. The second-B switch SW2*b* serves as a low-potential main system relay switch.

The power supply system 30 also includes the third-A switch SW3*a* disposed in the third-A electrical path 3A connecting the positive terminal of the second storage battery 32 and the low-voltage power supply line H2 together. The third-A switch SW3*a* works to selectively establish or block an electrical connection between the positive terminal of the second storage battery 32 and the low-voltage power supply line H2, in other words, electrically connect or disconnect the third-A electrical path 3A.

The third-A electrical path 3A has an end (which leads to the second storage battery 32) connecting with the junction P13 of the second-A switch SW2*a* and the positive terminal of the second storage battery 32 in the second-A electrical path 2A. In other words, the second-A electrical path 2A has an end (which leads to the second storage battery 32) connecting with the junction P13 of the third-A switch SW3*a* and the positive terminal of the second storage battery 32 in the third-A electrical path 3A. To say it in another way, an electrical path extending between the junction P13 and the positive terminal of the second storage battery 32 includes portions of the second-A electrical path 2A and the third-A electrical path 3A. In the following discussion, the electrical path between the junction P13 and the positive terminal of the second storage battery 32 will also be referred to below as the common path L10.

The power supply system 30 also includes the third-B switch SW3*b* disposed in the third-B electrical path 3B connecting the negative terminal of the second storage battery 32 and the low-voltage ground line L2 together. The third-B switch SW3*b* works to selectively establish or block an electrical connection between the negative terminal of the second storage battery 32 and the low-voltage ground line L2, in other words, electrically connect or disconnect the third-B electrical path 3B.

Each of the switches SW1*a*, SW1*b*, SW1*c*, SW1*d*, SW1*e*, SW2*a*, SW2*b*, SW3*a*, and SW3*b* (which will be generally referred below as switches SW) is made of a mechanical relay. When turned off, each of the switches SW blocks a flow of electrical current therethrough, while when turned on, each of the switches SW allows a flow of electrical current in both directions. Each of the switches SW may alternatively be made of a semiconductor switching device.

The power supply system 30 is also equipped with a variety of sensors. Specifically, the first current sensor A11 is, as illustrated in FIG. 1, installed in the first-A electrical path 1A. The second current sensor A12 is installed in the first-D electrical path 1D. The third current sensor A13 is installed in the second-A electrical path 2A.

The layout of the third current sensor A13 will be described below in detail. The third current sensor A13 is located in an electrical path extending from the junction P13 to the positive terminal of the second storage battery 32, in other words, in the common path L10. The third current sensor A13, therefore, works to measure an electrical current flowing in the second-A electrical path 2A and the third-A electrical path 3A.

The third current sensor A13 has a variable measurement range. Specifically, the third current sensor A13 is capable of changing between a first measurement range and a second measurement range. The first measurement range is a range in which an electrical current flowing in the second-A electrical path 2A is measured. The second measurement range is a range in which an electrical current flowing in the third-A electrical path 3A is measure. The first measurement range to measure the electrical current in the second-A electrical path 2A is set to be wider than the second measurement range to measure the electrical current in the third-A electrical path 3A. For instance, the first measurement range is selected to measure an electrical current of 100 A to 200 A flowing in the second-A electrical path 2A. The second measurement range is selected to measure an electrical current of several tens of A (ampere) flowing in the third-A electrical path 3A.

The third current sensor A13 has a resolution which is changed with a change between the first and second measurement ranges. Specifically, when it is required to measure the electrical current flowing in the third-A electrical path 3A, the resolution of the third current sensor A13 is changed to be higher (i.e., more precisely) than that when it is required to measure the electrical current flowing in the second-A electrical path 2A.

The first voltage sensor V1 is installed between the high-voltage power supply line H1 and the high-voltage ground line L1 to measure voltage (i.e., a potential difference) appearing therebetween. Specifically, the first voltage sensor V1 measures a terminal voltage, i.e., voltage appearing across terminals of the smoothing capacitor 21 installed in the inverter 20. The second voltage sensor V2 is installed between the first-D electrical path 1D and the high-voltage ground line L1 to measure voltage (i.e., a potential difference) appearing therebetween. Specifically, the second voltage sensor V2 measures a terminal-to-terminal voltage, i.e., voltage appearing across terminals of the neutral point-side smoothing capacitor C1. The third voltage sensor V3 is installed between the low-voltage power supply line H2 and the low-voltage ground line L2 (i.e., the second ground SG) to measure voltage (i.e., a potential difference) appearing therebetween.

The power supply system 30 also includes the controller 100. The controller 100 includes the microcomputer 101 which includes a CPU, a RAM, a ROM, etc. Functions performed by the microcomputer 101 may be achieved by a combination of software stored in a tangible memory and a computer executing the software, only software, only hardware, or a combination thereof. For instance, in a case where the microcomputer 101 is made of an electronic circuit (i.e., hardware), the electronic circuit may include a digital circuit or an analog circuit which consists of a plurality of logic circuits. For instance, the microcomputer 101 works to execute programs stored in a non-transitory tangible storage medium installed therein in the form of a storage memory. The programs include programs which will be described later with reference to FIGS. 9 and 12. The programs are executed to perform predetermined tasks. The storage memory may be implemented by a non-volatile memory. The programs retained in the storage memory may be updated using an over-the-air or a communication network, such as the internet.

Outputs of the sensors (i.e., the current sensors A11 to A13 and the voltage sensors V1 to V3) are inputted into the controller 100. Outputs from other sensors (not shown), e.g., voltage sensors or voltage monitoring sensors which measure terminal voltages (and/or cell voltages) developed at the storage batteries 31, 32, and 33, current sensors which measure electrical currents flowing in the storage batteries 31, 32, and 33, an angle sensor which measures an angular position (e.g., an electrical angle) of the rotor of the motor 10, and/or phase current sensors which measure electrical currents flowing in the armature windings 11.

The controller 100 analyzes the outputs from the sensors to execute the programs to perform given tasks which include a control task to control the operation of the inverter 20. Specifically, the controller 100 analyzes the outputs from the sensors to control switching operations of the upper and lower arm switches SWH and SWL to bring a controlled parameter (e.g., a degree of output torque) of the motor 10 into agreement with a target value in a feedback mode. The upper arm switches SWH and the lower arm switches SWL are alternately turned on for each phase. In the feedback mode, torque produced by the rotor of the motor 10 is transmitted to the drive wheels of the vehicle to propel the vehicle. The controller 100, therefore, serves as an inverter controller for the inverter 20.

The controller 100 works to control the operation of the DC-to-DC converter 70 to perform a voltage converting task. The controller 100, therefore, serves as a voltage controller.

The controller 100 also works to control on/off operations of the switches SW installed in the power supply system 30. The controller 100, therefore, serves as a switch controller. An example of how the controller 100 turns on or off the switches SW installed in the power supply system 30 will be described below.

Switching between on- and off-states of the switches SW when it is required to start moving the vehicle from a parked state thereof will be described below with reference to FIGS.

2 to 8. In FIGS. 2 to 8, flows of electrical current are indicated by dash-dotted lines. The following discussion will be made on the assumption that the switches SW are placed in on- and off-states illustrated in FIG. 2 when the vehicle is stopped or parked. The stopped state of the vehicle, as referred to in this discussion, means that an ignition switch of the vehicle is turned off, the vehicle is kept parked a predetermined period of time or more, or a shift lever of the vehicle is in a parked position.

In the parked state of the vehicle, the controller 100 works to connect only at least one of the storage batteries 31 to 33 installed in the power supply system 30, i.e., the second storage battery 32 in this example to the low-voltage power supply line H2 and the low-voltage ground line L2.

Figure 2:
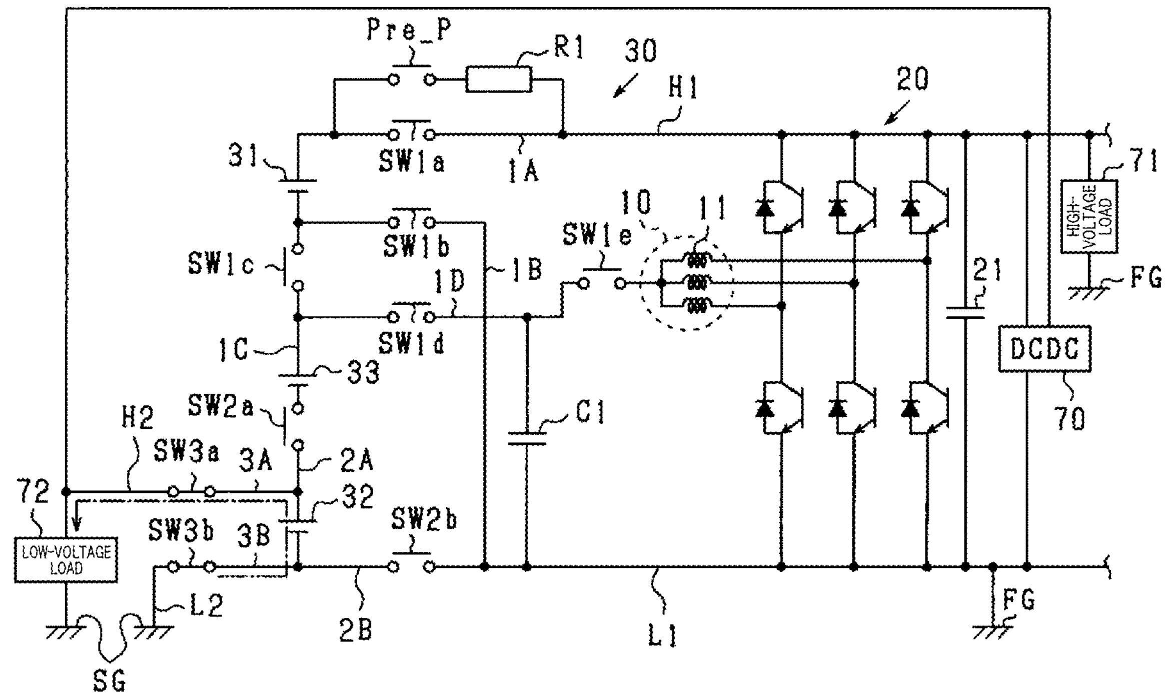
FIG. 2 is a circuit diagram which illustrates electrical connections of circuit components in the in-vehicle system of FIG. 1.

Specifically, the controller 100, as illustrated in FIG. 2, turns off the first-A switch SW1*a*, the first-B switch SW1*b*, the first-C switch SW1*c*, the first-D switch SW1*d*, the first-E switch SW1*e*, the second-A switch SW2*a*, and the second-B switch SW2*b* and turns on the third-A switch SW3*a* and the third-B switch SW3*b*. In an electrical circuit demonstrated in FIG. 2, a low-voltage power is delivered from the second storage battery 32 to the low-voltage load 72 (i.e., the low-voltage circuit 76) through the low-voltage power supply line H2. No electrical power is supplied from the first storage battery 31 to the high-voltage load 71 through the high-voltage power supply line H1.

When the vehicle is activated in the stopped state, the controller 100 works to connect at least one of the storage batteries 31 to 33 installed in the power supply system 30 (i.e., the second storage battery 32 in this example) to the low-voltage power supply line H2 and also connect at least one or all of the rest of the storage batteries 31 to 33 (i.e., the first storage battery 31 in this example) to the high-voltage power supply line H1. The time when the vehicle is activated, as referred to herein, represents a time when the ignition switch of the vehicle is turned on, the brake of the vehicle is released, or the shift lever of the vehicle is put in a drive position. Such a time may be a time when a given load, such as a sliding door or a key, installed in the vehicle, is turned on or activated.

Specifically, in order to avoid the inrush current, the controller 100 turns on the pre-charge switch Pre_P, the first-C switch SW1*c*, the first-D switch SW1*d*, and the first-E switch SW1*e* to electrically charge the in-inverter smoothing capacitor 21 through the inverter 20. More specifically, the controller 100 electrically charges the in-inverter smoothing capacitor 21 until a terminal voltage developed at the in-inverter smoothing capacitor 21 reaches a terminal voltage (e.g., 400V) at the first storage battery 31.

Figure 3:
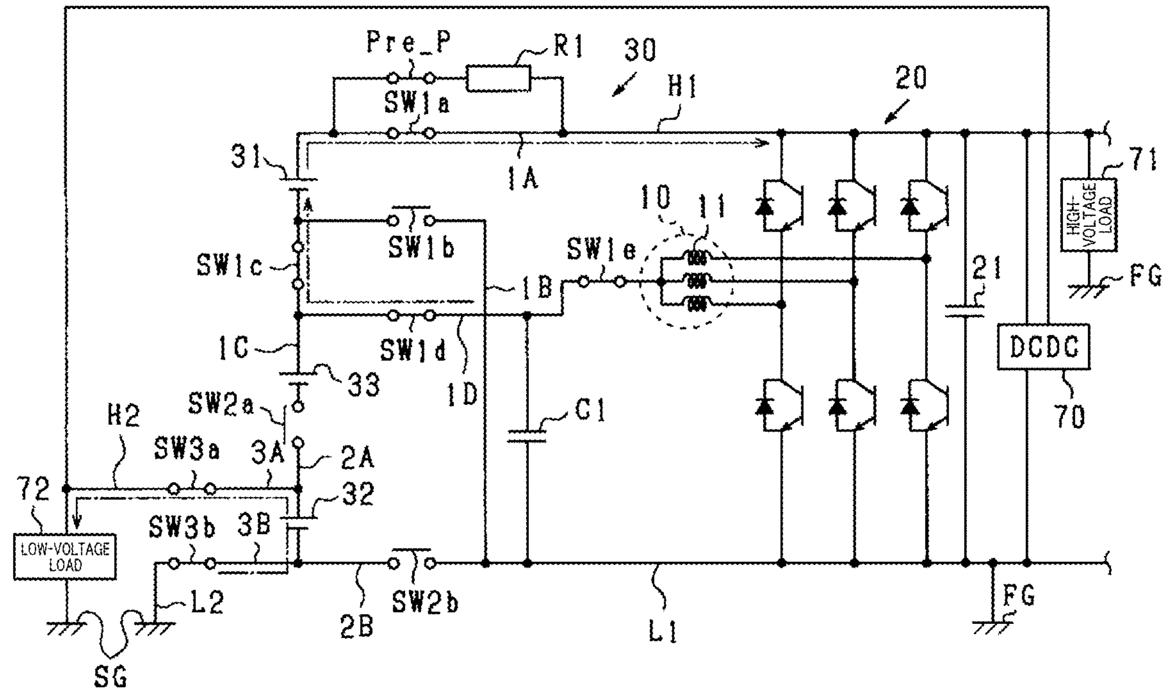
FIG. 3 is a circuit diagram which illustrates electrical connections of circuit components in the in-vehicle system of FIG. 1.

Afterwards, the controller 100 turns on the first-A switch SW1*a* and turns off the pre-charge switch Pre_P. In other words, the controller 100, as can be seen in FIG. 3, turns off the first-B switch SW1*b*, the second-A switch SW2*a*, and the second-B switch SW2*b* and turns on the first-A switch SW1*a*, the first-C switch SW1*c*, the first-D switch SW1*d*, the first-E switch SW1*e*, the third-A switch SW3*a*, and the third-B switch SW3*b*. In a circuit demonstrated in FIG. 3, the second storage battery 32 is placed in electrical connection with the low-voltage power supply line H2 and the low-voltage ground line L2, while the first storage battery 31 is placed in electrical connection with the high-voltage power supply line H1 and the neutral point of the motor 10.

In the circuit in FIG. 3, the high-voltage ground line L1 and the low-voltage ground line L2 are electrically isolated from each other. This causes a high-voltage power to be delivered from the first storage battery 31 to the high-voltage load 71 through the high-voltage power supply line H1, and also causes a low-voltage power to be delivered from the second storage battery 32 to the low-voltage load 72 through the low-voltage power supply line H2. In other words, the first storage battery 31 and the second storage battery 32 are electrically disconnected from each other, thus causing no high-voltage power to be supplied from the first storage battery 31 to the low-voltage load 72.

Figure 4:
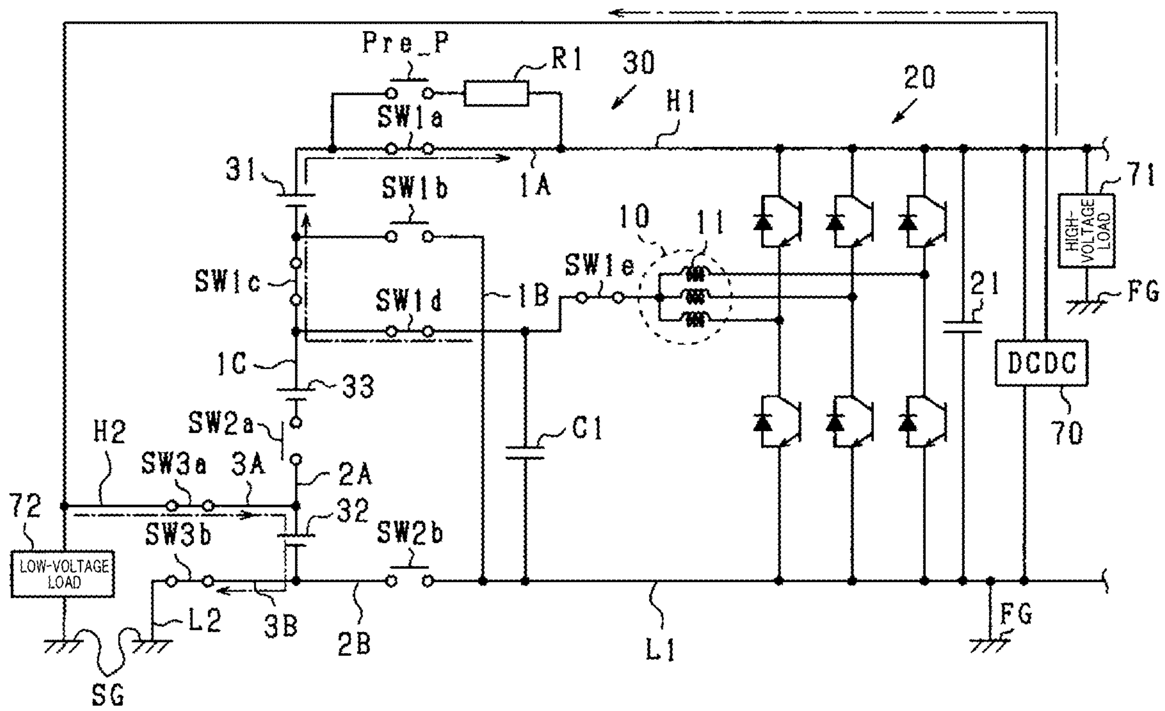
FIG. 4 is a circuit diagram which illustrates electrical connections of circuit components in the in-vehicle system of FIG. 1.

Subsequently, the controller 100, as illustrated in FIG. 4, activates the DC-to-DC converter 70 to step-down voltage inputted thereto and outputs it to the low-voltage load 72 through the power transmission line L3.

Figure 5:
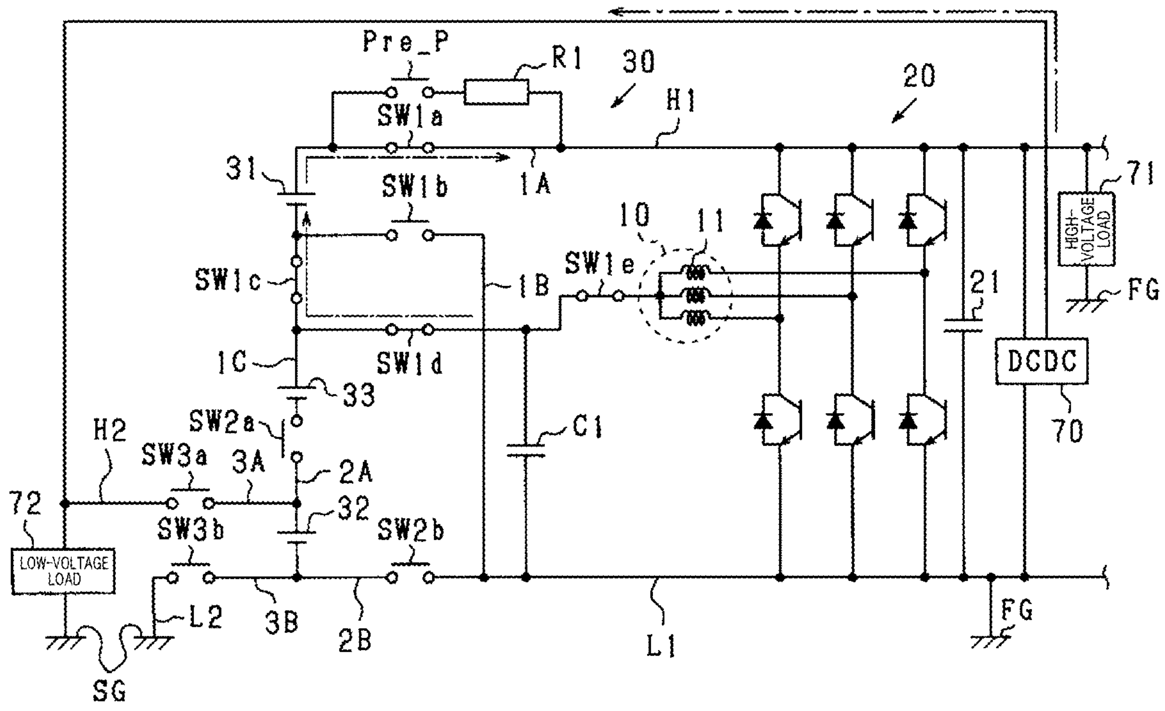
FIG. 5 is a circuit diagram which illustrates electrical connections of circuit components in the in-vehicle system of FIG. 1.

After the electrical power is delivered from the DC-to-DC converter 70 to the low-voltage circuit 76, the controller 100, as illustrated in FIG. 5, disconnects between the second storage battery 32 and the low-voltage power supply line H2 while keeping the electrical connection between the first storage battery 31 and the high-voltage power supply line H1.

Specifically, the controller 100, as demonstrated in FIG. 5, turns off the first-B switch SW1*b*, the second-A switch SW2*a*, the second-B switch SW2*b*, the third-A switch SW3*a*, and the third-B switch SW3*b* and turns on the first-A switch SW1*a*, the first-C switch SW1*c*, the first-D switch SW1*d*, and the first-E switch SW1*e*. In a circuit illustrated in FIG. 5, the second storage battery 31 is placed in electrical connection between the high-voltage power supply line H1 and the neutral point of the motor 10, while electrical connections between the low-voltage power supply line H2 and the positive terminal of the second storage battery 32 and between the low-voltage ground line L2 and the negative terminal of the second storage battery 32 are blocked. This causes the second storage battery 32 to be disconnected from the low-voltage circuit 76.

After the second storage battery 32 and the low-voltage circuit 76 are electrically disconnected from each other, the controller 100 makes the motor 10 and the inverter 20 function as a step-up converter (i.e., a boost chopper) to step-up voltage applied by the first storage battery 31 to electrically charge the in-inverter smoothing capacitor 21 and the neutral point-side smoothing capacitor C1. In other words, the controller 100 uses the armature windings 11 of the motor 10 as a coil of the boost chopper, the lower arm switches SWL (or the upper arm switches SWH) of the inverter 20 as input switches of the boost chopper, and the upper arm diodes DH (or the lower arm diodes DL) of the inverter 20 as freewheel diodes (also called flyback diodes) of the boost chopper to step-up the applied voltage. In this embodiment, the motor and the inverter 20, therefore, serve as a booster or a step-up transformer.

The electrical charging of the in-inverter smoothing capacitor 21 and the neutral point-side smoothing capacitor C1 is kept until the terminal voltage at the in-inverter smoothing capacitor 21 reaches 612 V that corresponds to voltage appearing across terminals of an assembly of the first storage battery 31 to the third storage battery 33 connected in series with each other, and a terminal voltage at the neutral point-side smoothing capacitor C1 reaches 212V that corresponds to voltage appearing across terminals of an assembly of the second storage battery 32 to the third storage battery 33 connected in series with each other.

Figure 6:
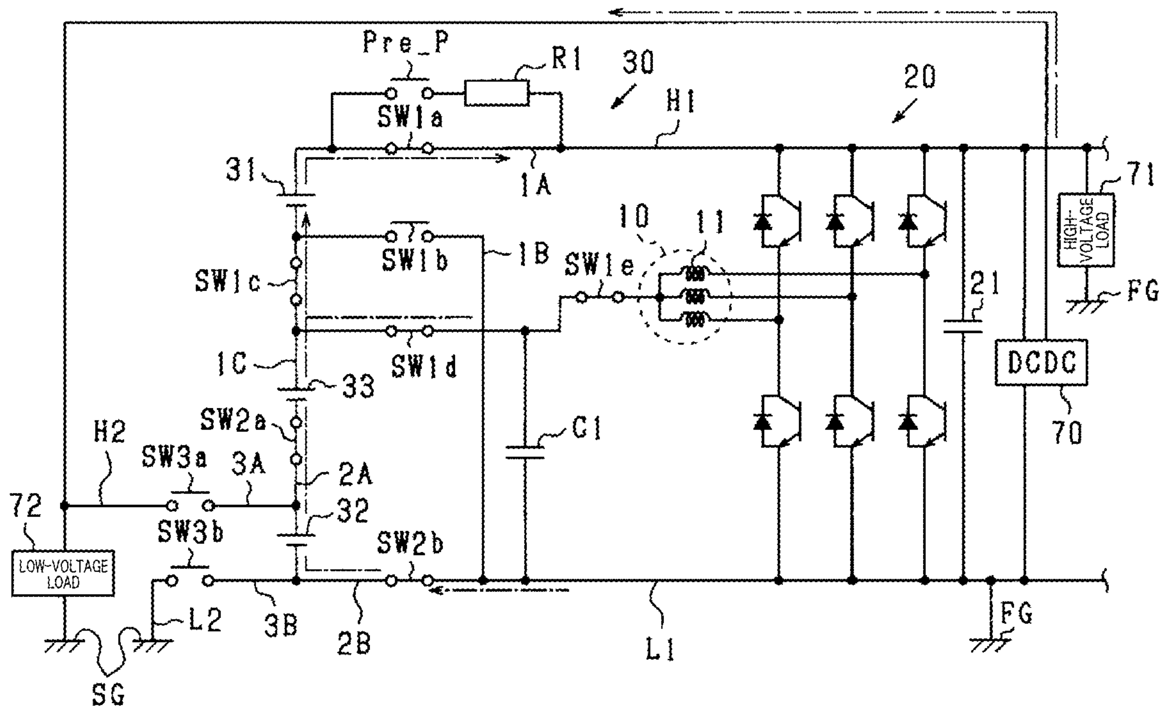
FIG. 6 is a circuit diagram which illustrates electrical connections of circuit components in the in-vehicle system of FIG. 1.

After the above-described charging is completed, the controller 100, as illustrated in FIG. 6, connects all the first storage battery 31 to the third storage battery 33 installed in the power supply system 30 to the high-voltage power supply line H1. Specifically, the controller 100, as illustrated in FIG. 6, turns off the first-B switch SW1*b*, the third-A switch SW3*a*, and the third-B switch SW3*b* and turns on the first-A switch SW1*a*, the first-C switch SW1*c*, the first-D switch SW1*d*, the first-E switch SW1*e*, the second-A switch SW2*a*, and the second-B switch SW2*b*.

In the circuit illustrated in FIG. 6, the first storage battery 31, the third storage battery 33, and the second storage battery 32 are placed in series connection with each other between the high-voltage power supply line H1 and the high-voltage ground line L1. In other words, a high-voltage power (i.e., power of 400V+200V+12V) is delivered from the second series-connected assembly 50 of the first storage battery 31, the third storage battery 33, and the second storage battery 32 to the high-voltage load 71 of the high-voltage circuit 75 using the high-voltage power supply line H1. This delivers the high-voltage power to the motor 10 and the high-voltage load 71 to properly operate the vehicle.

The power which is, as can be seen in FIG. 6, supplied to the high-voltage circuit 75 is stepped-down by the DC-to-DC converter 70 and then delivered to the low-voltage load 72. The in-inverter smoothing capacitor 21 has been electrically charged until a terminal voltage developed thereat reaches 612V, while the neutral point-side smoothing capacitor C1 also has been electrically charged until a terminal voltage developed thereat rises up to 212V. This minimizes a risk that flows of electrical current in the power supply system 30 may become unstable due to a change in voltage in the power supply system 30 which arises from a change in layout of electrical connections of the parts of the power supply system to that demonstrated in FIG. 6.

Figure 7:
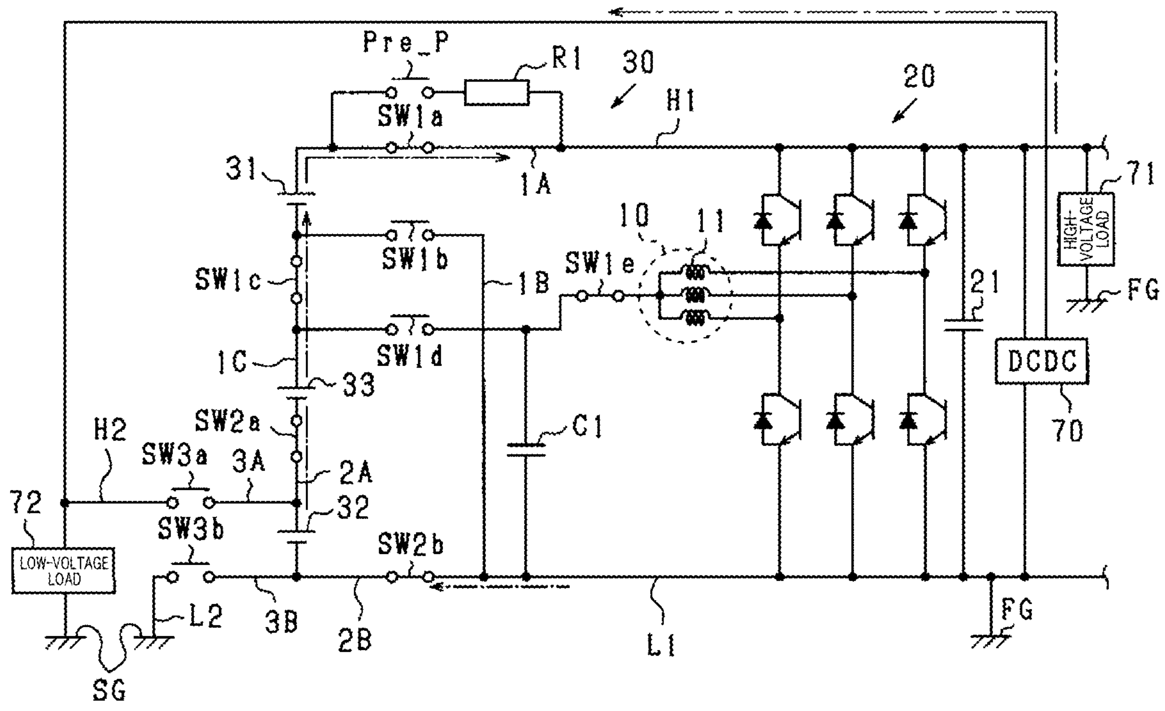
FIG. 7 is a circuit diagram which illustrates electrical connections of circuit components in the in-vehicle system of FIG. 1.
Figure 8:
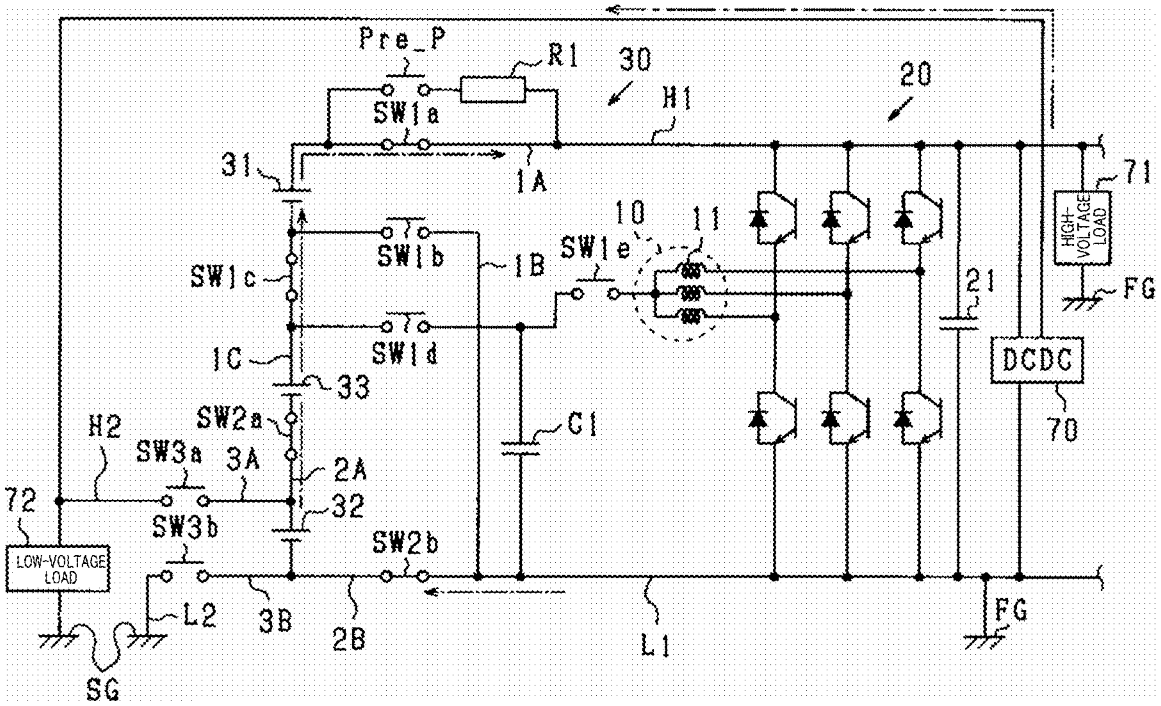
FIG. 8 is a circuit diagram which illustrates electrical connections of circuit components in the in-vehicle system of FIG. 1.

Afterwards, the controller 100, as demonstrated in FIG. 7, changes the first-D switch SW1*d* from the on-state to the off-state and activates the motor 10 and the inverter 20 to electrically discharge the neutral point-side smoothing capacitor C1. After completion of the discharging of the neutral point-side smoothing capacitor C1, the controller 100, as illustrated in FIG. 8, switches the first-E switch SW1*e* from the on-state to the off-state.

As apparent from the above discussion in the first embodiment, the first-A switch SW1*a* (or the pre-charge switch Pre_P), the first-C switch SW1*c*, the first-D switch SW1*d*, and the first-E switch SW1*e* serve as first switches to selectively establish or block an electrical connection between the first storage battery 31 and the high-voltage circuit 75. In the following discussion, each of the first-A switch SW1*a*, the first-C switch SW1*c*, the first-D switch SW1*d*, and the first-E switch SW1*e* will also be referred to below as the first switch.

Similarly, the second-A switch SW2*a* and the second-B switch SW2*b* serves as a second switch to selectively establish or block an electrical connection between the first storage battery 31 and the second storage battery 32. In the following discussion, each of the second-A switch SW2*a* and the second-B switch SW2*b* will also be referred to below as the second switch.

The third-A switch SW3*a* and the third-B switch SW3*b* also serve as third switches to selectively establish or block an electrical connection between the second storage battery 32 and the low-voltage circuit 76. In the following discussion, each of the third-A switch SW3*a* and the third-B switch SW3*b* will also be referred to below as the third switch.

The first-A switch SW1*a* also serves as a first-X switch to selectively establish or block an electrical connection between the positive terminal of the first storage battery 31 and the high-voltage power supply line H1. The first-A electrical path 1A connecting between the positive terminal of the first storage battery 31 and the high-voltage power supply line H1 will also be referred to below as a first-X electrical path.

The first-C switch SW1*c*, the first-D switch SW1*d*, and the first-E switch SW1*e* serve as a first-Y switch to selectively establish or block an electrical connection between the negative terminal of the first storage battery 31 and the high-voltage ground line L1. An electrical path extending between the negative terminal of the first storage battery 31 and the high-voltage ground line L1 will also be referred to below as a first-Y electrical path.

The second-A switch SW2*a* also serves as a second-X switch to selectively establish or block an electrical connection between the second storage battery 32 and the first storage battery 31. The second-A electrical path 2A which connects the second storage battery 32 and the first storage battery 31 together will also be referred to below as a second-X electrical path.

The second-B switch SW2*b* serves as a second-Y switch to selectively establish or block an electrical connection between the high-voltage ground line L1 and one (i.e., the negative terminal) of the ends of the second storage battery 32 which is located farther away from the second-A switch SW2*a*. The second-B electrical path 2B will also be referred to below as a second-Y electrical path extending between the second-B electrical path 2B and one (i.e., the negative terminal) of the ends of the second storage battery 32 which is located farther away from the second-A switch SW2*a*.

The third-A switch SW3*a* serves as a third-X switch to selectively establish or block an electrical connection between the positive terminal of the second storage battery 32 and the low-voltage power supply line H2. The third-A electrical path 3A will also be referred to below as a third-X electrical path connecting between the positive terminal of the second 25 storage battery 32 and the low-voltage power supply line H2.

The third-B switch SW3*b* serves as a third-Y switch to selectively establish or block an electrical connection between the negative terminal of the second storage battery 32 and the low-voltage ground line L2. An electrical path extending between the negative terminal of the second storage battery 32 and the low-voltage ground line L2 will be referred to below as a third-Y electrical path.

The second-A switch SW2*a*, the first-C switch SW1*c*, the first-D switch SW1*d*, and the first-E switch SW1*e* serve as a neutral point connecting switch to selectively establish or block an electrical connection of the neutral point of the motor to one or both of the first storage battery 31 and the second storage battery 32.

The on- or off-operations of the switches SW when the vehicle is deactivated from the activated state will be described below with reference to FIGS. 2 to 8. Basically, a sequence of steps to switch between the on-state and the off-state of the switches SW when the vehicle is deactivated is reverse to that when the vehicle is activated from the deactivated state. Explanation of the on- or off-operations of the switches SW when the vehicle is deactivated will, therefore, be discussed in a simplified way.

When the vehicle is being activated, the power supply system 30 is placed in the layout of electrical connections demonstrated in FIG. 8. Specifically, the controller 100 works to achieve a series-connection of the first storage battery 31, the third storage battery 33, and the second storage battery 32 between the high-voltage power supply line H1 and the high-voltage ground line L1. The power supply system 30 is not connected directly to the low-voltage circuit 76, but however, the DC-to-DC converter 70 steps down a high-voltage power and delivers it to the low-voltage load 72.

Upon the stop of the vehicle while it is being activated to operate, the controller 100, as demonstrated in FIG. 7, switches the first-E switch SW1*e* from the off-state to the on-state. The stop of the vehicle, as referred to herein, is achieved, for example, by turning off the ignition switch or putting the shift lever of the vehicle in the parking position.

After the first-E switch SW1*e* is turned on, the controller 100 operates the motor 10 and the inverter 20 to electrically charge the in-inverter smoothing capacitor 21. The charging is performed until a terminal voltage at the in-inverter smoothing capacitor 21 reaches a voltage of, for example, 212V that corresponds to a voltage appearing across the terminals of the first series-connected assembly 40.

After the completion of charging of the in-inverter smoothing capacitor 21, the controller 100, as demonstrated in FIG. 6, switches the first-D switch SW1*d* from the off-state to the on-state. Subsequently, the controller 100, as demonstrated in FIG. 5, switches the second-A switch SW2*a* and the second-B switch SW2*b* from the on-state to the off-state, and disconnects between the first storage battery 31 and the second storage battery 32 and between the second storage battery 32 and the low-voltage ground line L2 while keeping electrical conduction of the first storage battery 31 and the high-voltage power supply line H1. In other words, the controller 100 disconnects the second storage battery 32 from the high-voltage circuit 75.

After the second storage battery 32 is electrically disconnected from the high-voltage circuit 75, the controller 100 operates the motor 10 and the inverter 20 to electrically discharge the in-inverter smoothing capacitor 21. Specifically, the controller 100 keeps the terminal voltage appearing at the in-inverter smoothing capacitor 21 constant for a given period of time and then gradually discharges the in-inverter smoothing capacitor 21 until the terminal voltage thereat is reduced down to a level (i.e., 400V) corresponding to the terminal voltage at the first storage battery 31.

Additionally, the controller 100 operates the motor 10 and the inverter 20 to electrically discharge the neutral point-side smoothing capacitor C1. Such discharging is performed until the terminal voltage at the neutral point-side smoothing capacitor C1 reaches zero.

After the completion of the above discharging operation, the controller 100, as demonstrated in FIG. 4, switches the third-A switch SW3*a* and the third-B switch SW3*b* from the off-state to the on-state, thereby connecting the second storage battery 32 between the low-voltage power supply line H2 and the low-voltage ground line L2 with the first storage battery 31 connected between the high-voltage power supply line H1 and the neutral point of the motor 10. This enables a low-voltage power to be delivered from the second storage battery 32 to the low-voltage load 72 (i.e., the low-voltage circuit 76).

Afterwards, the controller 100, as can be seen in FIG. 3, deactivates the DC-to-DC converter 70 to stop the supply of electrical power from the DC-to-DC converter 70 to the low-voltage load 72. This causes a low-voltage power to be delivered from the second storage battery 32 to the low-voltage load 72. The controller 100, as shown in FIG. 2, changes the first-A switch SW1*a*, the first-C switch SW1*c*, the first-D switch SW1*d*, and the first-E switch SW1*e* from the on-state to the off-state. The controller 100 also activates the motor 10 and the inverter 20 to electrically discharge the in-inverter smoothing capacitor 21 to reduce the terminal voltage thereat to zero.

The above operation, as illustrated in FIG. 2, achieves the connection of only the second storage battery 32 to the low-voltage power supply line H2 and the low-voltage ground line L2 during the stop of the vehicle. This causes electrical power to be delivered from the second storage battery 32 to the low-voltage load 72.

The power supply system 30 in this embodiment, as apparent from the above discussion, is capable of electrically connecting with each of the high-voltage circuit 75 and the low-voltage circuit 76 to supply electrical power thereto. If one of the switches SW is undesirably kept on due to, for example, thermal sticking thereof, it will result in direct connection of the high-voltage circuit 75 and the low-voltage circuit 76, which makes it impossible to electrically disconnect the first storage battery 31*a* and the second storage battery 32 from each other. In other words, there is a risk that the high-voltage first storage battery 31 may be connected to the low-voltage load 72 or the first ground FG and the second ground SG may be connected together. This requires the need to turn on or off the switches SW to determine whether the switches SW properly operate, in other words, diagnose the conditions of the switches SW.

The power supply system 30 is, as described above, however, configured to be connectable with each of the high-voltage circuit 75 and the low-voltage circuit 76. This requires the need for achieving the on- and off-operations of the switches SW at proper timings during the diagnosis of the switches SW in order to ensure electrical insulation between the first ground FG and the second ground SG, that is, prevent the high-voltage circuit 75 and the low-voltage circuit 76 from being connected together. Accordingly, the power supply system 30 in this embodiment is designed to diagnose the conditions of the switches SW at a time described below. The failure or malfunction diagnosis of the switches SW when the vehicle is activated or stopped will be discussed below in detail. The malfunction diagnosis performed upon activation of the vehicle will first be referred to below.

Figure 9:
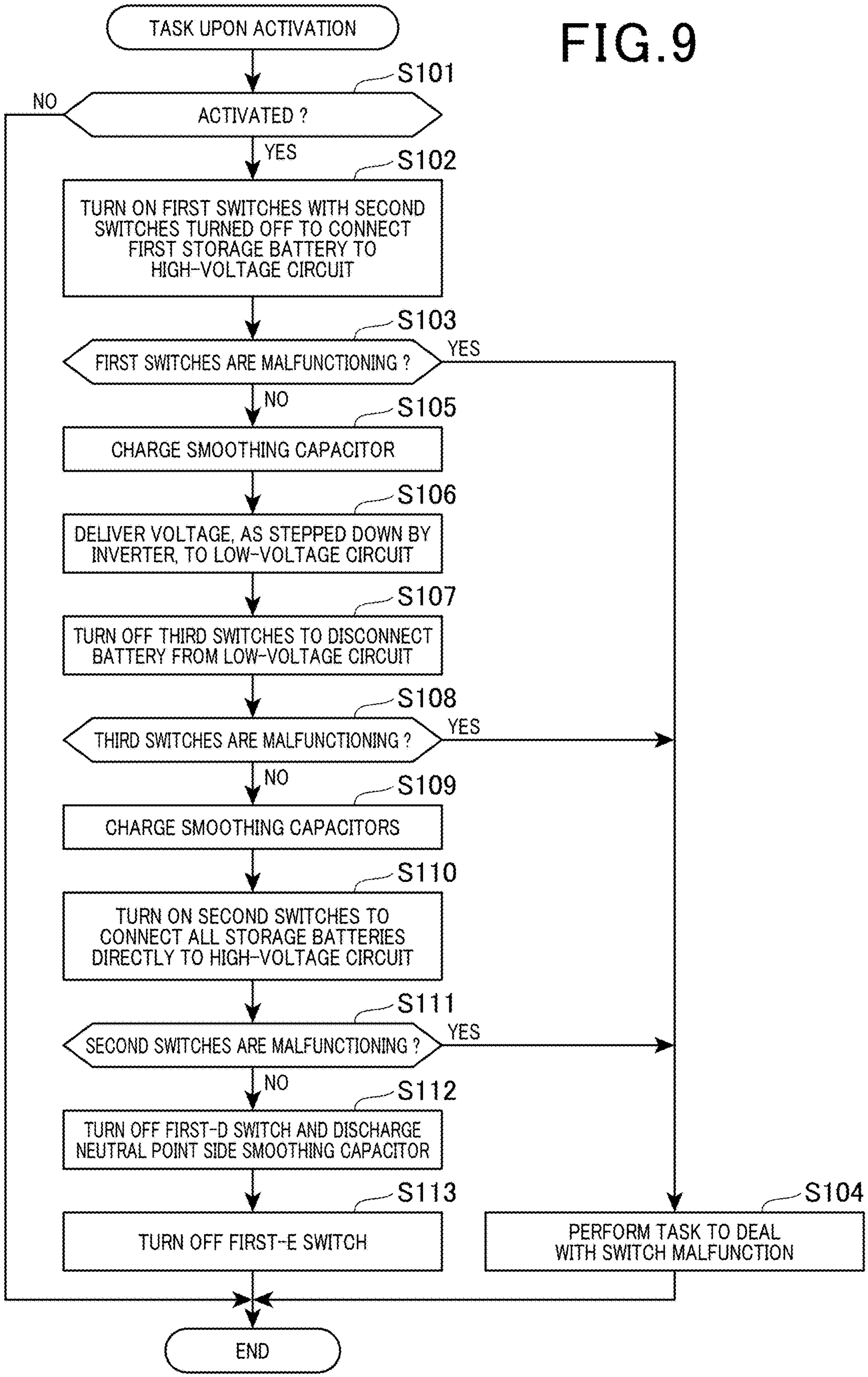
FIG. 9 is a flowchart of a sequence of steps of an activation operation performed in an in-vehicle system.

FIG. 9 is a flowchart of a sequence of steps or program cyclically executed by a diagnosis determiner implemented by the controller 100 at a predetermined time interval during the stop of the vehicle. When the vehicle is stopped, the power supply system 30 is placed in the layout of connections illustrated in FIG. 2 where the first switches and the second switches are turned off, while the third switches are turned on. In other words, only the second storage battery 32 is connected to the low-voltage power supply line H2.

After entering the program, the routine proceeds to step S101 wherein the controller 100 determines whether the vehicle has been activated during the stop thereof. If a YES answer is obtained, the routine proceeds to step S102 wherein the controller 100, as illustrated in FIG. 3, connects the first storage battery 31 with the high-voltage power supply line H1 with the second storage battery 32 connected to the low-voltage power supply line H2. In other words, the controller 100, as already described, changes the first switch to the on-state with the third switches turned on, and the second switches turned off. This causes the first storage battery 31 to be connected to the high-voltage circuit 75 with the second storage battery 32 connected to the low-voltage circuit 76.

The second switches (i.e., the second-A switch SW2*a* and the second-B switch SW2*b*) are, as described above, placed in the off-state, thereby blocking electrical connections between the first storage battery 31 and the second storage battery 32 and between the high-voltage circuit 75 and the low-voltage circuit 76. This supplies no high-voltage power directly to the low-voltage circuit 76.

In step S102, the controller 100 receives and stores outputs from the above sensors when turning on the first switches. After changing the first switches to the on-state in step S102, the routine proceeds to step S103 wherein the controller 100 analyzes the outputs of the sensors stored therein to determine whether the first switches are failing in operation or malfunctioning. Specifically, the diagnosis of the first switches, that is, the determination in step S103 is made by analyzing an electrical current, as measured by the first current sensor A11 when the first switches are turned on in step S102, to determine whether an electrical current is properly flowing through the first-A electrical path 1A.

For instance, when an output from the first current sensor A11 is not zero or is out of an error range near zero (the same applies to the following discussion) even before the first switches are turned on, that is, even though the first switches are kept on, in other words, when an abnormal electrical current is determined to be flowing through the first-A electrical path 1A, the controller 100 determines that the first switches are malfunctioning. Alternatively, when the first switches have been turned on, but an output of the first current sensor A11 is lower than a given threshold value, in other words, when no electrical current is flowing through the first-A electrical path 1A, the controller 100 determines that the first switches are malfunctioning. When an output of the first current sensor A11 has been increased from zero and exceeded the given threshold value due to the turning on of the first switches, the controller 100 determines that the first switches are properly operating.

If a YES answer is obtained in step S103 meaning that the first switches are malfunctioning, then the routine proceeds to step S104 wherein the controller 100 performs a given task to deal with the malfunction in the power supply system 30. For instance, in step S104, the controller 100 warns about the fact that a malfunction is occurring in the power supply system 30, and thus it is impossible to properly activate the power supply system 30. The controller 100 also enters a fail-safe mode to turn off all the switches SW to ensure the safety of the power supply system 30. Subsequently, the routine terminates to stop the activation operation of the power supply system 30.

Alternatively, if a NO answer is obtained in step S103 meaning that the first switches are properly operating, then the routine proceeds to step S105 wherein the controller 100 activates the inverter 20, etc. to deliver electrical power from the first storage battery 31 to the high-voltage circuit 75 to electrically charge the in-inverter smoothing capacitor 21 until the terminal voltage thereat reaches 400V.

After completion of the charging of the in-inverter smoothing capacitor 21, the routine proceeds to step S106 wherein the controller 100 activates the DC-to-DC converter 70, as demonstrated in FIG. 4, to step-down voltage inputted to the DC-to-DC converter 70 and delivers it to the low-voltage load 72 (i.e., the low-voltage circuit 76) through the power transmission line L3. Specifically, the controller 100 controls the operation of the DC-to-DC converter 70 to drop the input voltage down to a level of, for example, 14V which is slightly higher than the terminal voltage (i.e., 12V) at the second storage battery 32. This causes the electrical power, as delivered from the DC-to-DC converter 70 to the low-voltage circuit 76, to flow to the second storage battery 32, thereby electrically charging the second storage battery 32.

After step S106, the routine proceeds to step S107 wherein the controller 100, as illustrated in FIG. 5, turns off the third switches with the second switches kept off to electrically disconnect between the second storage battery 32 and the low-voltage power supply line H2. The controller 100 also receives outputs from the sensors and stores them when turning off the third switches.

After the third switches are turned off in step S107, the routine proceeds to step S108 wherein the controller 100 analyzes the outputs from the sensors to determine whether the third switches are malfunctioning. Specifically, the malfunction diagnosis task or determination made in step S108 is achieved by analyzing an output from the third current sensor A13, as obtained upon the turning off of the third switches, to determine whether it is possible to properly disconnect the third-A electrical path 3A.

An example of how to diagnose the third switches in step S108 will be described below with reference to FIG. 10. FIG. demonstrates a relation of on- or off-states of the third-A switch SW3*a* and the third-B switch SW3*b* to outputs from the third current sensor A13 when the third-A switch SW3*a* and the third-B switch SW3*b* are properly operating.

Before diagnosing the third switches, the controller 100 changes the measurement range and the resolution of the third current sensor A13 to those predefined for measuring the current flowing in the third-A electrical path 3A. Specifically, the controller 100 narrows the measurement range and raises the resolution of the third current sensor A13. As described in step S106, the voltage (i.e., 14V) supplied by the DC-to-DC converter 70 is slightly higher than the terminal voltage (i.e., 12V) developed at the second storage battery 32.

When the third switches (i.e., the third-A switch SW3*a* and the third-B switch SW3*b*) are, as demonstrated in an upper row of the table in FIG. 10, turned on, an electrical current flows from the DC-to-DC converter 70 to the second storage battery 32 to electrically charge the second storage battery 32. An output of the third current sensor A13 depends on an amount of current flowing from the DC-to-DC converter 70 and will be a value (e.g., several tens amperes) greater than zero. Accordingly, when the third switches are placed in the on-state, but an output from the third current sensor A13 shows zero, the controller 100 determines that at least one of the third switches is malfunctioning.

The phrase "Depending on DC/DC" in the table of FIG. 10 means that when the level of voltage outputted from the DC-to-DC converter 70 is higher than a terminal voltage at the second storage battery 32, an output from the third current sensor A13 depends on an amount of current flowing from the DC-to-DC converter 70, while when the level of voltage outputted from the DC-to-DC converter 70 is lower than or equal to a terminal voltage at the second storage battery 32, an output from the third current sensor A13 depends on an amount of current flowing from the second storage battery 32.

The turning off of the third switches from the on-state thereof in step S107 is achieved by the controller 100 to first turn off the third-A switch SW3*a* and then turn off the third-B switch SW3*b*. The controller 100, therefore, determines, as shown in a middle row of the table in FIG. 10, that the third-A switch SW3*a* is malfunctioning as long as an output from the third current sensor A13 is not zero when the third-A switch SW3*a* is turned off, and the third-B switch SW3*b* is turned on and alternatively determines that the third-A switch SW3*a* is properly operating as long as an output from the third current sensor A13 is zero when the third-A switch SW3*a* is turned off, and the third-B switch SW3*b* is turned on. When the third-A switch SW3*a* is determined to be malfunctioning, the controller 100 concludes that a failure in operation is occurring in the third switches. Alternatively, when the third-A switch SW3*a* is determined to be properly operating, the controller 100 concludes that the third switches are properly operating. Such a diagnostic method is merely an example and may be modified, as will be described later in detail.

If a YES answer is obtained in step S108 meaning that the third switches are malfunctioning, then the routine proceeds to step S104 wherein the controller 100, as described above, performs the given task to deal with the malfunction in the power supply system 30. Afterwards, the controller 100 interrupts or stops the activation operation of the power supply system 30.

Alternatively, if a NO answer is obtained in step S108 meaning that the third switches are properly operating, then the routine proceeds to step S109 wherein the controller 100 activates the motor 10 and the inverter 20 to electrically charge the in-inverter smoothing capacitor 21 and the neutral point-side smoothing capacitor C1. Specifically, the in-inverter smoothing capacitor 21 and the neutral point-side smoothing capacitor C1 are charged until a terminal voltage at the in-inverter smoothing capacitor 21 reaches 612V, and a terminal voltage at the neutral point-side smoothing capacitor C1 reaches 212V.

After completion of the charging of the in-inverter smoothing capacitor 21 and the neutral point-side smoothing capacitor C1 in step S109, the routine proceeds to step S110 wherein the controller 100, as demonstrated in FIG. 6, turned on the second switches with the third switches kept off to connect all the first storage battery 31 to the third storage battery 33 installed in the power supply system 30 to the high-voltage power supply line H1. When turning on the second switches in step S110, the controller 100 receives outputs of sensors and store them.

After step S110, the routine proceeds to step S111 wherein the controller 100 analyzes the stored outputs of the sensors to determine whether the second switches are failing in operation or malfunctioning. Specifically, the diagnosis of the second switches, that is, the determination in step S111 is made by analyzing an electrical current, as measured by the third current sensor A12 at a time when the second switches are turned on in step S110, to determine whether an electrical current is properly flowing through the second-A electrical path 2A.

An example of how to diagnose the second switches in step S111 will be described below with reference to FIG. 11. FIG. 11 demonstrates a relation of on- or off-states of each of the second-A switch SW2*a* and the second-B switch SW2*b* to an output from a corresponding one of the sensors when the second-A switch SW2*a* and the second-B switch SW2*b* are properly operating. Before diagnosing the second switches, the controller 100 changes the measurement range and the resolution of the third current sensor A13 to those predefined for measuring the current flowing in the second-A electrical path 2A. Specifically, the controller 100 widens the measurement range and reduces the resolution of the third current sensor A13.

When the second switches are, as demonstrated in an upper row of the table in FIG. 11, turned off, but however, an output from the third current sensor A13 is not zero or is out of an error range near zero (the same applies to the following discussion), the controller 100 determines that the second switches are malfunctioning.

In step S110, the controller 100 first turns on the second-A switch SW2*a* and then turns on the second-B switch SW2*b*, thereby changing the second switches from the off-state to the on-state. Accordingly, as demonstrated in a middle row of the table in FIG. 11, the controller 100 determines that the second switches are malfunctioning when an output from the third current sensor A13 is not zero with the second-A switch SW2*a* turned on and the second-B switch SW2*b* turned off.

When detecting the fact that an output from the third current sensor A13 is higher than or equal to a given threshold value and an electrical current is properly flowing through the third current sensor A13 when the second-A switch SW2*a* and the second-B switch SW2*b* are turned on, the controller 100 determines that no failure in operation is occurring in the second switches. Alternatively, when detecting the fact that an output from the third current sensor A13 is zero even though the second switches are turned on, the controller 100 determines that the second switches are malfunctioning. Such a diagnostic method is merely an example and may be modified, as will be described later in detail.

If a YES answer is obtained in step S111 meaning that the second switches are malfunctioning, then the routine proceeds to step S104 wherein the controller 100, as described above, performs the given task to deal with the malfunction in the power supply system 30. Afterwards, the controller 100 interrupts or stops the activation operation of the power supply system 30.

If a NO answer is obtained in step S111 meaning that no failure in operation is occurring in the second switches, then the routine proceeds to step S112 wherein the controller 100 turns off the first-D switch SW1*d* to activate the motor 10 and the inverter 20 to electrically discharge the neutral point-side smoothing capacitor C1.

After completion of discharging of the neutral point-side smoothing capacitor C1 in step S112, the routine proceeds to step S113 wherein the controller 100, as demonstrated in FIG. 8, changes the first-E switch SW1*e* from the on-state to the off-state to compete the activation operation. Upon completion of the activation operation, a high-voltage power is, as illustrated in FIG. 8, delivered from the second series-connected assembly 50 in which the storage batteries 31, 32, and 33 are connected in series with each other to the high-voltage load 71 of the high-voltage circuit 75 through the high-voltage power supply line H1. This causes the high-voltage power to be supplied to the motor 10 and the high-voltage load 71 which enables the vehicle to be moved properly. The DC-to-DC converter 70, as can be seen in FIG. 8, works to step-down an electrical power to be supplied to the high-voltage circuit 75 and also deliver it to the low-voltage load 72. This enables the low-voltage load 72 to be properly operated.

Figure 12:
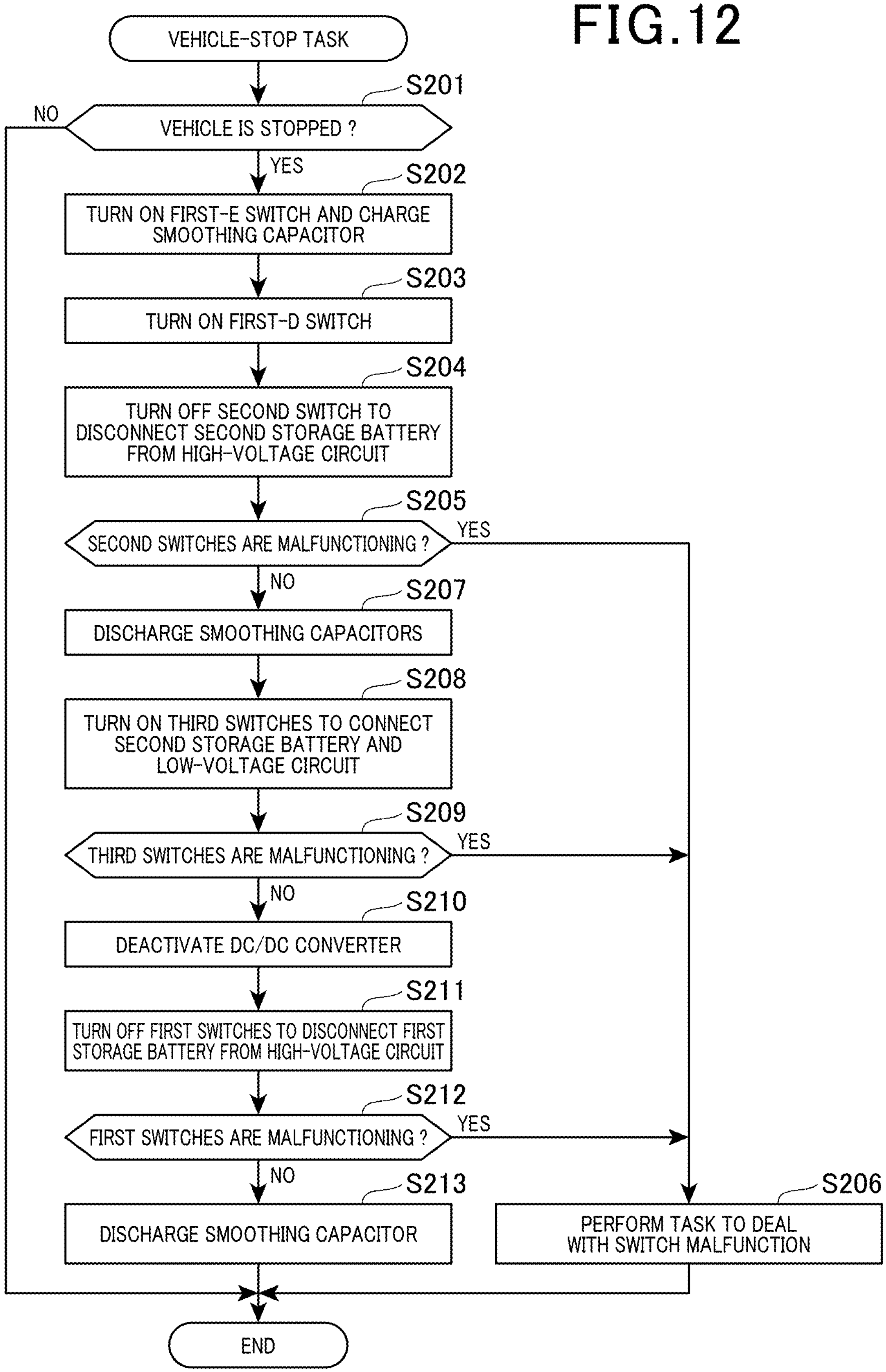
FIG. 12 is a flowchart of a sequence of steps of an vehicle-stop operation performed in an in-vehicle system.

The fault diagnosis of the switches SW performed when the vehicle is stopped will be described below in detail with reference to FIG. 12. FIG. 12 is a flowchart of a sequence of steps or a vehicle-stop program executed by the controller 100 cyclically at a predetermined time interval during activation of the vehicle. When the vehicle is being activated, the power supply system 30 is placed in the layout of electrical connections demonstrated in FIG. 8. Specifically, all the storage batteries 31, 32, and 33 are connected in series with the high-voltage circuit 75. A low-voltage power is delivered to the low-voltage circuit 72 through the DC-to-DC converter 70.

After entering the program in FIG. 12, the routine proceeds to step S201 wherein the controller 100 determines whether the vehicle is stopped. If a NO answer is obtained, then the routine proceeds to step S202 wherein the controller 100 terminates the program or vehicle-stop task. Alternatively, if a YES answer is obtained, then the routine proceeds to step S202 wherein the controller 100, as demonstrated in FIG. 7, turns on the first-E switch SW1*e* and then activates the motor 10 and the inverter 20 to electrically charge the neutral point-side smoothing capacitor C1.

After completion of the charging of the neutral point-side smoothing capacitor C1 in step S202, the routine proceeds to step S203 wherein the controller 100, as demonstrated in FIG. 6, changes the first-D switch SW1*d* from the off-state to the on-state. The routine proceeds to step S204 wherein the controller 100, as illustrated in FIG. 5, changes the second switches from the on-state to the off-state with the third switches kept off to block electrical connections between the first storage battery 31 and the second storage battery 32 and between the second storage battery 32 and the low-voltage ground line L2. In other words, the second storage battery 32 is disconnected from the high-voltage circuit 75. When turning off the second switches in step S204, the controller 100 receives outputs from the sensors and stores them.

The routine proceeds to step S205 wherein the controller 100 analyzes the stored outputs from the sensors to determine whether the switches second are malfunctioning. Specifically, the diagnosis in step S205 is achieved by the controller 100 to determine whether the second-A electrical path 2A is properly disconnected using the output from the third current sensor A13 derived upon turning off of the second switches to determine whether the second switches are failing in operation.

An example of how to diagnose the second switches in step S205 will be described below with reference to FIG. 11. Before diagnosing the second switches, that is, initiating the operation in step S204, the controller 100 changes the measurement range and the resolution of the third current sensor A13 to those predefined for measuring the current flowing in the second-A electrical path 2A. Specifically, the controller 100 widens the measurement range and reduces the resolution of the third current sensor A13.

When the second switches are, as demonstrated in a lower row of the table in FIG. 11, turned on, but however, an output from the third current sensor A13 is zero or within an error range near zero (the same applies to the following discussion), the controller 100 determines that the second switches are malfunctioning.

In step S204, the controller 100 first turns off the second-B switch SW2*b* and then turns off the second-A switch SW2*a*, thereby changing the second switches from the on-state to the off-state. Accordingly, as demonstrated in the middle row of the table in FIG. 11, the controller 100 determines that the second switches are malfunctioning when an output from the third current sensor A13 is not zero with the second-A switch SW2*a* turned on and the second-B switch SW2*b* turned off.

When an output from the third current sensor A13 derived when the second-A switch SW2*a* and the second-B switch SW2*b* are turned off is, as demonstrated in the upper row of the table in FIG. 11, zero, thus determining that the second-A switch SW2*a* and the second-B switch SW2*b* have properly blocked electrical conduction thereof, the controller 100 determines that no failure in operation is occurring in the second switches. Alternatively, when the second switches have been turned off, but an output from the third current sensor A13 is not zero, the controller 100 determines that the second switches are malfunctioning. Such a diagnostic method is merely an example and may be modified, as will be described later in detail.

If a YES answer is obtained in step S205 meaning that the second switches are malfunctioning, then the routine proceeds to step S206 wherein the controller 100, as described above, performs the given task to deal with the malfunction in the power supply system 30. Afterwards, the controller 100 interrupts or stops the vehicle-stop operation.

If a NO answer is obtained in step S205 meaning that no failure in operation is occurring in the second switches, then the routine proceeds to step S207 wherein the controller 100 activates the motor 10 and the inverter 20 to electrically discharge the in-inverter smoothing capacitor 21 and the neutral point-side smoothing capacitor C1. Specifically, the in-inverter smoothing capacitor 21 is gradually discharged by the controller 100 to control the operations of the motor 10 and the inverter 20 until the voltage at the in-inverter smoothing capacitor 12 reaches a level corresponding to the terminal voltage at the first storage battery 31.

After completion of discharging of the in-inverter smoothing capacitor 21 and the neutral point-side smoothing capacitor C1 in step S207, the routine proceeds to step S208 wherein the controller 100, as illustrated in FIG. 4, turns on the third switches with the second switches kept off to connect the second storage battery 32 between the low-voltage power supply line H2 and the low-voltage ground line L2. This causes a low-voltage power to be delivered from the second storage battery 32 to the low-voltage load 72. When turning on the third switches in step S208, the controller 100 receives outputs from the sensors and stores them.

The routine proceeds to step S209 wherein the controller 100 analyzes the stored outputs from the sensors to determine whether the third switches are malfunctioning. Specifically, the diagnosis in step S209 is achieved by the controller 100 to analyze the output from the third current sensor A13 derived upon turning on of the third switches to determine whether an electrical current is properly flowing in the third-A electrical path 3A to determine whether the third switches are failing in operation.

An example of how to diagnose the third switches in step S209 will be described below with reference to FIG. 10. FIG. shows a relation of the on- or off-states of the third-A switch SW3*a* and the third-B switch SW3*b* and corresponding outputs from the third current sensor A13 when the third switches are properly operating.

Before diagnosing the third switches, that is, initiating the operation in step S208, the controller 100 changes the measurement range and the resolution of the third current sensor A13 to those predefined for measuring the current flowing in the third-A electrical path 3A. Specifically, the controller 100 narrows the measurement range and raises the resolution of the third current sensor A13. In this embodiment, a level of voltage (i.e., 14V) supplied from the DC-to-DC converter 70 is set to be slightly higher than the terminal voltage (i.e., 12V) at the second storage battery 32.

When the third switches (i.e., the third-A switch SW3*a* and the third-B switch SW3*b*) are, as demonstrated in the lower row of the table in FIG. 10, turned off, but however, an output from the third current sensor A13 is not zero or is out of an error range near zero (the same applies to the following discussion), the controller 100 determines that the third switches are malfunctioning.

In step S208, the controller 100 first turns on the third-B switch SW3*b* and then turns on the third-A switch SW3*a*, thereby changing the third switches from the off-state to the on-state. Accordingly, as demonstrated in the middle row of the table in FIG. 10, the controller 100 determines that the third switches are malfunctioning when an output from the third current sensor A13 is not zero with the third-A switch SW3*a* turned off, and the third-B switch SW3*b* turned on.

When an output from the third current sensor A13 derived when the third-A switch SW3*a* and the third-B switch SW3*b* are turned on is, as demonstrated in the upper row of the table in FIG. 10, higher than or equal to a given threshold value, thus determining that an electrical current is properly flowing through the third-A switch SW3*a* and the third-B switch SW3*b*, the controller 100 determines that no failure in operation is occurring in the third switches. Alternatively, when the third switches have been turned on, but an output from the third current sensor A13 is zero, the controller 100 determines that the third switches are malfunctioning. Such a diagnostic method is merely an example and may be modified, as will be described later in detail.

If a YES answer is obtained in step S209 meaning that the third switches are malfunctioning, then the routine proceeds to step S206 wherein the controller 100, as described above, performs the given task to deal with the malfunction in the power supply system 30. Afterwards, the controller 100 interrupts or stops the vehicle-stop operation.

If a NO answer is obtained in step S209 meaning that no failure in operation is occurring in the third switches, then the routine proceeds to step S210 wherein the controller 100, as illustrated in FIG. 3, deactivates the DC-to-DC converter 70 to stop delivering electrical power from the DC-to-DC converter 70 to the low-voltage load 72. This causes a low-voltage power to be delivered from the second storage battery 32 to the low-voltage load 72. The routine proceeds to step S211 wherein the controller 100 then turns off the first switches with the second switches kept off to block the electrical connection between the first storage battery 31 and the high-voltage circuit 75.

When turning off the first switches in step S211, the controller 100 receives outputs from the sensors and stores them. After the first switches are turned off, the routine proceeds to step S212 wherein the controller 100 analyzes the stored outputs of the sensors to determine whether the first switches are malfunctioning. The diagnosis of the first switches, that is, the operation in step S211 is achieved by the controller 100 to use an output from the first current sensor A11 derived when the first switches are turned off to determine whether the first-A electrical path 1A is electrically disconnected, thereby diagnosing the malfunction of the first switches.

Specifically, when an output from the first current sensor A11 is zero even before the first switches are turned off (i.e., the first switches are still kept on), meaning that no current is flowing in the first-A electrical path 1A, the controller 100 determines that a failure in operation is occurring in the first switches. Alternatively, when the first switches have been turned off, but an output from the first current sensor A11 is not yet zero, in other words, when the first-A electrical path 1A is not yet disconnected, the controller 100 determines that the first switches are malfunctioning. Alternatively, when detecting the fact that an output from the first current sensor A11 has reached zero due to the turning off of the first switches, the controller 100 determines that the first switches are properly operating.

If a YES answer is obtained in step S212 meaning that the first switches are malfunctioning, then the routine proceeds to step S206 wherein the controller 100, as described above, performs the given task to deal with the malfunction in the power supply system 30. Afterwards, the controller 100 interrupts or stops the vehicle-stop task.

If a NO answer is obtained in step S212 meaning that no failure in operation is occurring in the first switches, then the routine proceeds to step S213 wherein the controller 100 activates the motor 10 and the inverter 20 to electrically discharge the in-inverter smoothing capacitor 21. The routine then terminates to complete the vehicle-stop operation.

The above-described first embodiment offers the following beneficial advantages.

When the electrical connections between the first storage battery 31 and the second storage battery 32 and between the high-voltage circuit 75 and the low-voltage circuit 76 are blocked by turning off the second switches, the controller 100 changes the on- or off-states of the first switches to perform the diagnosis task to diagnose the malfunction of the first switches.

Specifically, the controller 100 turns off the second switches and turns on the first switches (i.e., the switches SW1*a*, SW1*c*, SW1*d*, and SW1*e*) in step S102 of the activation operation. Subsequently, in step S103, the controller 100 analyzes an output from the first current sensor A11 obtained upon the turning on of the first switches to determine whether the first switches have any faults. Additionally, the controller 100 turns off the second switches and also turns off the first switches (i.e., the switches SW1*a*, SW1*c*, SW1*d*, and SW1*e*) in step S211 of the vehicle-stop task. Subsequently, in step S212, the controller 100 analyzes an output from the first current sensor A11 obtained upon the turning off of the first switches to determine whether the first switches have any faults.

Additionally, when the electrical connections between the first storage battery 31 and the second storage battery 32 and between the high-voltage circuit 75 and the low-voltage circuit 76 are blocked by turning off the second switches, the controller 100 changes the on- or off-states of the third switches to diagnose the malfunction of the third switches.

Specifically, the controller 100 turns off the third switches (i.e., the switches SW3*a* and SW3*b*) with the second switches kept off in step S107 of the activation operation. Subsequently, in step S108, the controller 100 analyzes an output of the third current sensor A13 obtained upon the turning off of the third switches to diagnose the malfunction of the third switches. Additionally, the controller 100 turns on the third switches (i.e., the switches SW3*a* and SW3*b*) with the second switches kept off in step S208 of the activation operation. Subsequently, in step S209, the controller 100 analyzes an output of the third current sensor A13 obtained upon the turning on of the third switches to diagnose the malfunction of the third switches.

As apparent from the above discussion, when the first storage battery 31 and the second storage battery 32 are electrically disconnected by the second switches from each other, and the high-voltage circuit 75 and the low-voltage circuit 76 are electrically disconnected by the second switches from each other, the first switches and the third switches are changed in the on- and off states thereof, but however, it results in no connection between the high-voltage circuit 75 and the low-voltage circuit 76, thereby minimizing a risk that a high voltage may be delivered to the low-voltage load 72, which enables the diagnosis task to diagnose the malfunctions of the first switches and the third switches.

When the electrical connection between the second storage battery 32 and the low-voltage circuit 76 is blocked by turning off the third switches, the controller 100 works to change the on- or off-states of the second switches to diagnose the malfunction of the second switches.

Specifically, the controller 100 turns on the second switches (i.e., the switches SW2*a* and SW2*b*) with the third switches kept off in step S110 of the activation operation. Subsequently, in step S111, the controller 100 analyzes an output of the third current sensor A13 obtained upon the turning on of the second switches to diagnose the malfunction of the second switches.

Additionally, the controller 100 works to turn off the second switches (i.e., the switches SW2*a* and SW2*b*) with the third switches kept off in step S204 of the vehicle-stop task. Subsequently, in step S205, the controller 100 analyzes an output from the third current sensor A13 obtained upon the turning off of the second switches to diagnose the malfunction of the second switches.

As apparent from the above discussion, when the second storage battery 32 and the low-voltage circuit 76 are electrically disconnected from each other, the on- or off-operations of the second switches will result in no electrical connections between the first storage battery 31 and the second storage battery 32 and between the high-voltage circuit 75 and the low-voltage circuit 76 in the power supply system 30, thereby eliminating the risk of application of high-voltage to the low-voltage load 72. This ensures safety in diagnosing the second switches.

As already discussed in steps S102 to S103 and S208 to S212, the controller 100 performs the diagnosis of a malfunction of the first switches when the second switches are placed in the off-state, while the third switches are placed in the on-state. In other words, the electrical connections between the first storage battery 31 and the second storage battery 32 and between the high-voltage circuit 75 and the low-voltage circuit 76 are blocked, and when electrical power is being delivered from the second storage battery 32 to the low-voltage circuit 76, the controller 100 changes the on- or off-states of the first switches to diagnose the malfunction of the first switches. This eliminates the risk that the supply of power to the low-voltage load 72 may be blocked during the diagnosis of the first switches.

As already discussed in steps S106 to S108 and S208 to S209, the controller 100 works to turn on the first switches with the second switches kept off and operate the DC-to-DC converter 70 to step-down and supply a high-voltage power to the low-voltage load 72, and in the meantime, performs the diagnosis of a malfunction of the third switches. In other words, when the electrical connections between the first storage battery 31 and the second storage battery 32 and between the high-voltage circuit 75 and the low-voltage circuit 76 are blocked and when the low-voltage power is delivered to the low-voltage circuit 76 through the DC-to-DC converter 70, the controller 100 diagnoses a malfunction of the third switches. This eliminates the risk that the supply of power to the low-voltage load 72 may be blocked during the diagnosis of the third switches.

A portion of the third-A electrical path 3A which connects between the positive terminal of the second storage battery 32 and the low-voltage power supply line H2 is shared with at least a portion of an electrical path through which the storage batteries 31 to 33 are all electrically connected both to the high-voltage power supply line H1 and to the high-voltage ground line L1. Specifically, an electrical path extending from the positive terminal of the second storage battery 32 to the junction P13 is defined by the common path L10 which is shared with the third-A electrical path 3A and the second-A electrical path 2A. The common path L10 has disposed therein the third current sensor A13 serving as a shared current sensor. The controller 100 uses an output from the third current sensor A13 both in the diagnosis of a malfunction of the second switches and in diagnosis of a malfunction of the third switches. This eliminates the need for an additional current sensor for use in the diagnosis of the second switches or the third switches. In other words, it is unnecessary to install two discrete current sensors, one in each of the second-A electrical path 2A and the third-A electrical path 3A. This enables the number of current sensors required for the diagnosis of the second and third switches to be minimized, thereby simplifying the layout of electrical wires in the power supply system 30.

The third current sensor A13 is, as described above, designed to have a variable measurement range and also have a resolution which is changed with a change in measurement range. Specifically, the measurement range of the third current sensor A13 used to measure an electrical current flowing in the second-A electrical path 2A is set wider than that to measure an electrical current flowing in the third-A electrical path 3A. For instance, the measurement range of the third current sensor A13 used to measure an electrical current flowing in the second-A electrical path 2A is determined for precisely measuring an electrical current of 100 A to 200 A in the second-A electrical path 2A. When measuring an electrical current flowing in the third-A electrical path 3A, the third current sensor A13 has a resolution which is set higher than when measuring an electrical current flowing in the second-A electrical path 2A in order to derive a value of the electrical current in a smaller unit.

The controller 100, as described above, alters the measurement range and the resolution of the third current sensor A13 depending on which of a first group of the second switches and a second group of the third switches is required to be diagnosed. For instance, when it is required to diagnose a malfunction of the second switches, the controller 100 increases the measurement range and also reduce the resolution of the third current sensor A13. Alternatively, when it is required to diagnose a malfunction of the third switches, the controller 100 decreases the measurement range and arises the resolution of the third current sensor A13. This selects the measurement range and the resolution of the third current sensor A13 to be suitable for an electrical current flowing therethrough and ensures high precision in measuring the electrical current.

When turning on or off the switches SW to change the number of the storage batteries 31 to 33 which will be electrically connected to the high-voltage power supply line H1, the controller 100 works to control the operation of the inverter 20 to step-up or step-down voltage inputted to the motor 10 and the inverter 20, to thereby control the terminal voltage developed in the in-inverter smoothing capacitor 21.

Specifically, after performing the operation in step S102 (which will also be referred to as a first step), the controller 100 controls the operation of the inverter 20 in step S109 preceding step S110 (which will also be referred to as a second step) to step-up voltage, as inputted from the first storage battery 31 to the inverter 20, by means of a combination of the motor 10 and the inverter 20. The controller 100 then applies the stepped-up voltage to the in-inverter smoothing capacitor 21 and raises it until a terminal voltage developed at the in-inverter smoothing capacitor 21 reaches that at the second series-connected assembly 50. This eliminates the risk of instability in supplying voltage to the high-voltage circuit 75 even when the second switches are turned on to connect all the storage batteries 31 to 33 in series with the high-voltage power supply line H1. This ensures stability in delivering electrical power to the high-voltage load 71 and eliminates the risk of inrush current occurring in the second switches.

The controller 100 also works to use the motor 10 and the inverter 20 to elevate a terminal voltage developed at the neutral point-side smoothing capacitor C1 until it reaches a level equivalent to a terminal voltage at the first series-connected assembly 40. This minimizes the inrush current generated upon turning on of the second switches.

After steps S202 and S203 (which will also be referred to below as a fifth step), the controller 100 works to electrically discharge the first smoothing capacitor (i.e., the in-inverter smoothing capacitor 21) using the inverter 20 and the motor before step S204 (which will also be referred to below as a sixth step). The controller 100 also controls the operation of the inverter 20 to step-up voltage, as inputted from the first storage battery 31 to the inverter 20, by means of a combination of the inverter 20 and the motor 10, applies it to the in-inverter smoothing capacitor 21, keeps the terminal voltage at the in-inverter smoothing capacitor 21 constant for a predetermined period of time, and then electrically discharges, in other words, reduces the terminal voltage at the in-inverter smoothing capacitor 21. This eliminates a risk that voltage supplied to the high-voltage circuit 75 may become instable, which arises from turning off of the second switches to disconnect the second storage battery 32 and the third storage battery 33 from the high-voltage power supply line H1, which blocks the series-connection of all the storage batteries 31 to 33. This also minimizes the risk of inrush current.

Modifications

Modifications of the above embodiments will be described below.

First Modification

A first modification of how to diagnose a malfunction of the third switches will be described below with reference to FIG. 13. FIG. 13 is a table which represents a relation of an on- or off-state of each of the third-A switch SW3*a* and the third-B switch SW3*b* to a corresponding output of the third current sensor A13.

The first modification in step S108 will first be described. When the third switches (i.e., the third-A switch SW3*a* and the third-B switch SW3*b*) are, as demonstrated in an upper row of the table in FIG. 13, turned on, electrical current flows from the DC-to-DC converter 70 to the second storage battery 32 to electrically charge the second storage battery 32. Accordingly, when the third switches are turned on, but an output of the third current sensor A13 is zero, the controller 100 determines that the third switches are malfunctioning.

The controller 100 also changes one of the third switches (i.e., the third-B switch SW3*b*) from the on-state to the off-state and then turns off the third-A switch SW3*a* to place all the third switches in the off-state in step S107. Accordingly, as demonstrated in a middle row of the table in FIG. 13, when an output from the third current sensor A13 when the third-B switch SW3*b* is turned off, and the third-A switch SW3*a* is turned on is not zero, the controller 100 determines that the third-B switch SW3*b* is malfunctioning. Alternatively, when the output from the third current sensor A13 is zero, the controller 100 determines that no failure in operation is occurring in the third-B switch SW3*b*. When it is determined that the third-B switch SW3*b* is malfunctioning, the controller 100 determines that the third switches are malfunctioning. Alternatively, when it is determined that the third-B switch SW3*b* is properly operating, the controller 100 determines that no failure in operation is occurring in the third switches. The above diagnosis enables the condition of the third-B switch SW3*b* to be diagnosed as well as the third switches as a whole The first modification in step S209 will be described. When the third switches (i.e., the third-A switch SW3*a* and the third-B switch SW3*b*) are, as shown in a lower row of the table in FIG. 13, turned off, but an output from the third current sensor A13 is not zero, the controller 100 determines that the third switches are malfunctioning. The controller 100 changes the third-A switch SW3*a* from the off-state to the on-state and then turns on the third-B switch SW3*b* to place all the third switches in the on-state in step S208. Accordingly, as demonstrated in a middle row of the table in FIG. 13, when an output from the third current sensor A13 when the third-A switch SW3*a* is turned on, and the third-B switch SW3*b* is turned off is not zero, the controller 100 determines that the third-B switch SW3*b* and the third switches are malfunctioning. As demonstrated in the upper row of the table in FIG. 13, when an output from the third current sensor A13 when the third-A switch SW3*a* and the third-B switch SW3*b* are both turned on is higher than or equal to a predetermined threshold value meaning that electrical current is properly flowing through the third-A switch SW3*a* and the third-B switch SW3*b*, the controller 100 determines that the third switches are properly operating. Alternatively, when the third switches are all placed in the on-state, but an output from the third current sensor A13 is zero, the controller 100 determines that a failure in operation is occurring in the third switches.

Second Modification

The second modification that is a modified form of how to diagnose the third switches will be described below with reference to FIG. 14. Although not illustrated, the power supply system 30 in this modification includes a voltage monitoring sensor V100 which measures a terminal voltage developed at the second storage battery 32 and supervises it. The second modification uses the voltage monitoring sensor V100 to diagnose the conditions of the third switches. FIG. 14 is a table representing a relation of on- or off-states of the third-A switch SW3*a* and the third-B switch SW3*b* to corresponding outputs from the voltage monitoring sensor V100 and the third current sensor A13 when the third switches are properly operating.

An operation of the second modification performed in step S108 in FIG. 9 will first be described. When the third switches (i.e., the third-A switch SW3*a* and the third-B switch SW3*b*) are turned on, as demonstrated in an upper row of the table in FIG. 14, but an output from the voltage monitoring sensor V100 does not match a voltage outputted from the DC-to-DC converter 70 (i.e., 14V), the controller 100 determines that a failure in operation is occurring in the third switches. The event that the output from the voltage 5 monitoring sensor V100 does not match the voltage outputted from the DC-to-DC converter 70 represents, for example, that the output from the voltage monitoring sensor V100 is lower than the voltage from the DC-to-DC converter 70, and a difference therebetween is higher than a given threshold level.

In step S107, the third switches are changed from the on-state to the off-state by the controller 100 to first turn off the third-A switch SW3*a* and the turn off the third-B switch SW3*b*. Accordingly, as demonstrated in a middle row of the table in FIG. 14, when an output from the voltage monitoring sensor V100 is not identical with a terminal voltage (e.g., 12V) developed at the second storage battery 32 with the third-A switch SW3*a* turned off and the third-B switch SW3*b* turned on, the controller 100 determines the third-A switch SW3*a* is malfunctioning. Alternatively, when the output from the voltage monitoring sensor V100 is equal to the terminal voltage at the second storage battery 32, the controller 100 determines that the third-A switch SW3*a* is properly operating. When turning off of the third-A switch SW3*a* results in a drop in output from the voltage monitoring sensor V100 which is greater than or equal to a given level (e.g., 2V), the controller 100 may determine that no failure in operation is occurring in the third-A switch SW3*a*. When determining that a failure in operation is occurring in the third-A switch SW3*a*, the controller 100 determines that the third switches are malfunctioning. Alternatively, when determining that no failure in operation is occurring in the third-A switch SW3*a*, the controller 100 determines that the third switches are properly operating.

Subsequently, an operation in step S209 in the second modification will be described below. When the third switches are turned off, but an output from the voltage monitoring sensor V100 is not, as shown in a lower row of the table in FIG. 14, equal to a terminal voltage at the second storage battery 32, the controller 100 that the third switches are malfunctioning.

In step S208, the controller 100 changes the third switches from the off-state to the on-state by first turning on the third-B switch SW3*b* and then turning on the third-A switch SW3*a*. Accordingly, as demonstrated in a middle row of the table in FIG. 14, when an output from the voltage monitoring sensor V100 is not identical with a terminal voltage at the second storage battery 32 with the third-A switch SW3*a* turned off, and the third-B switch SW3*b* turned on, the controller 100 determines that the third switches are malfunctioning.

When it is determined that an output of the voltage monitoring sensor V100 is identical with a level of voltage supplied from the DC-to-DC converter 70 when the third-A switch SW3*a* and the third-B switch SW3*b* are both turned on, the controller 100 determines that the third switches are properly operating. When turning on of the third switches results in a rise in output from the voltage monitoring sensor V100 which is higher than a predetermined level (e.g., 2V or more), the controller 100 may, however, determine that no failure in operation is occurring in the third switches. Alternatively, when the third switches are turned on, but an output of the voltage monitoring sensor V100 is identical with a terminal voltage at the second storage battery 32, the controller 100 may determine that a failure in operation is occurring in the third switches.

As apparent from the above discussion, the second modification is designed to use the voltage monitoring sensor V100 working to monitor a terminal voltage developed at the second storage battery 32 for diagnosing a malfunction of the third switches, thereby enabling the third current sensor A13 to be omitted.

Third Modification

The third modification of how to diagnose the conditions of the third switches will be described below. Although not illustrated, the power supply system 30 includes the voltage monitoring sensor V100 working to measure and supervise a terminal voltage developed at the second storage battery 32. This third modification uses the voltage monitoring sensor V100 to perform the above-described switch diagnostic task. FIG. 15 shows a relation of on- or off-states of the third-A switch SW3*a* and the third-B switch SW3*b* to corresponding outputs from the voltage monitoring sensor V100 when the third-A switch SW3*a* and the third-B switch SW3*b* are properly operating. The third modification is different from the first modification only in times when the third-A switch SW3*a* and the third-B switch SW3*b* are turned on or off. How to diagnose the conditions of the third-A switch SW3*a* and the third-B switch SW3*b* is substantially the same as in the first modification, and explanation thereof in detail will be omitted here. The third modification is capable of diagnosing a malfunction of the third-B switch SW3*b* as well as the third switches as a whole.

Fourth Modification

Figures 16, 17, 18:
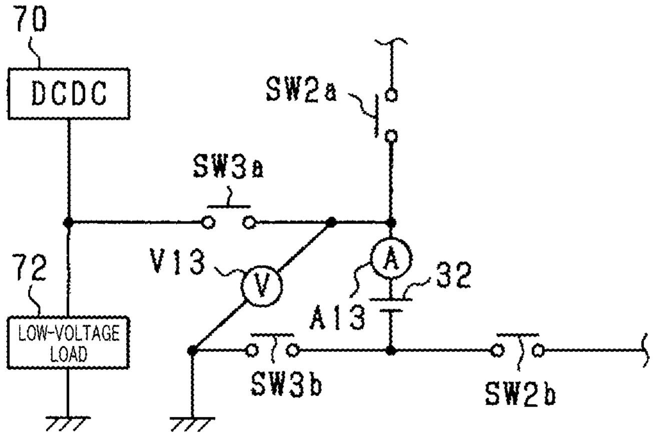
FIG. 16 is a circuit diagram which illustrates a third voltage sensor installed in a power supply system in the fourth modification.
FIG. 17 is a table representing a relation of on- or off-states of third switches and corresponding sensor outputs when the third switches are properly operating in the fourth modification.
FIG. 18 is a table representing a relation of on- or off-states of third switches and corresponding sensor outputs when the third switches are properly operating in the fifth modification.

The fourth modification of how to diagnose the conditions of the third switches will be described below with reference to FIG. 16. The fourth modification, as illustrated in FIG. 16, includes the third voltage sensor V13. The third voltage sensor V13 has a first end and a second end. The first end connects with a portion of the third-A electrical path 3A which is located closer to the positive terminal of the second storage battery 32 than the third-A switch SW3*a* is. The second end connects with a portion of the third-B electrical path 3B which is located closer to the low-voltage ground line L2 than the third-B switch SW3*b* is. The fourth modifications uses an output from the third voltage sensor V13 to diagnose a malfunction of the third switches. FIG. 17 shows a table representing a relation of on- or off-states of the third-A switch SW3*a* and the third-B switch SW3*b* to corresponding outputs from the third voltage sensor V13 when the third-A switch SW3*a* and the third-B switch SW3*b* are properly operating.

An operation in step S208 in the fourth modification will first be described. When the third switches (i.e., the third-A switch SW3*a* and the third-B switch SW3*b*) are turned on, but an output of the voltage monitoring sensor V100 is, as shown in an upper row of the table in FIG. 17, not identical with a level of voltage (e.g., 14V) supplied from the DC-to-DC converter 70, the controller 100 determines that a failure in operation is occurring in the third switches.

When an output of the third voltage sensor V13 with the third-A switch SW3*a* turned off, and the third-B switch SW3*b* turned on is, as demonstrated in a middle row of the table in FIG. 17, not identical with a level of terminal voltage (e.g., 12V) developed at the second storage battery 32, the controller 100 determines that the third-A switch SW3*a* is malfunctioning. Alternatively, when the output of the third voltage sensor V13 is equal to the level of terminal voltage (e.g., 12V) developed at the second storage battery 32, the controller 100 determines that no failure in operation is occurring in the third-A switch SW3*a*.

When an output of the third voltage sensor V13 with the third-A switch SW3*a* turned off and the third-B switch SW3*b* turned off is, as demonstrated in a lower row of the table in FIG. 17, unstable or inconstant, the controller 100 determines that no failure in operation is occurring in the third-B switch SW3*b*. Alternatively, when the output of the third voltage sensor V13 is constant, the controller 100 determines that a failure in operation is occurring in the third-B switch SW3*b*. The term "inconstant", as referred to herein, means that an output from the third voltage sensor V13 is not fixed, in other words, varying, and that it may be zero, but not identical both with a level of voltage outputted from the DC-to-DC converter 70 and with a terminal voltage at the second storage battery 32. Therefore, when an output from the third voltage sensor V13 is not equal both to a level of voltage supplied from the DC-to-DC converter 70 and to a terminal voltage at the second storage battery 32, the controller 100 determines that the third-B switch SW3*b* is properly operating. Alternatively, when the output from the third voltage sensor V13 is equal to at least one of the level of voltage supplied from the DC-to-DC converter 70 and the terminal voltage at the second storage battery 32, the controller 100 determines that the third-B switch SW3*b* is malfunctioning.

When the third-A switch SW3*a* or the third-B switch SW3*b* is determined to be malfunctioning, the controller 100 concludes that a failure in operation is occurring in the third switches. Alternatively, when the third-A switch SW3*a* and the third-B switch SW3*b* are both determined to be properly operating, the controller 100 concludes that no failure in operation is occurring in the third switches.

Next, an operation in step S209 in the fourth modification will be described. When the third switches are turned off, but an output from the third voltage sensor V13 is, as shown in a lower row of the table in FIG. 17, not inconstant, for example, it is equal to a level of voltage supplied from the DC-to-DC converter 70 or a terminal voltage developed at the second storage battery 32, the controller 100 determines that the third switches are malfunctioning.

When an output from the third voltage sensor V13 with the third-A switch SW3*a* turned off, and the third-B switch SW3*b* turned on, as shown in a middle row of the table in FIG. 17, is not equal to a terminal voltage at the second storage battery 32, the controller 100 determines that the third-B switch SW3*b* is malfunctioning, and a failure in operation is occurring in the third switches.

When determining that an output from the third voltage sensor V13 with the third-A switch SW3*a* turned on, and the third-B switch SW3*b* turned on is equivalent to a level of voltage supplied from the DC-to-DC converter 70, the controller 100 determines that the third-A switch SW3*a* and the third switches are both properly operating. If not, the controller 100 determines that a failure in operation is occurring in the third-A switch SW3*a* and that the third switches are malfunctioning.

Therefore, use of the third voltage sensor V13 in the fourth modification enables a diagnosis of which of the third-A switch SW3*a* and the third-B switch SW3*b* is malfunctioning as well as a whole diagnosis of the third switches.

The third voltage sensor V13 may have a first end and a second end. The first end connects with a portion of the third-A electrical path 3A which is located closer to the low-voltage power supply line H2 than the third-A switch SW3*a* is. The second end connects with a portion of the third-B electrical path 3B which is located closer to the negative terminal of the second storage battery 32 than the third-B switch SW3*b* is. This structure, like the fourth modification, enables a diagnosis of which of the third-A switch SW3*a* and the third-B switch SW3*b* is malfunctioning.

Fifth Modification

The fifth modification that is a modified form of how to diagnose the third switches will be described below. The fifth modification, like in the fifth modification, uses an output from the third voltage sensor V13 for diagnosis of the third switches. The fifth modification is, however, as demonstrated in FIG. 18, different from the fourth modification in a sequence of on- or off-operations of the third-A switch SW3*a* and the third-B switch SW3*b*. The fifth modification is capable of diagnosing a malfunction of the third switches, but, unlike the fourth modification, incapable of determining which of the third-A switch SW3*a* and the third-B switch SW3*b* is currently malfunctioning. This modification is different from the first modification only in use of the third voltage sensor V13 instead of the third current sensor A13. The method of the malfunction diagnosis is substantially the same as in the first modification, and explanation thereof in detail is omitted here.

Sixth Modification

The sixth modification that is a modified form of how to diagnose the second switches will be described below. The above embodiments, as described above, use the output from the third current sensor A13 in the switch diagnostic task, while this modification uses an output from one of the first voltage sensor V1, the second voltage sensor V2, and the second current sensor A12. As long as the second switches are properly operating, the outputs from the first voltage sensor V1, the second voltage sensor V2, and the second current sensor A12, as can be seen in FIG. 11, depend upon a combination of on- and off-states of the second switches.

In the table shown in FIG. 11, "V1" represents the first voltage sensor V1. "V2" represents the second voltage sensor V2. "Depending on INV" in each of the V1 and V2 columns of the table means that an output from a corresponding one of the first voltage sensor V1 and the second voltage sensor V2 depends on a rise or a drop in voltage stepped-up or -down by the operating inverter 20. "-A11" in the A12 column of the table means that an output from the first current sensor A11 has a minus value. "Depending on INV" in the A12 column of the table means that an amount of electrical current flowing through the second current sensor A12 depends on how to control the operation of the inverter 20. It is, therefore, necessary for the controller 100 to control the operation of the inverter 20 as needed in order to correctly detect a change in output from each of the first voltage sensor V1, the second voltage sensor V2, and the second current sensor A12. How to diagnose the malfunction of the second switches is substantially the same as in the first embodiment using an output from the third current sensor A13, and explanation thereof in detail will be omitted here.

Seventh Modification

The seventh modification that is a modified form of the method of diagnosing the second switches will be described below. The seventh modification, as shown in FIG. 19, uses an output from one of the first voltage sensor V1, the second voltage sensor V2, and the second current sensor A12 and modifies a sequence of on- and off-operations of the second-A switch SW2*a* and the second-B switch SW2*b*. Basically, a method of diagnosing the second switches is substantially the same as in the first embodiment and the sixth modification, and explanation thereof in detail will be omitted here.

Eighth Modification

The eighth modification that is a modified form of the method of diagnosing the second switches will be described below. The eighth modification, as illustrated in FIG. 20, uses the fourth voltage sensor V14 to diagnose the second switches. The fourth voltage sensor V14 has a first end and a second end. The first end connects with a portion of the second-A electrical path 2A which is located closer to the positive termina of the second storage battery 32 than the second-A switch SW2*a* is. The second end connects with a portion of the second-B electrical path 2B which is located closer to the high-voltage ground line L1 than the second-B switch SW2*b* is.

FIG. 21 is a table representing a relation of on- or off-states of the second-A switch SW2*a* and the second-B switch SW2*b* to corresponding outputs from the fourth voltage sensor V14 when the second-A switch SW2*a* and the second-B switch SW2*b* are properly operating. An operation in step S111 in the eighth modification will first be described with reference to FIG. 21.

When the second switches are turned off, but an output from the fourth voltage sensor V14 is, as can be seen in an upper row of the table in FIG. 21, not inconstant, the controller 100 determines that a failure in operation is occurring in the second switches. For instance, when the output from the fourth voltage sensor V14 is equal to a value derived by subtracting a terminal voltage at the third storage battery 33 from a terminal voltage (i.e., 12V) at the second storage battery 32 or a terminal voltage at the neutral point-side smoothing capacitor C1, the controller 100 determines that a failure in operation is occurring in the second switches. The terminal voltage developed at the neutral point-side smoothing capacitor C1 is measured by the second voltage sensor V2. The terminal voltage at the third storage battery 33 in this modification is 200V.

The turning on of the second switches in step S110 is achieved by the controller 100 to first turn on the second-A switch SW2*a* and then turn on the second-B switch SW2*b*, thereby changing the second switches from the off-states to the on-states. Therefore, when an output from the fourth voltage sensor V14 with the second-A switch SW2*a* turned on, and the second-B switch SW2*b* turned off is, as shown in a middle row of the table in FIG. 21, different from a value (i.e., V2-200) derived by subtracting a terminal voltage at the third storage battery 33 from a terminal voltage at the neutral point-side smoothing capacitor C1, the controller 100 determines that the second-A switch SW2*a* and the second switches are malfunctioning.

Alternatively, when an output from the fourth voltage sensor V14 with the second-A switch SW2*a* turned on, and the second-B switch SW2*b* turned on is identical with a terminal voltage (12V) at the second storage battery 32, the controller 100 determines that the second-A switch SW2*a*, the second-B switch SW2*b*, and the second switches are properly operating. Alternatively, when the second switches are turned on, but an output from the fourth voltage sensor V14 is different from the terminal voltage (12V) at the second storage battery 32, the controller 100 determines that the second-B switch SW2*b* and the second switches are malfunctioning.

It is advisable that the terminal voltage appearing at the neutral point-side smoothing capacitor C1 be stepped-up to develop a difference between a value, as derived by subtracting the terminal voltage at the third storage battery 33 from that at the neutral point-side smoothing capacitor C1 (i.e., V2-200), and the terminal voltage (12V) at the second storage battery 32. Specifically, it is preferable in step S109 that the operation of the inverter 20 is controlled to raise the terminal voltage at the neutral point-side smoothing capacitor C1.

In the diagnosis of the second switches which is performed in steps S204 to S205 with the second switches turned off, this modification is also capable of determining which of the second-A switch SW2*a* and the second-B switch SW2*b* is currently malfunctioning in the same way as described above.

As apparent from the above discussion, the eighth modification is capable of identifying which of the second-A switch SW2*a* and the second-B switch SW2*b* is malfunctioning as well as the diagnosis of the second switches.

Ninth Modification

The ninth modification that is a modified form of the method of diagnosing the second switches will be described below. The ninth modification uses an output from the fourth voltage sensor V14 which has been described in the eighth modification. The ninth modification is, however, different from the eighth modification in sequence of on- and off-operations of the second-A switch SW2*a* and the second-B switch SW2*b*.

The ninth modification is, as can be seen in FIG. 22, capable of diagnosing the third switches only using an output from the fourth voltage sensor V14, but however, it is, unlike the eighth modification, impossible to determine which of the second-A switch SW2*a* and the second-B switch SW2*b* is malfunctioning.

The ninth modification uses a combination of one or two or more of outputs from the first voltage sensor V1, the second voltage sensor V2, the second current sensor A12, and the third current sensor A13 with an output from the fourth voltage sensor V14. The diagnosis of the second-B switch SW2*b* is performed using an output from the fourth voltage sensor V14. The diagnosis of the second-A switch SW2*a* is performed using one or two or more of outputs from the first voltage sensor V1, the second voltage sensor V2, the second current sensor A12, and the third current sensor A13. This, as can be seen in FIG. 22, enables a determination of which of the second-A switch SW2*a* and the second-B switch SW2*b* is malfunctioning.

Tenth Modification

Figure 23:
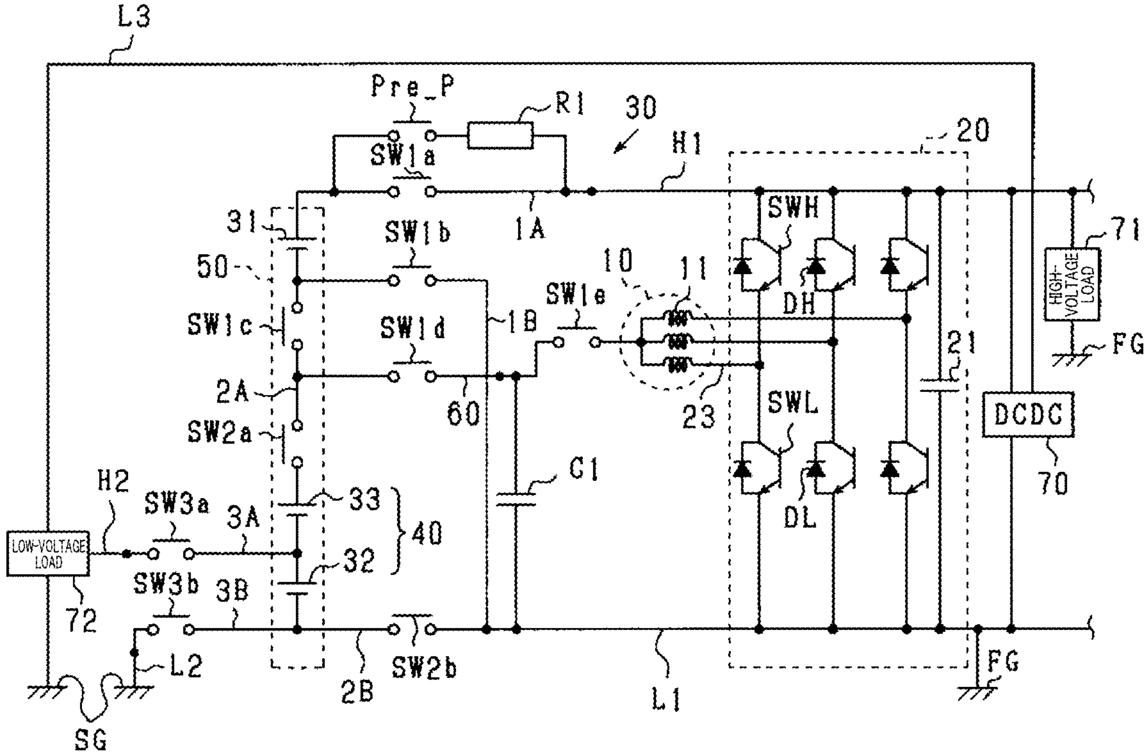
FIG. 23 is a circuit diagram which illustrates electrical connections of circuit components in a power supply system according to the tenth modification.

The tenth modification is a modified form of the first embodiment. The tenth modification, unlike the first embodiment, does not have a switch which is disposed between the second storage battery 32 and the third storage battery 33 and works to establish or block an electrical connection between the second storage battery 32 and the third storage battery 33 in the power supply system 30 discussed in the first embodiment. Specifically, the positive terminal of the second storage battery 32 is, as shown in FIG. 23, connected directly to the negative terminal of the third storage battery 33 in the power supply system 30. The second-A switch SW2*a* is arranged between the first-C switch SW1*c* and the third storage battery 33.

Eleventh Modification

Figure 24:
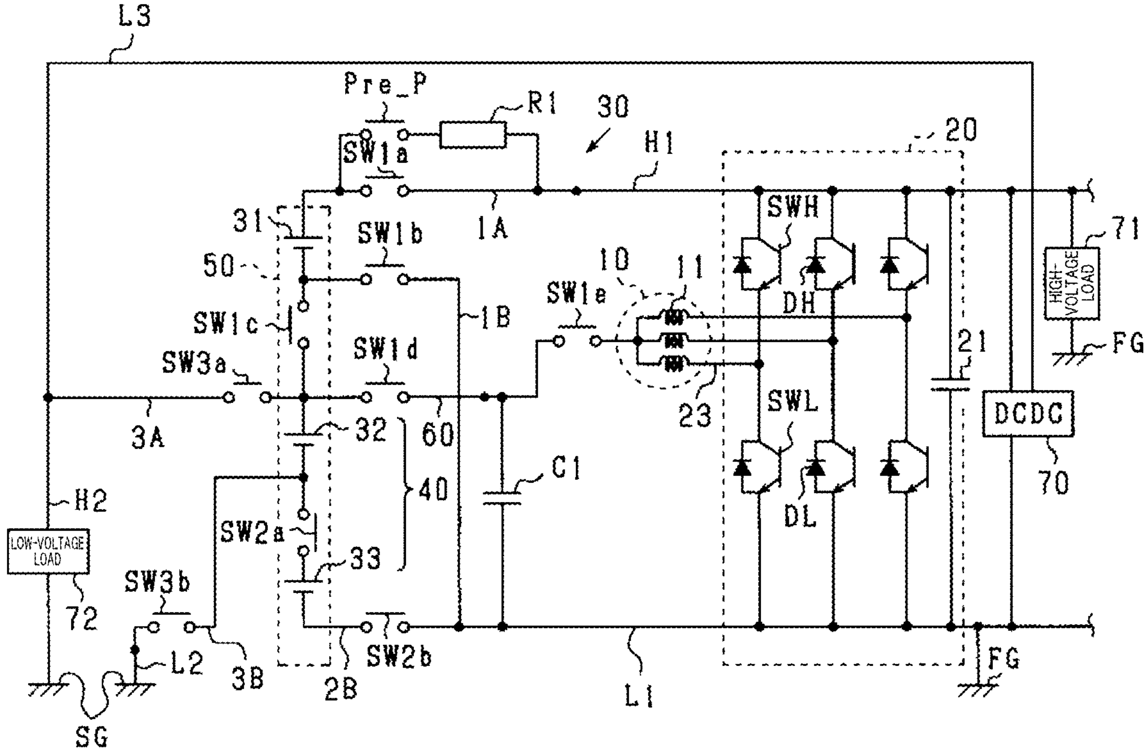
FIG. 24 is a circuit diagram which illustrates electrical connections of circuit components in a power supply system according to the eleventh modification.

The eleventh modification is a modified form of the first embodiment. The eleventh modification is designed to be different from the first embodiment in layout of the second storage battery 32 and the third storage battery 33 in the power supply system 30. The power supply system 30 in this modification, as illustrated in FIG. 24, includes the first storage battery 31, the second storage battery 32, and the third storage battery 33 which are connected in series with each other and arranged in this order from the high-voltage power supply line H1. In other words, the first storage battery 31 is located closest to the high-voltage power supply line H1. The second-A switch SW2*a* is disposed between the negative terminal of the second storage battery 32 and the positive terminal of the third storage battery 33 and works to establish or block an electrical connection of the second storage battery 32 and the third storage battery 33.

Twelfth Modification

Figure 25:
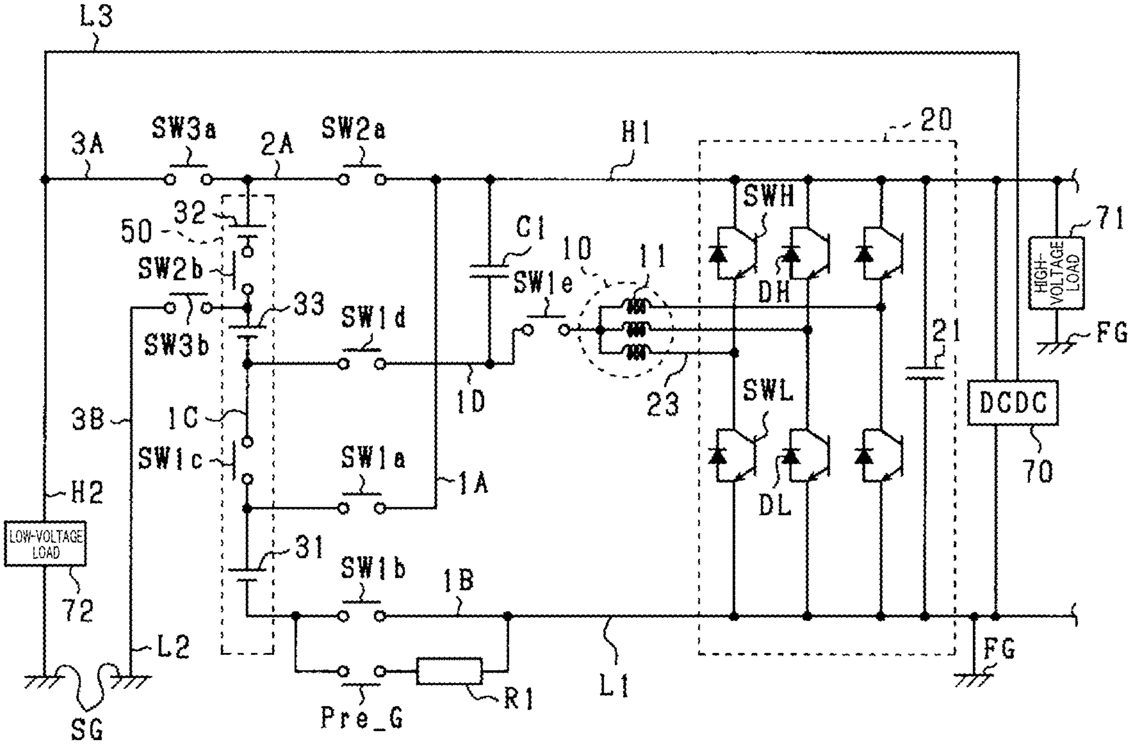
FIG. 25 is a circuit diagram which illustrates electrical connections of circuit components in a power supply system according to the twelfth modification.

The twelfth modification is a modified form of the first embodiment. The power supply system 30 in this modification is different from that in the first embodiment in layout of the first storage battery 31, the second storage battery 32, and the third storage battery 33. Specifically, the power supply system 30, as illustrated in FIG. 25, includes the second storage battery 32, the third storage battery 33, and the first storage battery 31 which are arranged in this order from the high-voltage power supply line H1. In other words, the second storage battery 32 is located closest to the high-voltage power supply line H1. An assembly of the pre-charge switch Pre_G and the resistor R1 connected in series with each other is connected in parallel to the first-B switch SW1*b*.

The first switches in the twelfth modification includes the first-B switch SW1*b*, the first-C switch SW1*c*, the first-D switch SW1*d*, and the first-E switch SW1*e*. The power supply system 30 in this modification includes first-X switches, a first-Y switch, a second-X switch, and a second-Y switch. The first-X switches include the first-C switch SW1*c*, the first-D switch SW1*d*, and the first-E switch SW1*e*. The first-Y switch includes the first-B switch SW1*b*. The second-X switch includes the second-B switch SW2*b*. The second-Y switch includes the second-A switch SW2*a*.

Thirteenth Modification

Figure 26:
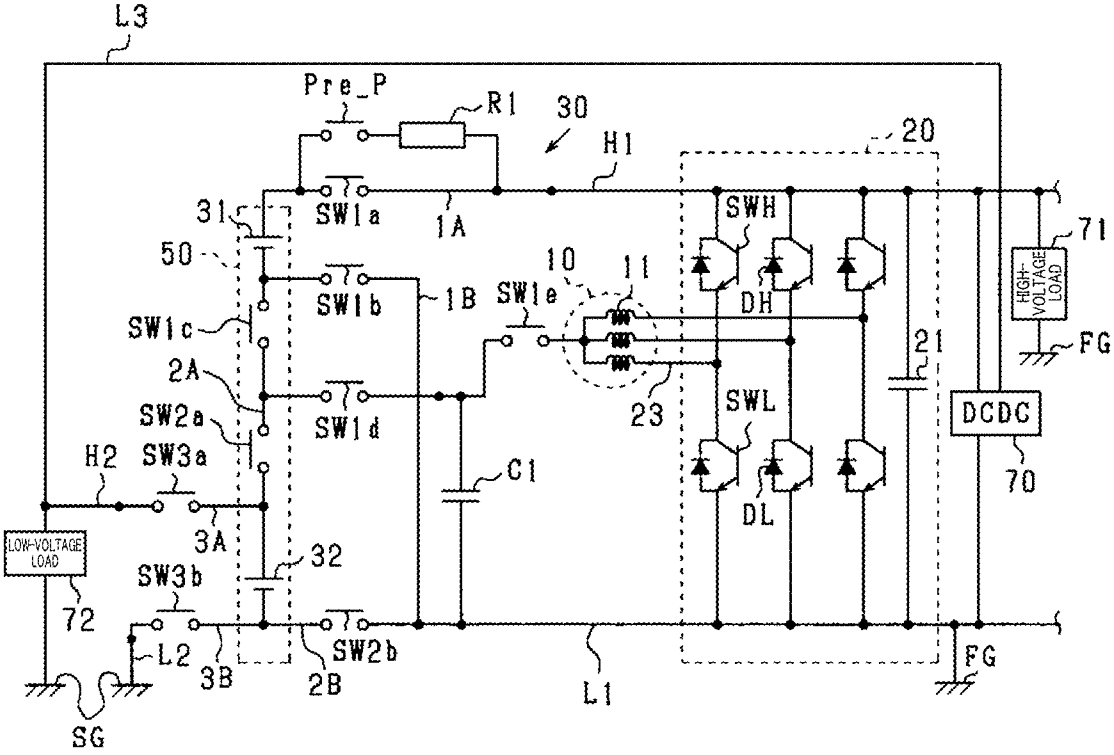
FIG. 26 is a circuit diagram which illustrates electrical connections of circuit components in a power supply system according to the thirteenth modification.
Figure 27A:
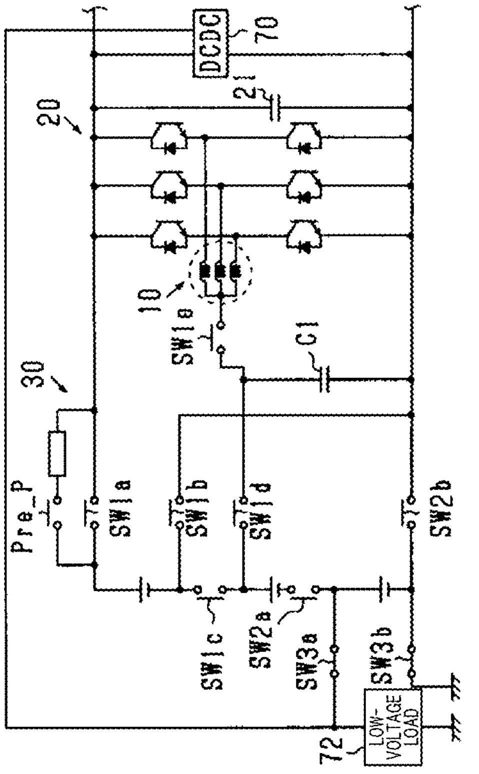
FIGS. 27(*a*), 27(*b*), 27(*c*), and 27(*d*) are views which represent a sequence of steps to change on- or off-states of switches in an in-vehicle system in the fourteenth modification.
Figure 27B:
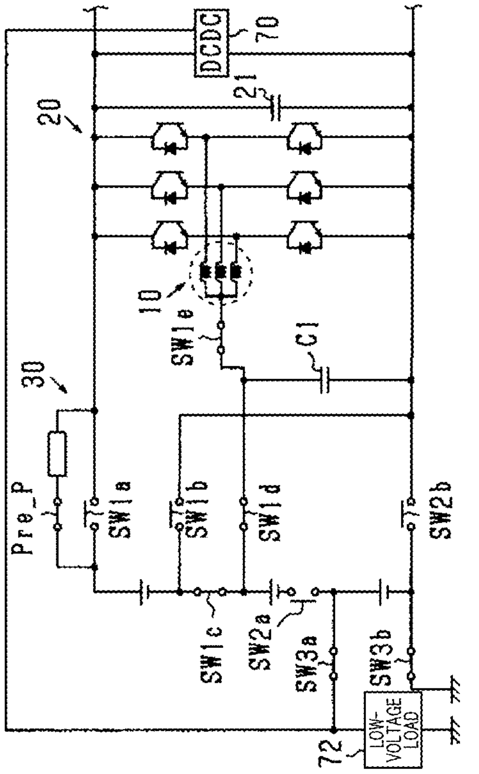
Figure 27C:
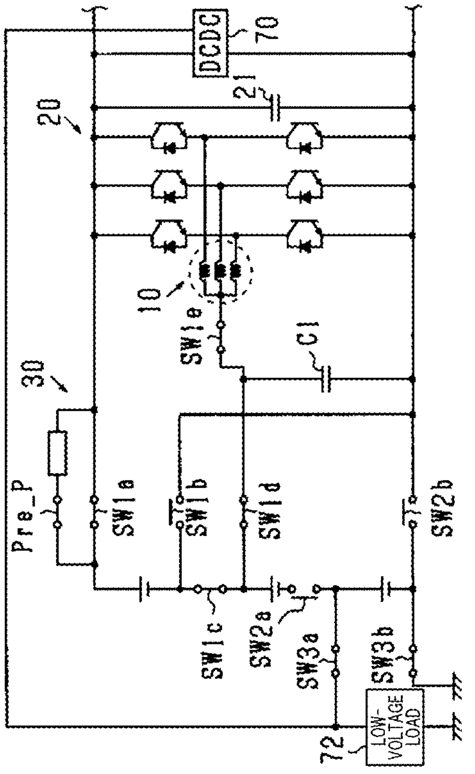
Figure 27D:
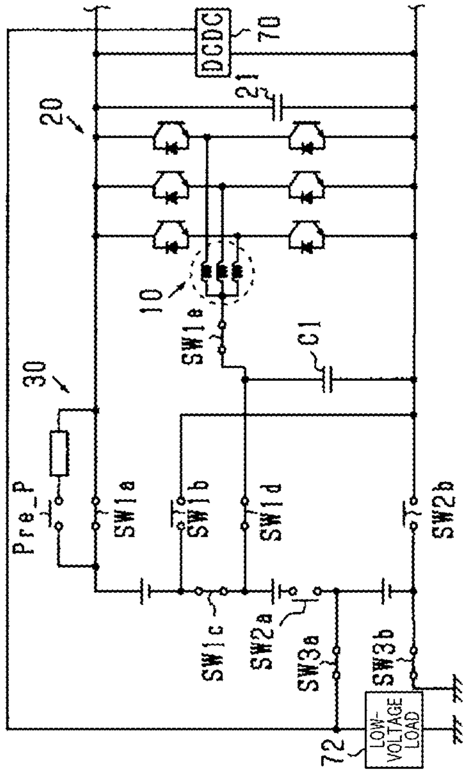
Figure 28E:
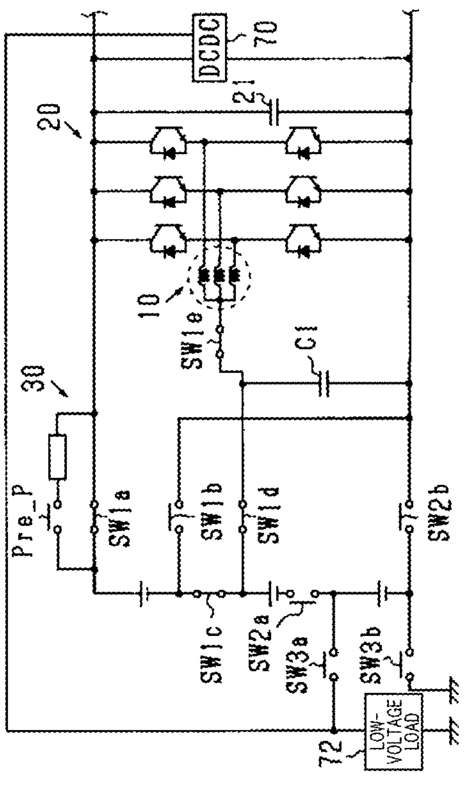
FIGS. 28(*e*), 28(*f*), 28(*g*), and 28(*h*) are views which represent a sequence of steps to change on- or off-states of switches in an in-vehicle system in the fourteenth modification.
Figure 28F:
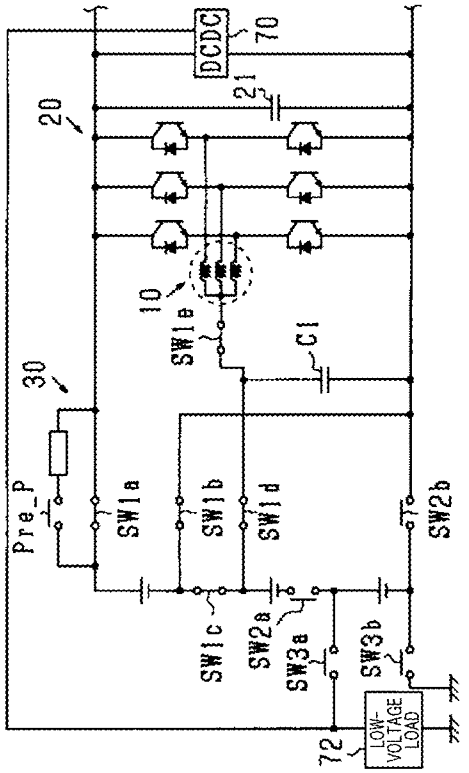
Figure 28G:
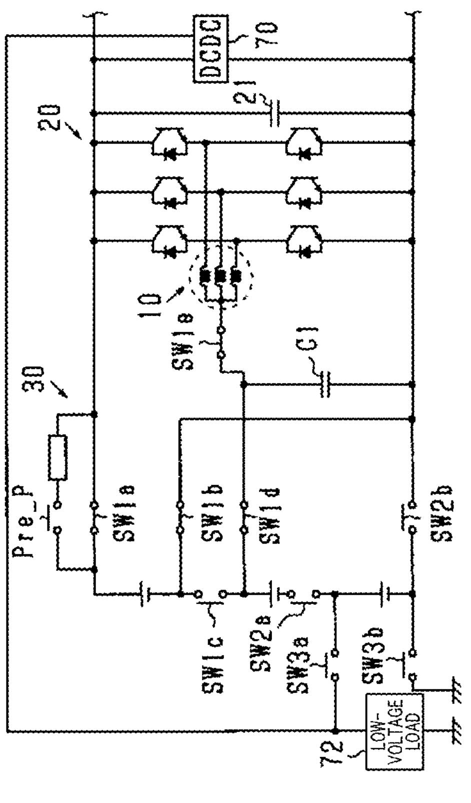
Figure 28H:
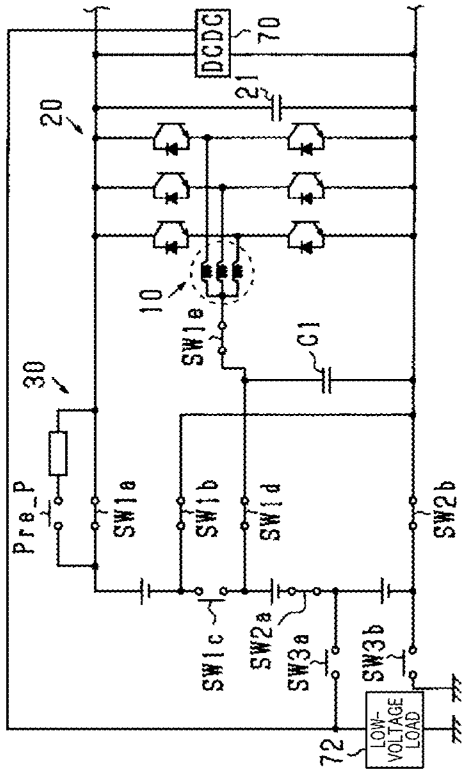
Figure 29A:
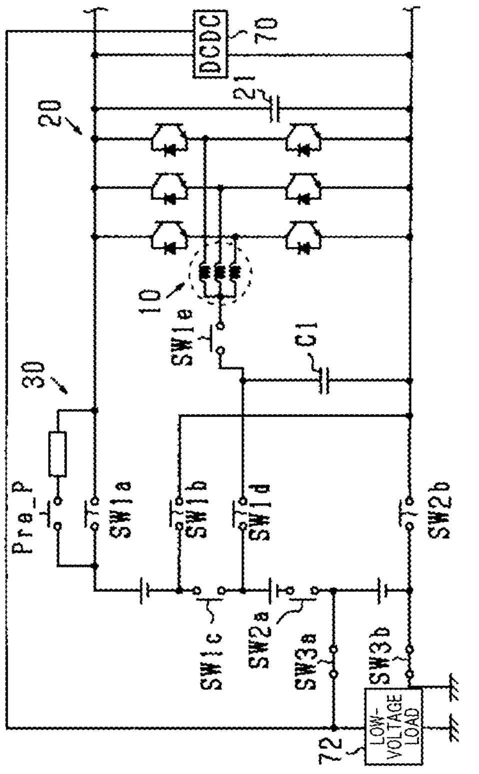
FIGS. 29(*a*), 29(*b*), 29(*c*), and 29(*d*) are views which represent a sequence of steps to change on- or off-states of switches in an in-vehicle system in the fifteenth modification.
Figure 29B:
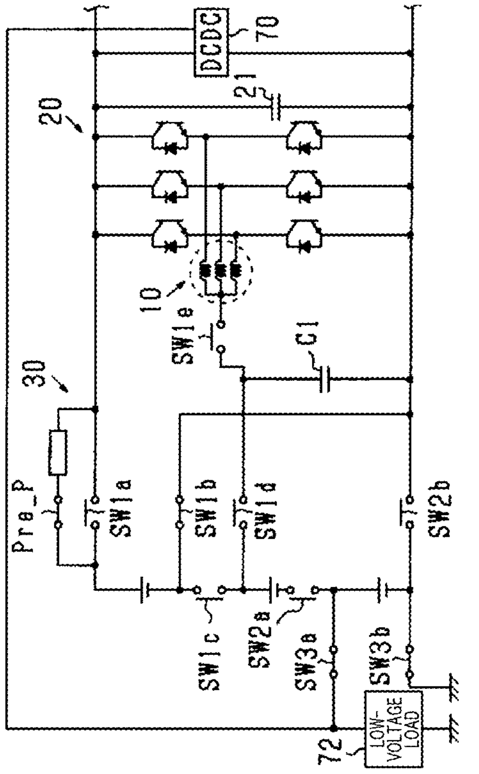
Figure 29C:
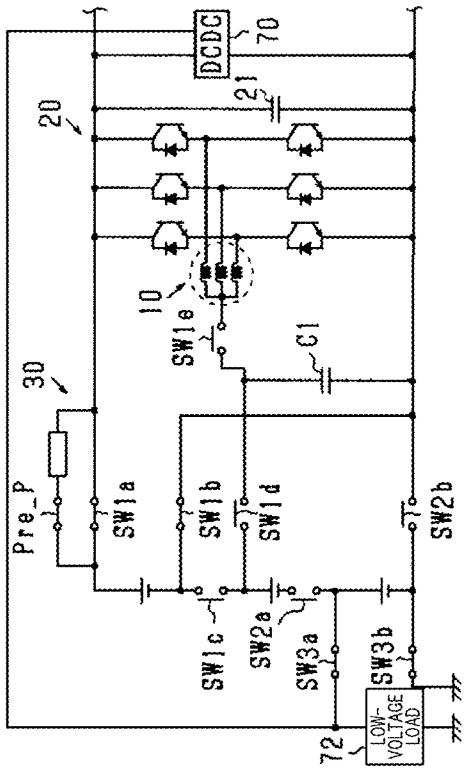
Figure 29D:
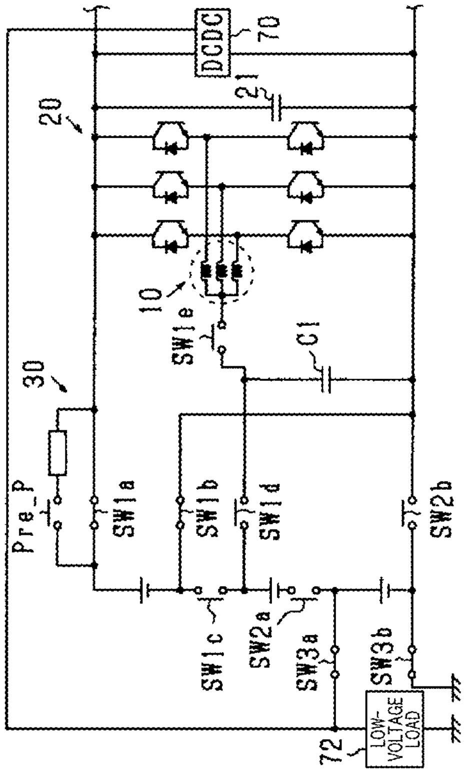
Figure 30E:
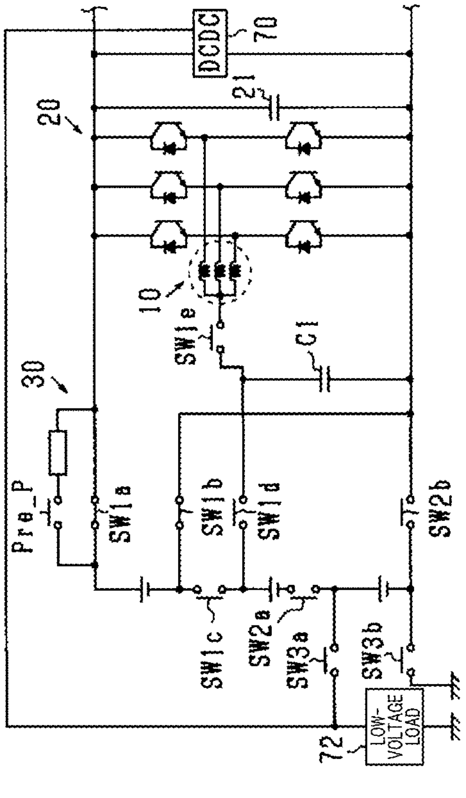
FIGS. 30(*e*), 30(*f*), 30(*g*), and 30(*h*) are views which represent a sequence of steps to change on- or off-states of switches in an in-vehicle system in the fifteenth modification.
Figure 30F:
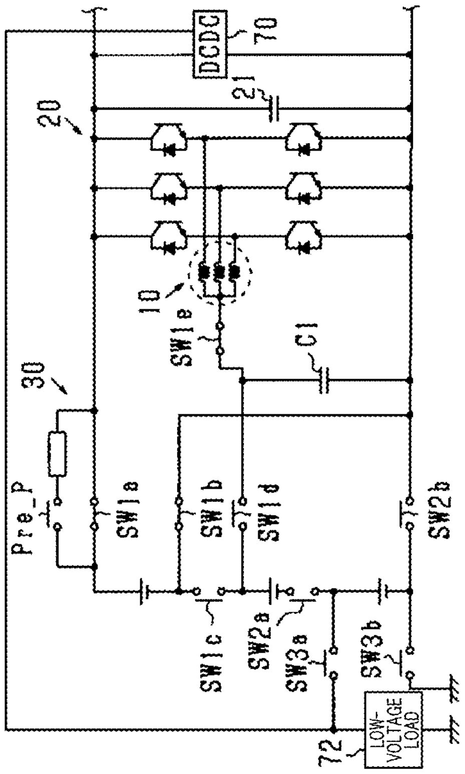
Figure 30G:
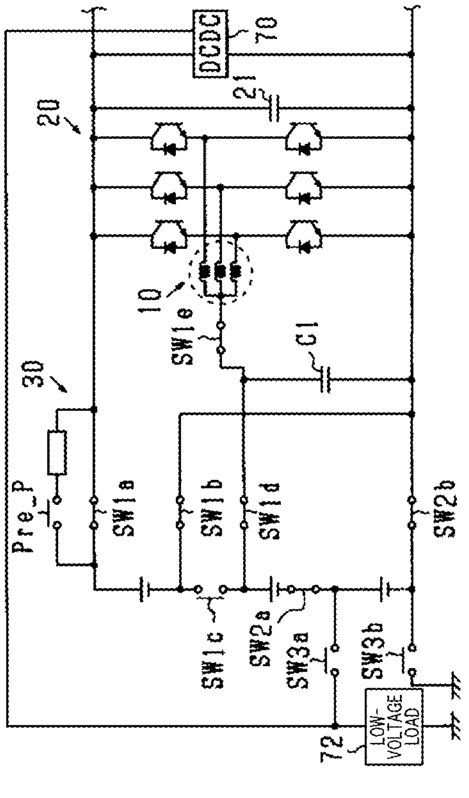
Figure 30H:
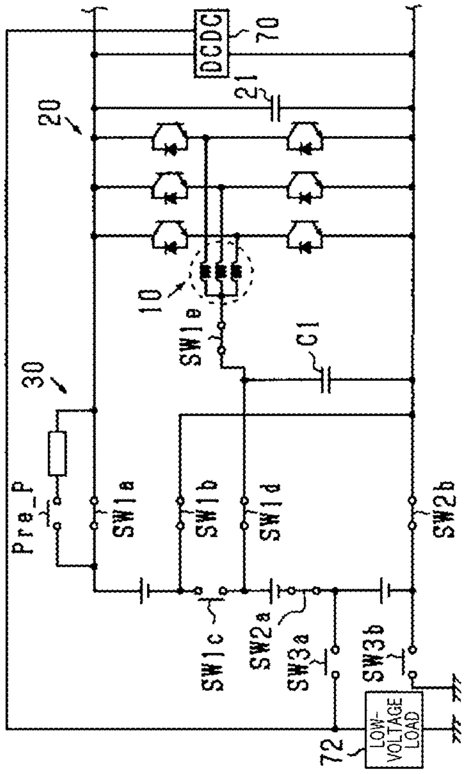
Figure 31A:
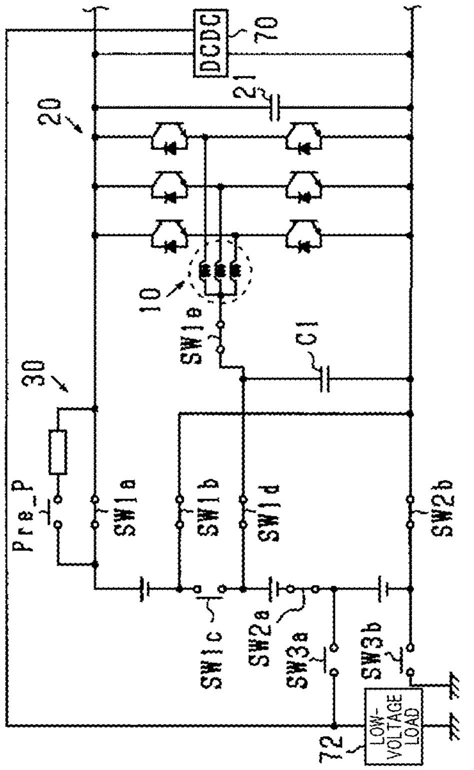
FIGS. 31(*a*), 31(*b*), 31(*c*), and 31(*d*) are views which represent a sequence of steps to change on- or off-states of switches in an in-vehicle system in the sixteenth modification.
Figure 31B:
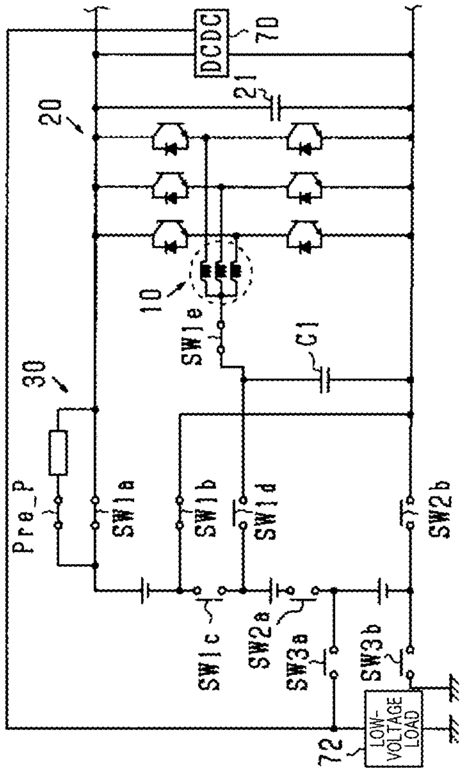
Figure 31C:
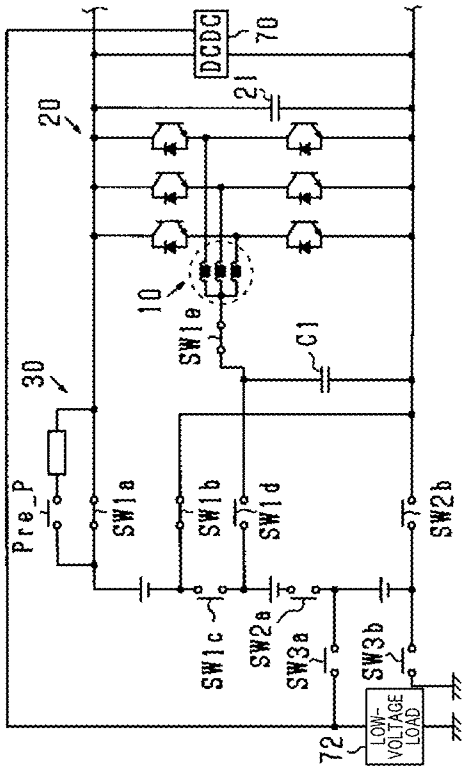
Figure 31D:
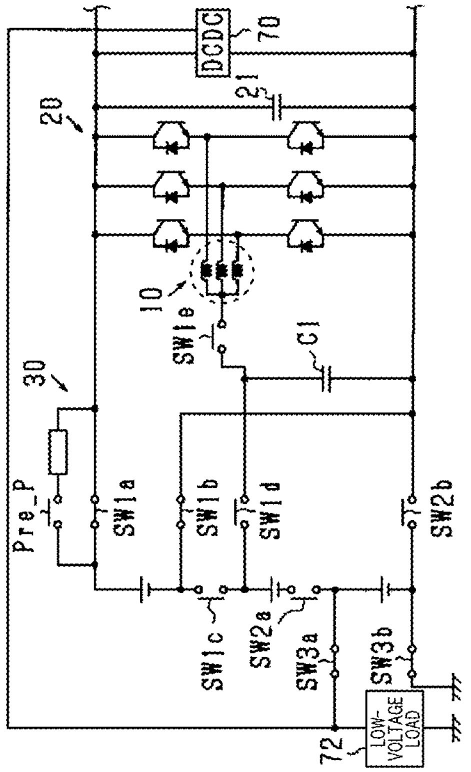

The thirteenth modification is a modified form of the first embodiment. The power supply system 30 in this modification is designed not to have the third storage battery 33. Specifically, the power supply system 30 in this modification, as illustrated in FIG. 26, includes only the first storage battery 31 and the second storage battery 32.

Fourteenth Modification

The fourteenth modification is different from the above embodiments in a sequence of on- and off-operations of the switches SW which will be described below with reference to FIGS. 27(*a*) to 28(*h*). FIGS. 27(*a*) to 28(*h*) demonstrate the sequence of on- and off-operations of the switches SW when the vehicle is changed from the stopped state to the activated state. Before the vehicle is activated, the switches SW are placed in on- and off-states illustrated in FIG. 27(*a*) during the stop of the vehicle. Specifically, the third switches are turned on.

When the vehicle is activated from the stopped state, the switches SW are changed to the on- and off-state demonstrated in FIG. 27(*b*). Specifically, the controller 100 turns on the pre-charge switch Pre_P, the first-C switch SW1*c*, the first-D switch SW1*d*, and the first-E switch SW1*e* and electrically charges the in-inverter smoothing capacitor 21 until a terminal voltage at the in-inverter smoothing capacitor 21 reaches that at the first storage battery 31.

After completion of the charging of the in-inverter smoothing capacitor 21, the switches SW are changed to on- and off-states demonstrated in FIGS. 27(*c*) to 27(*d*). Specifically, the controller 100 turns on the first-A switch SW1*a* and then turns off the pre-charge switch Pre_P. When turning on the first switches, the controller 100 diagnoses the first switches in the same away as in the first embodiment. After completion of such diagnosis, the controller 100 delivers a high-voltage power from the first storage battery 31 to the DC-to-DC converter 70. The DC-to-DC converter 70 then steps-down the input voltage power and supplies it to the low-voltage load 72.

The controller 100, as illustrated in FIG. 28(*e*), turns off the third switches. When turning off the third switch, the controller 100 diagnoses the third switches in the same way as described in the above embodiments and modifications. After completion of such diagnosis, the controller 100, as illustrated in FIG. 28(*f*), turns on the first-B switch SW1*b*. When turning on the first-B switch SW1*b*, the controller 100 may use an output from the first current sensor A11 to diagnose the first-B switch SW1*b*.

Subsequently, the controller 100, as illustrated in FIG. 28(*g*), turns off the first-C switch SW1*c* to step-down voltage, outputted from the first storage battery 31, using the motor 10 and the inverter 20 to electrically charge the neutral point-side smoothing capacitor C1. Specifically, the controller 100 charges the neutral point-side smoothing capacitor C1 to bring a terminal voltage at the neutral point-side smoothing capacitor C1 into agreement with a terminal voltage (212V) developed at the first series-connected assembly 40 made up of the second storage battery 32 and the third storage battery 33.

Subsequently, the controller 100, as illustrated in FIG. 28(*h*), turns on the second-B switch SW2*b*. When turning on the second-B switch SW2*b*, the controller 100 analyzes an output from the second voltage sensor V2, the second current sensor A12, the third current sensor A13, or the fourth voltage sensor V14 used in the eighth modification to diagnose the second-B switch SW2*b*. After completion of such diagnosis, the controller 100 works to step-up voltage, as outputted from the first series-connected assembly 40, using the motor 10 and the inverter 20 and deliver it to the high-voltage power supply line H1. The first storage battery 31 and the first series-connected assembly 40 are, therefore, connected in parallel to the high-voltage power supply line H1.

In the fourteenth modification, the first switches include the pre-charge switch Pre_P, the first-A switch SW1*a*, and the first-B switch SW1*b*. The neutral point connecting switch includes the first-C switch SW1*c*, the first-D switch SW1*d*, and the first-E switch SW1*e*.

Fifteenth Modification

The fifteenth modification is different from the above embodiments in a sequence of on- and off-operations of the switches SW as illustrated in FIGS. 29(*a*) to 30(*h*). FIGS. 29(*a*) to 30(*h*) demonstrate the sequence of on- and off-operations of the switches SW when the vehicle is changed from the stopped state to the activated state. Before the vehicle is activated, the switches SW are placed in on- and off-states illustrated in FIG. 29(*a*) during the stop of the vehicle. Specifically, the third switches are turned on.

When the vehicle is activated from the stopped state, the switches SW are changed to the on- and off-state demonstrated in FIG. 29(*b*). Specifically, the controller 100 turns on the pre-charge switch Pre_P and the first-B switch SW1*b* and electrically charges the in-inverter smoothing capacitor 21 until a terminal voltage at the in-inverter smoothing capacitor 21 reaches that at the first storage battery 31.

After completion of the charging of the in-inverter smoothing capacitor 21, the switches SW are changed to on- and off-states demonstrated in FIGS. 29(*c*) to 29(*d*). Specifically, the controller 100 turns on the first-A switch SW1*a* and then turns off the pre-charge switch Pre_P. The operations demonstrated in FIGS. 29(*a*) to 29(*d*) will also be referred to as a third step. In the fifteenth modification, the first switches includes the pre-charge switch Pre_P, the first-A switch SW1*a*, and the first-B switch SW1*b*.

When turning on the first switches, the controller 100 diagnoses the first switches in the same way as described in the first embodiment. After completion of such diagnosis, the controller 100 supplies a high-voltage power from the first storage battery 31 to the DC-to-DC converter 70. The DC-to-DC converter 70 then steps-down the inputted power and delivers it the low-voltage load 72.

Subsequently, the controller 100, as illustrated in FIG. 30(*e*), turns off the third switches. When turning off the third switches, the controller 100 diagnoses the third switches in the same way as described in the above embodiments and modification. After completion of such diagnosis, the controller 100, as illustrated in FIG. 30(*f*), turns on the first-E switch SW1*e* and controls the motor 10 and the inverter 20 to electrically charge the neutral point-side smoothing capacitor C1. Specifically, the controller 100 charges the neutral point-side smoothing capacitor C1 until a terminal voltage at the neutral point-side smoothing capacitor C1 reaches a terminal voltage (212V) developed at the first series-connected assembly 40 made up of the second storage battery 32 and the third storage battery 33.

Subsequently, the controller 100, as illustrated in FIG. 30(*g*), turns on the second-A switch SW2*a*, the first-D switch SW1*d*, and the second-B switch SW2*b* (which will also be referred to below as a fourth step). When turning on the second-A switch SW2*a*, the first-D switch SW1*d*, and the second-B switch SW2*b*, the controller 100 analyzes an output from the second voltage sensor V2, the second current sensor A12, the third current sensor A13, and fourth voltage sensor V14 used in the eighth modification to diagnose the second switches in the same way as described above.

After completion of the above diagnosis, the controller 100, as illustrated in FIG. 30(*h*), works to step-up voltage, as delivered from the first series-connected assembly 40, using the motor 10 and the inverter 20 and supplies it to the high-voltage power supply line H1. The first storage battery 31 and the first series-connected assembly 40 are, therefore, electrically connected in parallel to the high-voltage power supply line H1.

In the fifteenth modification, the neutral point connecting switch includes the first-C switch SW1*c*, the first-D switch SW1*d*, and the first-E switch SW1*e*. The voltage at the neutral point-side smoothing capacitor C1 is, as described above, stepped up before the first series-connected assembly is electrically connected to the neutral point of the motor 10, thereby reducing the risk of inrush current.

Sixteenth Modification

The sixteenth modification is different from the above-described embodiments in a sequence of on- and off-operations of the switches SW. FIGS. 31(*a*) to 32(*g*) demonstrate the sequence of on- and off-operations of the switches SW when the vehicle is changed from the activated state to the stopped state.

When the vehicle is activated before being stopped, the switches SW are placed in on- and off-states illustrated in FIG. 31(*a*). FIG. 31(*a*) is identical in layout of electrical connections in the power supply system 30 with FIG. 30(*h*). When the vehicle is stopped, the controller 100 turns off the first-D switch SW1*d*, the second-A switch SW2*a*, and the second-B switch SW2*b*. When turning off the first-D switch SW1*d*, the second-A switch SW2*a*, and the second-B switch SW2*b*, the controller 100 diagnoses the second switches in the same way as described in the above-described embodiments and modifications.

After completion of the above diagnosis, the controller 100, as illustrated in FIG. 31(*c*), controls the inverter 20 to electrically discharge the neutral point-side smoothing capacitor C1. The controller 100, as illustrated in FIG. 31(*d*), changes the third switches from the off-state to the on-state. When turning on the third switches, the controller 100 diagnoses the third switches in the same way as referred to in the above-described embodiments and modifications. The controller 100 also turns off the first-E switch SW1*e*. Subsequently, the controller 100, as illustrated in FIG. 32(*e*), deactivates the DC-to-DC converter 70 to stop a supply of electrical power from the DC-to-DC converter 70 to the low-voltage load 72.

Figure 32F:
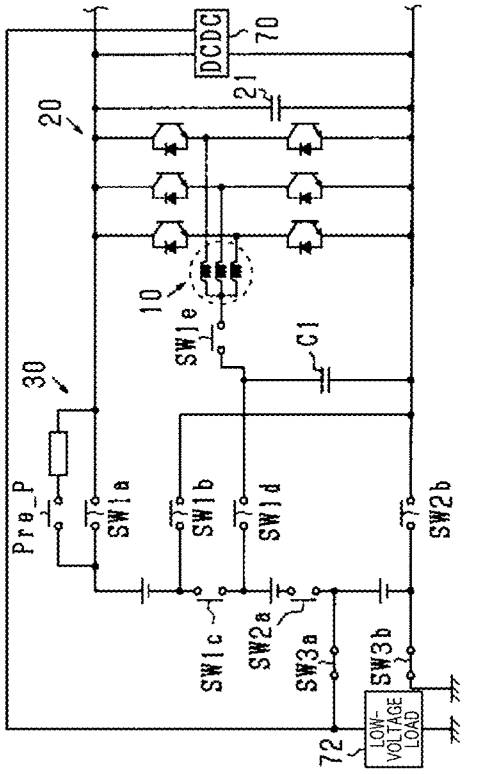
FIGS. 32(*e*), 32(*f*), and 32(*g*) are views which represent a sequence of steps to change on- or off-states of switches in an in-vehicle system in the sixteenth modification.
Figure 32E:
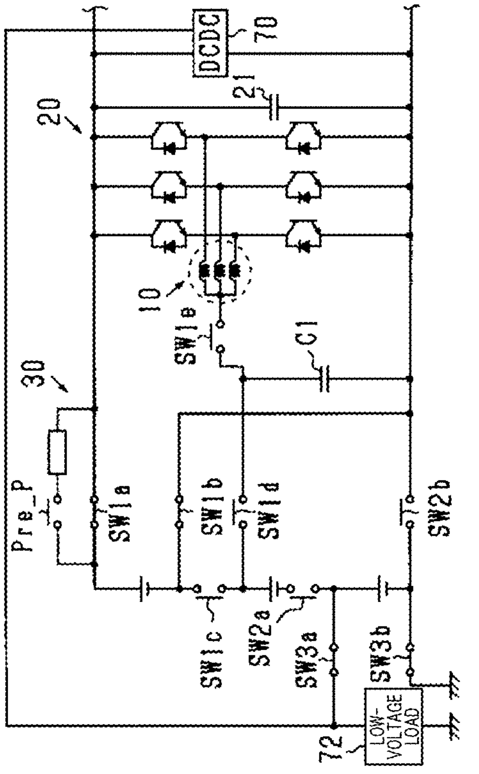
Figure 32G:
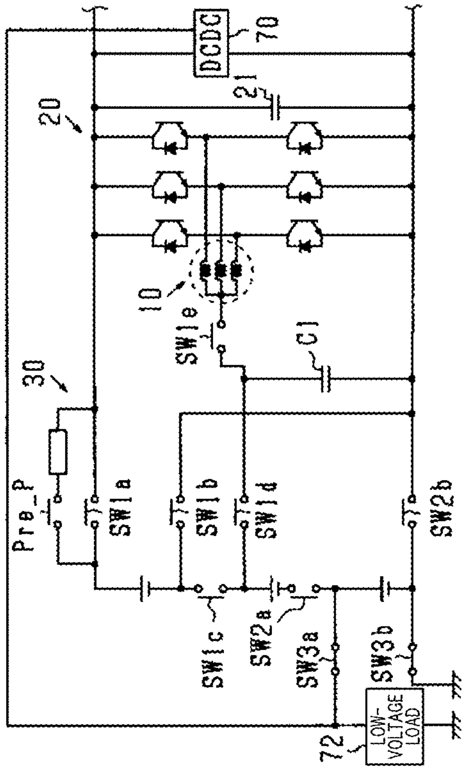
Figure 33A:
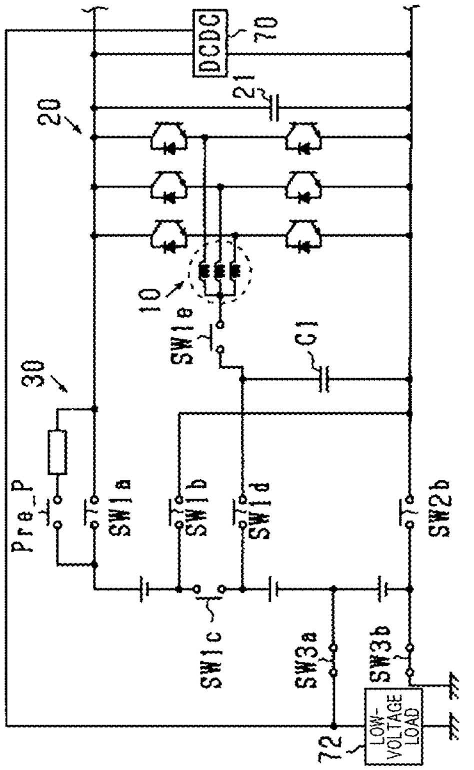
FIGS. 33(*a*), 33(*b*), 33(*c*), and 33(*d*) are views which represent a sequence of steps to change on- or off-states of switches in an in-vehicle system in the seventeenth modification.
Figure 33B:
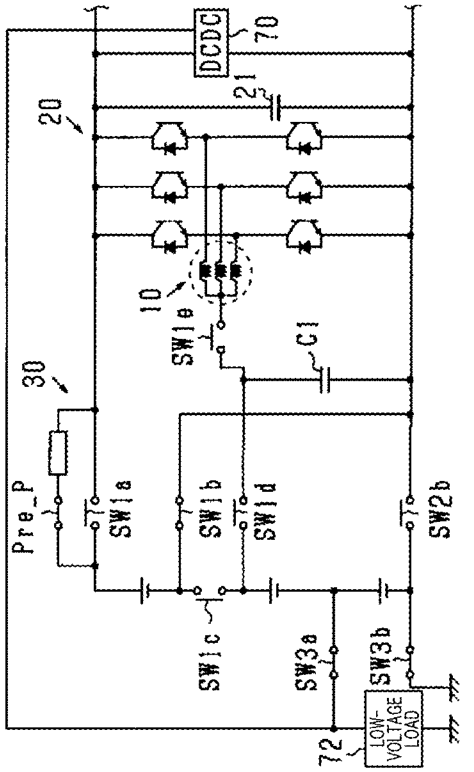
Figure 33C:
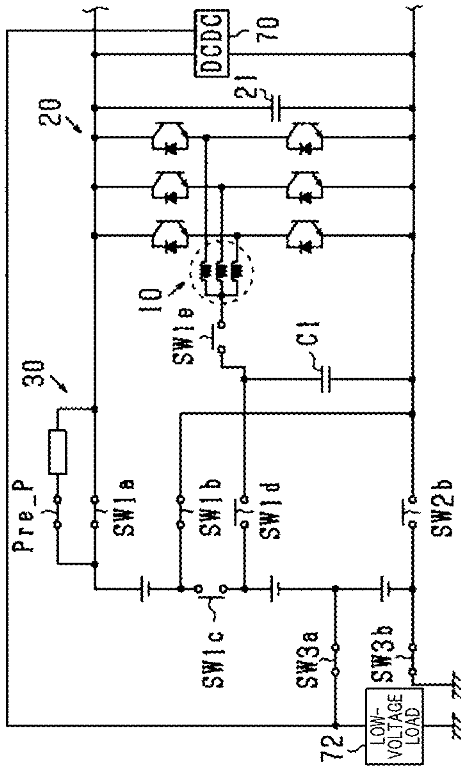
Figure 33D:
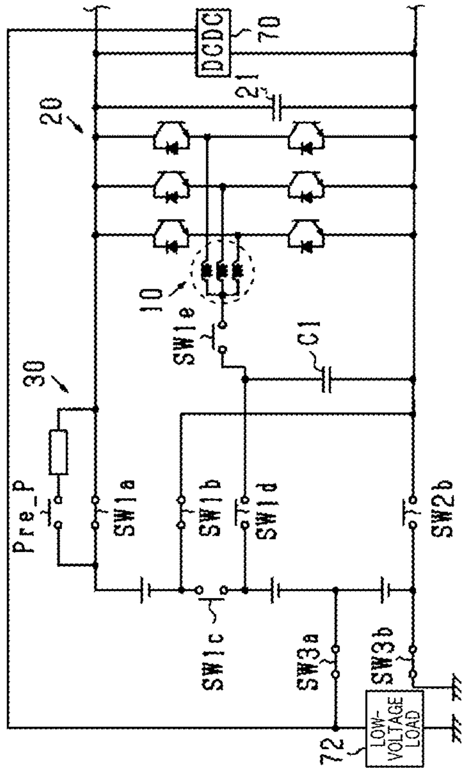
Figure 34E:
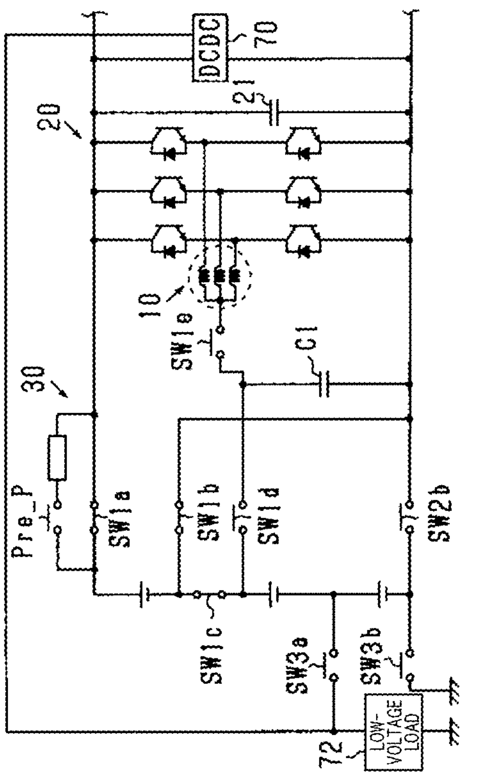
FIGS. 34(*e*), 34(*f*), 34(*g*), and 34(*h*) are views which represent a sequence of steps to change on- or off-states of switches in an in-vehicle system in the seventeenth modification.
Figure 34F:
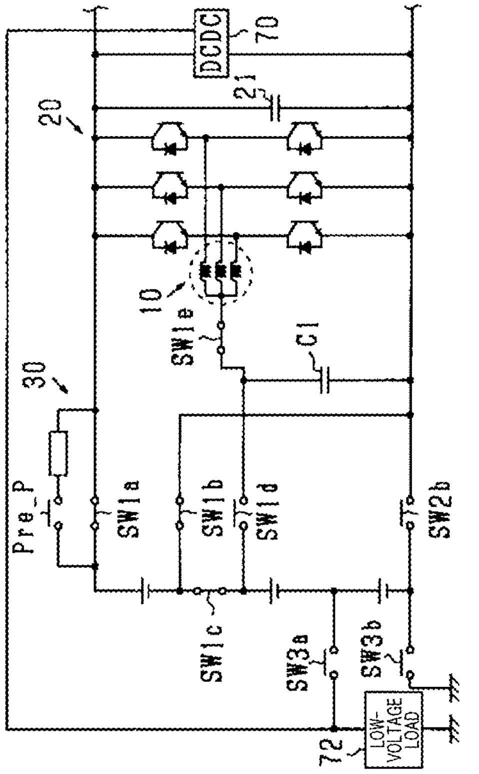
Figure 34G:
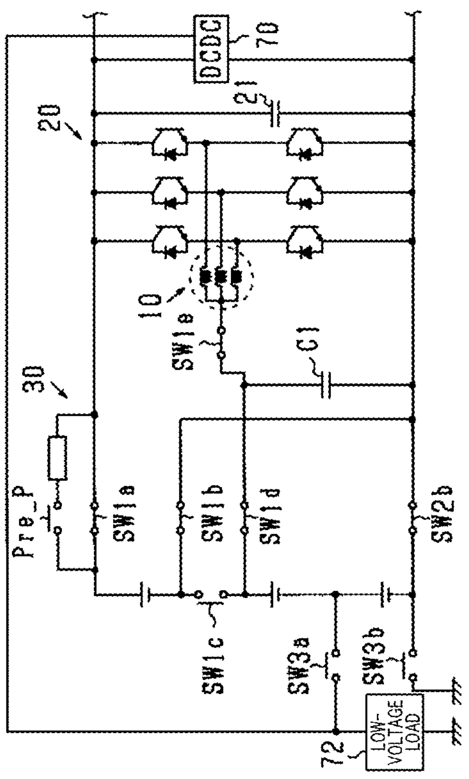
Figure 34H:
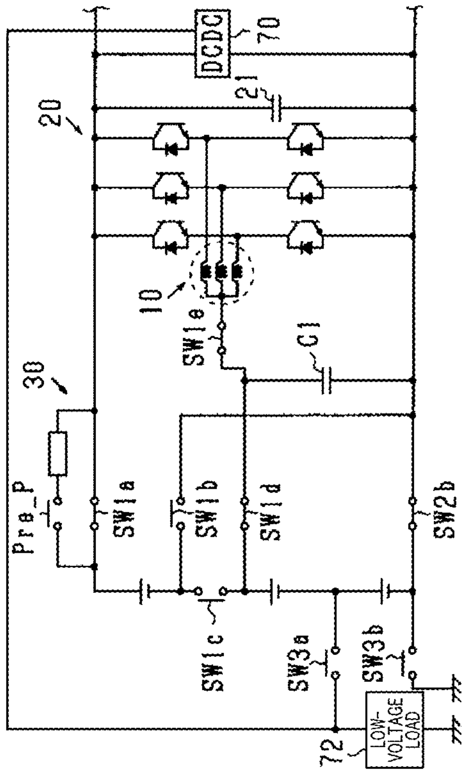

Subsequently, the controller 100, as illustrated in FIG. 32(*f*), turns off the first-A switch SW1*a* and the first-B switch SW1*b*. In this modification, the first switches include the first-A switch SW1*a* and the first-B switch SW1*b*. When turning off the first switches, the controller 100 diagnoses the first switches in the same way as described above. The controller 100, as illustrated in FIG. 32(*g*), control the operation of the inverter 20 to electrically discharge the in-inverter smoothing capacitor 21 and then completes the switching operation of the first switches to enter the vehicle-stop mode.

Seventeenth Modification

The seventeenth modification is designed not to have the second-A switch SW2*a* and different from the above-described embodiment in a sequence of on- and off-operations of the switches SW. FIGS. 33(*a*) to 35(*j*) demonstrate the sequence of on- and off-operations of the switches SW when the vehicle is changed from the stopped state to the activated state. When the vehicle is stopped, that is, before the vehicle is activated, the switches SW are placed in on- and off-states illustrated in FIG. 33(*a*). Specifically, the third switches are turned on.

When the vehicle is activated from the stopped state, the switches SW are changed to the on- and off-state demonstrated in FIG. 33(*b*). Specifically, the controller 100 turns on the pre-charge switch Pre_P and the first-B switch SW1*b* and electrically charges the in-inverter smoothing capacitor 21 until a terminal voltage at the in-inverter smoothing capacitor 21 reaches that at the first storage battery 31.

After completion of the charging of the in-inverter smoothing capacitor 21, the switches SW are changed to on- and off-states demonstrated in FIGS. 23(*c*) to 33(*d*). Specifically, the controller 100 turns on the first-A switch SW1*a* and then turns off the pre-charge switch Pre_P. When turning on the first switches, the controller 100 diagnoses the first switches in the same way as in the first embodiment. After completion of the diagnosis, the controller 100 supplies a high-voltage power from the first storage battery 31 to the DC-to-DC converter 70. The DC-to-DC converter 70 then steps-down the inputted power and delivers it to the low-voltage load 72.

Subsequently, the controller 100, as illustrated in FIG. 34(*e*), turns off the third switches. When turning off the third switches, the controller 100 diagnoses the third switches in the same way as described in the above embodiments and modification. After completion of such diagnosis, the controller 100, as illustrated in FIG. 33(*f*), turns on the first-E switch SW1*e* and then controls the motor 10 and the inverter to step-up voltage delivered from the first storage battery 31 to electrically charge the neutral point-side smoothing capacitor C1. Specifically, the controller 100 charges the neutral point-side smoothing capacitor C1 until a terminal voltage at the neutral point-side smoothing capacitor C1 reaches a terminal voltage (212V) developed at the first series-connected assembly 40 made up of the second storage battery 32 and the third storage battery 33.

Subsequently, the controller 100, as illustrated in FIG. 34(*g*), turns on the first-D switch SW1*d* and the second-B switch SW2*b*. When turning on the first-D switch SW1*d* and the second-B switch SW2*b*, the controller 100 diagnoses the first-D switch SW1*d* or the second-B switch SW2*b* in a way described below.

How to diagnose the first-D switch SW1*d* and/or the second-B switch SW2*b* will be described below. When it is required to first turn on the first-D switch SW1*d* and then turn on the second-B switch SW2*b*, the controller 100 may analyze an output from one of the voltage sensors V1 and V2 and the current sensors A11 to A13 to diagnose malfunctions of the first-D switch SW1*d* and the second-B switch SW2*b*. FIGS. 36(*a*) and 36(*b*) demonstrate on- and off-state of the first-D switch SW1*d* and the second-B switch SW2*b* when they are properly operating. When outputs from the current sensors A11, A12, and A13 listed on the table of FIG. 36(*a*) are not detected, the controller 100 determines that the second-B switch SW2*b* is malfunctioning in the same way as described above. "Depending on INV" in the table indicates that a sensor output depends on how to control the operation of the inverter 20. It is, therefore, preferable that the inverter 20 is controlled to output voltage or current which results in sensor output varying with a change in operation of the switches SW from the on-state to the off-state or vice versa.

The controller 100 may first turn on the second-B switch SW2*b* and then turn on the first-D switch SW1*d* to diagnose them. FIGS. 37(*a*) and 37(*b*) show on- and off-states of the first-D switch SW1*d* and the second-B switch SW2*b* when they are properly operating and corresponding sensor outputs. When sensor outputs listed on the table of FIG. 36(*b*), the controller 100 determines that the first-D switch SW1*d* is malfunctioning.

The controller 100 may use an output from the fourth voltage sensor V14, as discussed in the eighth modification, for the diagnosis task. FIG. 37(*a*) shows on- and off-states of the first-D switch SW1*d* and the second-B switch SW2*b* and corresponding sensor outputs when the first-D switch SW1*d* and the second-B switch SW2*b* are properly operating, and turned on in this order. The output from the fourth voltage sensor V14 may be used, as can be seen in FIG. 37(*a*), to diagnose malfunctions of the first-D switch SW1*d* and the second-B switch SW2*b*. The diagnosis of the first-D switch SW1*d* and the second-B switch SW2*b* may be achieved in the same way as described in the eighth modification.

FIG. 37(*b*) shows on- and off-states of the second-B switch SW2*b* and the first-D switch SW1*d* and corresponding sensor outputs when the second-B switch SW2*b* and the first-D switch SW1*d* are properly operating, and turned on in this order. It is, as described already in the eighth modification and can be seen in FIG. 37(*b*), impossible to use only an output from the fourth voltage sensor V14 to diagnose malfunctions of the first-D switch SW1*d* and the second-B switch SW2*b*. It is, therefore, possible to diagnose the first-D switch SW1*d* and the second-B switch SW2*b*, as described above, using an output from the fourth voltage sensor V14 and an output from at least one of the voltage sensors V1 and V2 and the current sensors A11 to A13 regardless of a sequence of the on- and off-operations of the first-D switch SW1*d* and the second-B switch SW2*b*.

After completion of the above diagnosis, the controller 100, as shown in FIG. 34(*h*), turns off the first-B switch SW1*b* and steps-up voltage supplied from the first series-connected assembly 40 using the motor 10 and the inverter 20 to electrically charge the in-inverter smoothing capacitor 21 until a terminal voltage at the in-inverter smoothing capacitor 21 reaches a terminal voltage (612V) developed at the second series-connected assembly 50.

Figure 35J:
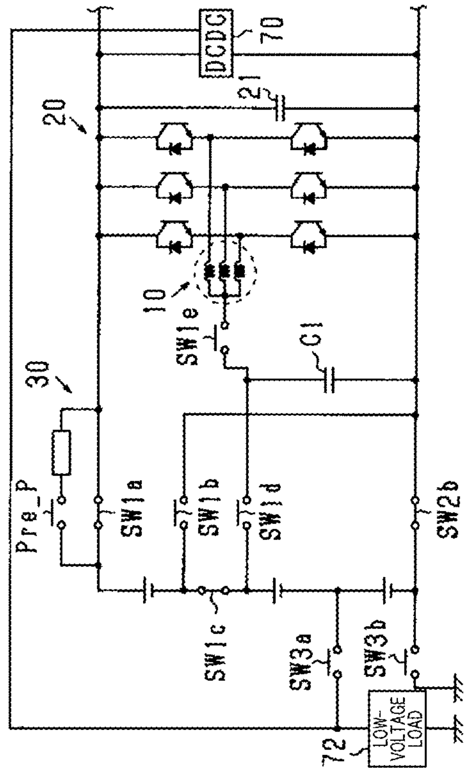
FIGS. 35(*i*) and 35(*j*) are views which represent a sequence of steps to change on- or off-states of switches in an in-vehicle system in the seventeenth modification.
Figure 35I:
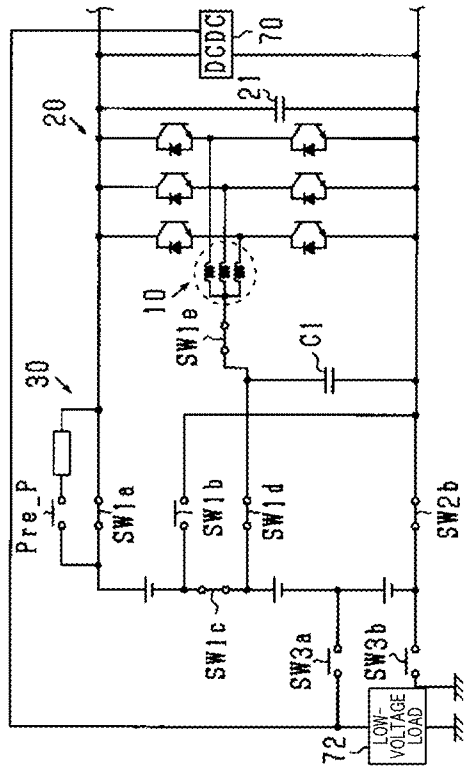
Figure 38A:
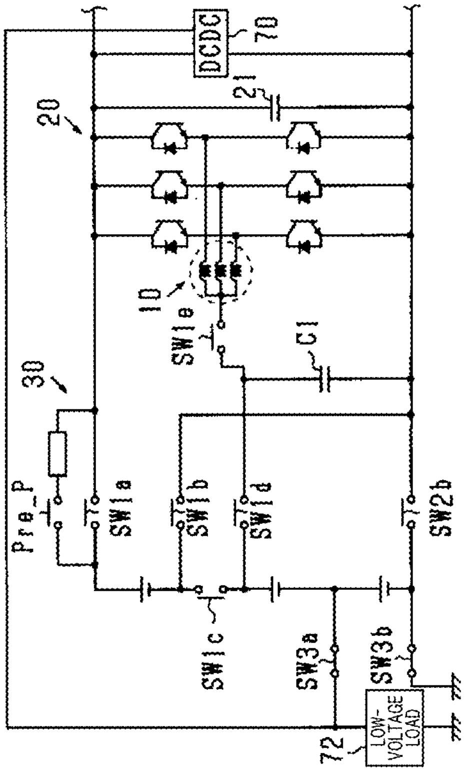
FIGS. 38(*a*), 38(*b*), 38(*c*), and 38(*d*) are views which represent a sequence of steps to change on- or off-states of switches in an in-vehicle system in the eighteenth modification.
Figure 38B:
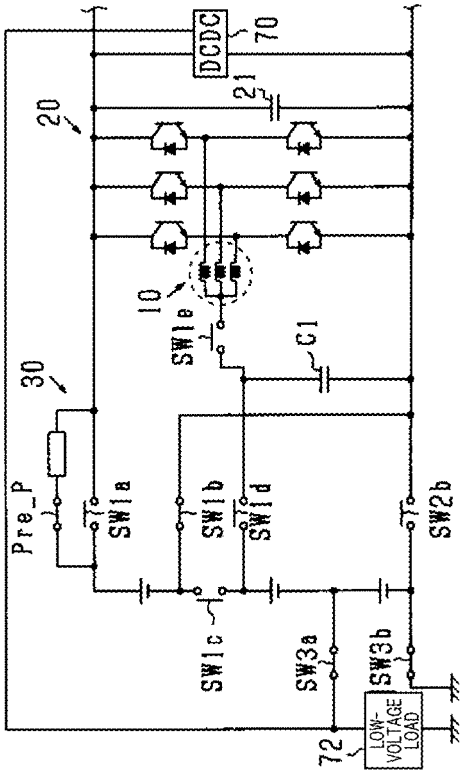
Figure 38C:
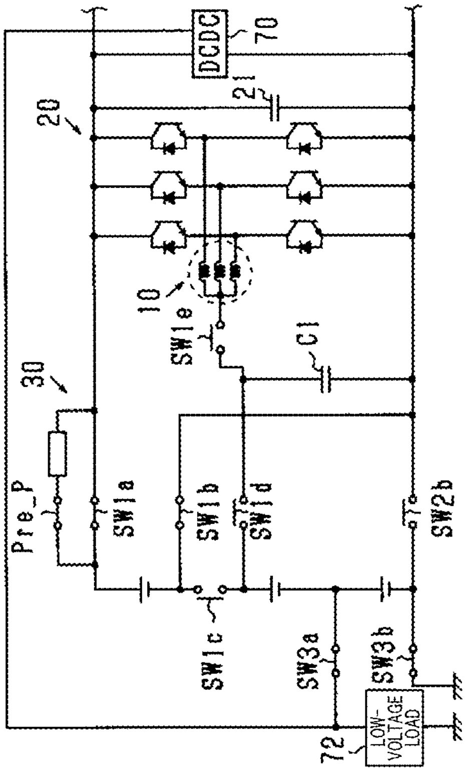
Figure 38D:
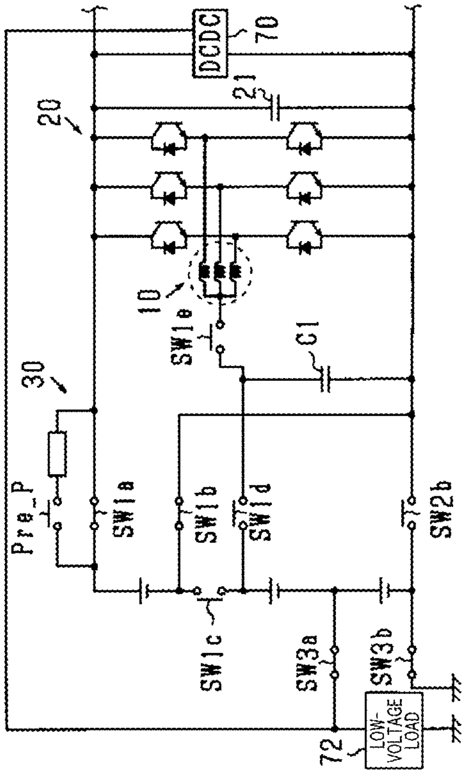
Figure 39E:
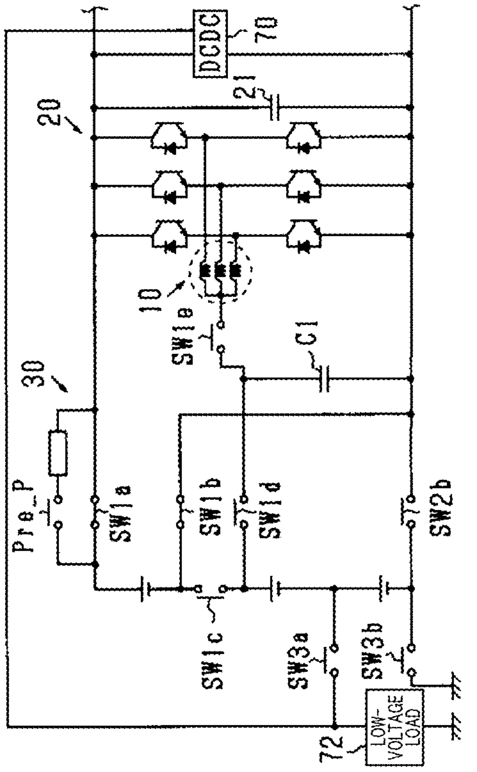
FIGS. 39(*e*), 39(*f*), 39(*g*), and 39(*h*) are views which represent a sequence of steps to change on- or off-states of switches in an in-vehicle system in the eighteenth modification.
Figure 39F:
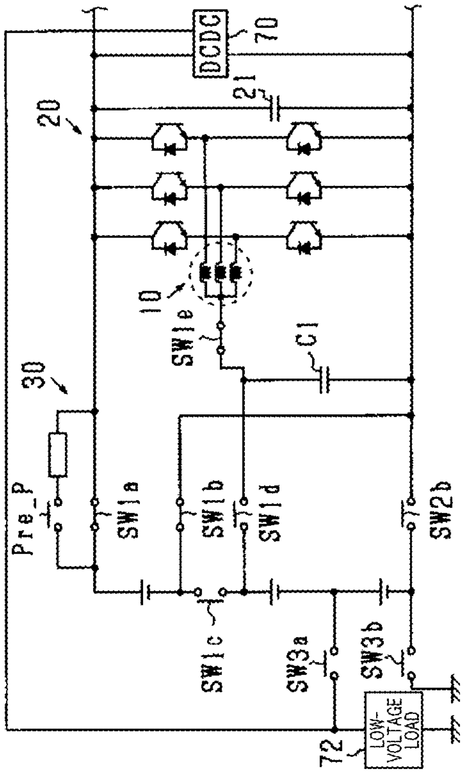
Figure 39G:
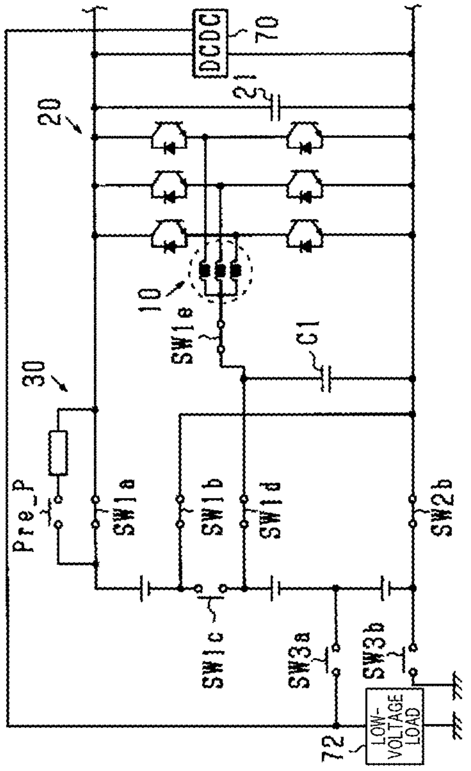
Figure 39H:
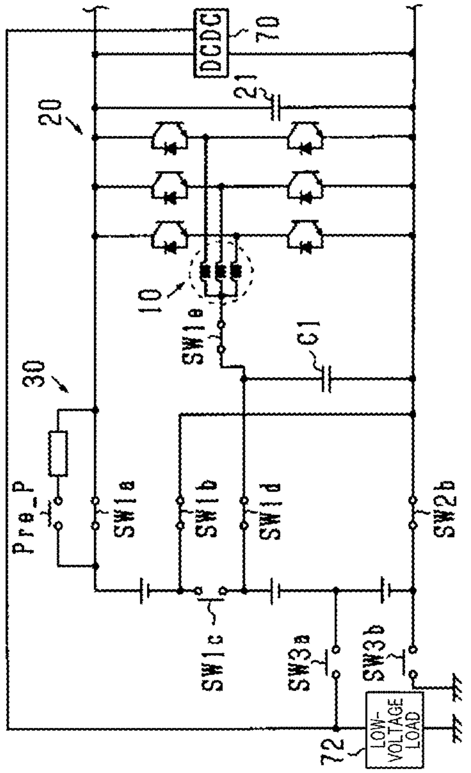

Afterwards, the controller 100, as illustrated in FIG. 35(*i*), turns on the first-C switch SW1*c*. When turning on the first-C switch SW1*c*, the controller 100 determines whether an output from one of the first voltage sensor V1 and the current sensors A11 to A13 has changed properly to diagnose the first-C switch SW1*c*. Subsequently, the controller 100, as shown in FIG. 35(*j*), turns off the first-D switch SW1*d*, electrically discharges the neutral point-side smoothing capacitor C1, and turns off the first-E switch SW1*e*. This causes the first storage battery 31 to the third storage battery 33 to be connected in series with the high-voltage power supply line H1.

In this modification, the second switches include the first-C switch SW1*c* and the second-B switch SW2*b*. The neutral point connecting switch includes the first-C switch SW1*c*, the first-D switch SW1*d*, and the first-E switch SW1*e*.

Eighteenth Modification

The eighteenth modification is designed not to have the second-A switch SW2*a* and different from the above-described embodiments in a sequence of times the switches SW are turned on or off. The sequence of times the switches SW are turned on or off when the vehicle is changed from the stopped state to the activated state will be described below with reference to FIGS. 38(*a*) to 40(*j*). When the vehicle is stopped, that is, before the vehicle is activated, the switches SW are placed in on- and off-states illustrated in FIG. 38(*a*). Specifically, the third switches are turned on.

When the vehicle is activated from the stopped state, the switches SW are changed to the on- and off-state demonstrated in FIG. 38(*b*). Specifically, the controller 100 turns on the pre-charge switch Pre_P and the first-B switch SW1*b* and electrically charges the in-inverter smoothing capacitor 21 until a terminal voltage at the in-inverter smoothing capacitor 21 reaches that at the first storage battery 31.

After completion of the charging of the in-inverter smoothing capacitor 21, the switches SW are changed to on- and off-states demonstrated in FIGS. 38(*c*) to 38(*d*). Specifically, the controller 100 turns on the first-A switch SW1*a* and then turns off the pre-charge switch Pre_P. When turning on the first switches, the controller 100 diagnoses the first switches in the same way as in the first embodiment. After completion of the diagnosis, the controller 100 supplies a high-voltage power from the first storage battery 31 to the DC-to-DC converter 70. The DC-to-DC converter 70 then steps-down the inputted power and delivers it to the low-voltage load 72.

Subsequently, the controller 100, as illustrated in FIG. 39(*e*), turns off the third switches. When turning off the third switches, the controller 100 diagnoses the third switches in the same way as described in the above embodiments and modification. After completion of such diagnosis, the controller 100, as illustrated in FIG. 39(*f*), turns on the first-E switch SW1*e*. Subsequently, the controller 100 controls the operations of the motor 10 and the inverter 20 to electrically charge the neutral point-side smoothing capacitor C1. Specifically, the controller 100 charges the neutral point-side smoothing capacitor C1 until a terminal voltage at the neutral point-side smoothing capacitor C1 reaches a terminal voltage (212V) developed at the first series-connected assembly 40 made up of the second storage battery 32 and the third storage battery 33.

Subsequently, the controller 100, as illustrated in FIG. 39(*g*), turns on the first-D switch SW1*d* and the second-B switch SW2*b*. When turning on the first-D switch SW1*d* and the second-B switch SW2*b*, the controller 100 diagnoses the first-D switch SW1*d* or the second-B switch SW2*b* in the same way as in the above-described seventeenth modification.

After completion of the above diagnosis, the controller 100, as shown in FIG. 39(*h*), steps up voltage supplied from the first series-connected assembly 40 using the motor 10 and the inverter 20 to electrically charge the in-inverter smoothing capacitor 21. The in-inverter smoothing capacitor 21 is charged until a terminal voltage thereat reaches a terminal voltage (612V) developed at the second series-connected assembly 50.

Figure 40I:
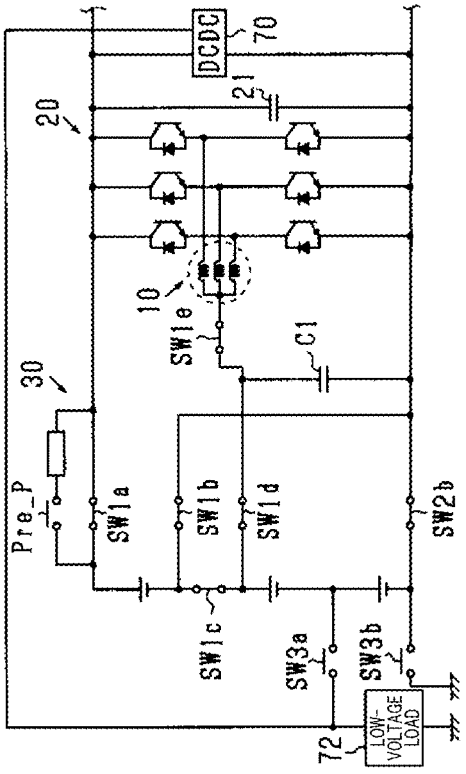
FIGS. 40(*i*) and 40(*j*) are views which represent a sequence of steps to change on- or off-states of switches in an in-vehicle system in the eighteenth modification.
Figure 40J:
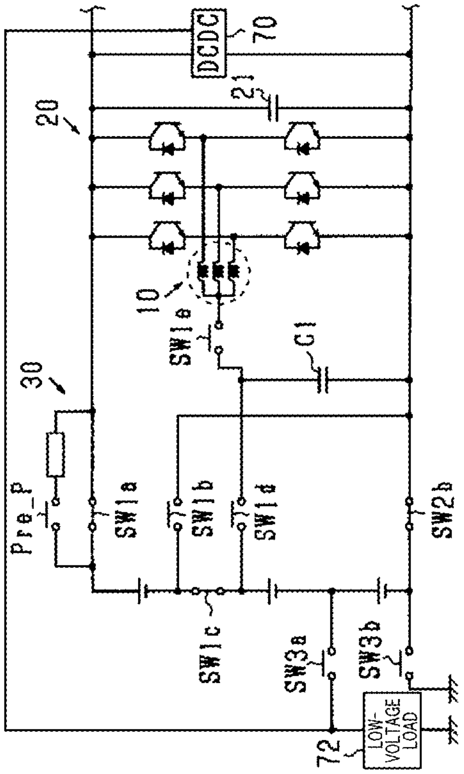
Figure 41A:
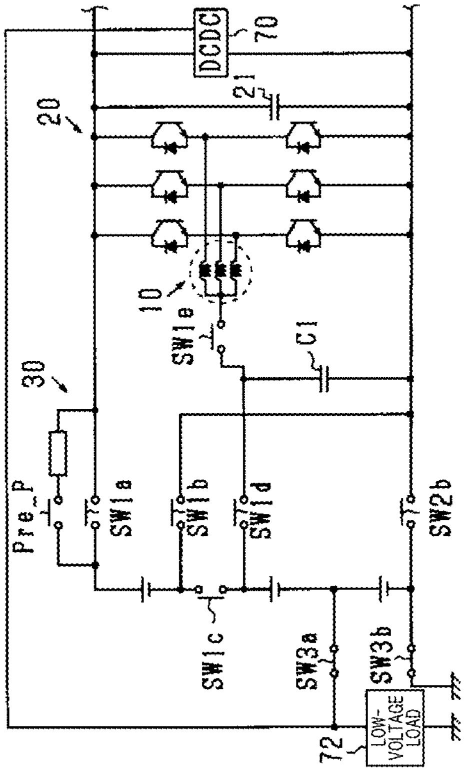
FIGS. 41(*a*), 41(*b*), 41(*c*), and 41(*d*) are views which represent a sequence of steps to change on- or off-states of switches in an in-vehicle system in the nineteenth modification.
Figure 41B:
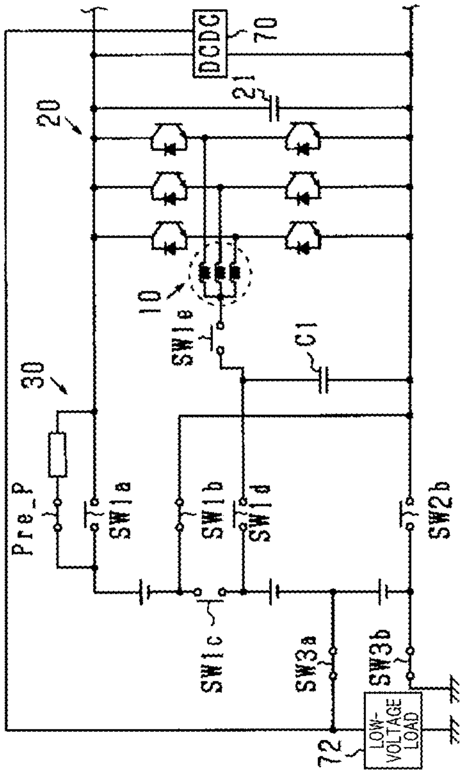
Figure 41C:
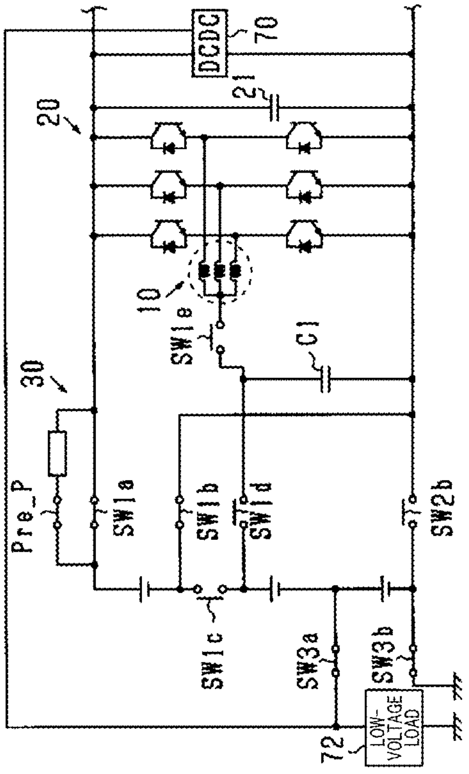
Figure 41D:
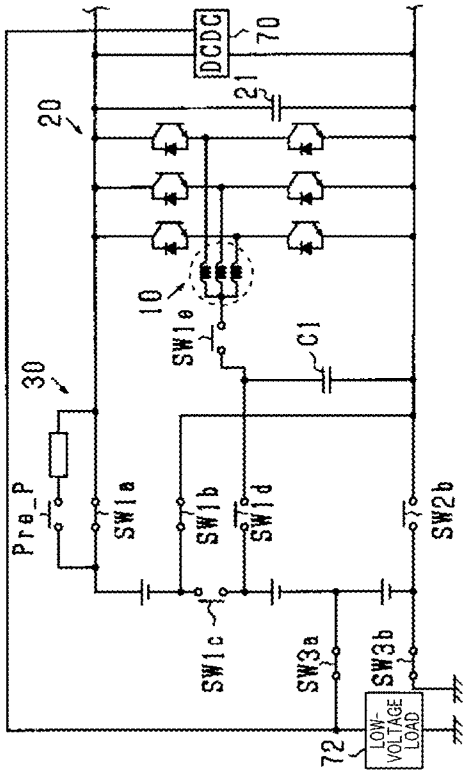

Afterwards, the controller 100, as illustrated in FIG. 40(*i*), turns on the first-C switch SW1*c*. When turning on the first-C switch SW1*c*, the controller 100 determines whether an output from one of the first voltage sensor V1 and the current sensors A11 to A13 has changed properly to diagnose the first-C switch SW1*c*. subsequently, the controller 100, as shown in FIG. 40(*j*), turns off the first-D switch SW1*d*, electrically discharges the neutral point-side smoothing capacitor C1, and turns off the first-E switch SW1*e*. This causes the first storage battery 31 to the third storage battery 33 to be connected in series with the high-voltage power supply line H1.

In this modification, the second switches include the first-C switch SW1*c* and the second-B switch SW2*b*. The neutral point connecting switch includes the first-C switch SW1*c*, the first-D switch SW1*d*, and the first-E switch SW1*e*.

NINETEENTH MODIFICATION

The nineteenth modification is designed not to have the second-A switch SW2*a* and different from the above-described embodiments in a sequence of on- and off-operations of the switches SW. The sequence of the on- and off-operations when the vehicle is changed from the stopped state to the activated state will be described below with reference to FIGS. 41(*a*) to 42(*g*). When the vehicle is stopped, that is, before the vehicle is activated, the switches SW are placed in on- and off-states illustrated in FIG. 41(*a*). Specifically, the third switches are turned on.

When the vehicle is activated from the stopped state, the switches SW are changed to the on- and off-state demonstrated in FIG. 41(*b*). Specifically, the controller 100 turns on the pre-charge switch Pre_P and the first-B switch SW1*b* and electrically charges the in-inverter smoothing capacitor 21 until a terminal voltage at the in-inverter smoothing capacitor 21 reaches that at the first storage battery 31.

After completion of the charging of the in-inverter smoothing capacitor 21, the switches SW are changed to on- and off-states demonstrated in FIGS. 41(*c*) to 41(*d*). Specifically, the controller 100 turns on the first-A switch SW1*a* and then turns off the pre-charge switch Pre_P. When turning on the first switches, the controller 100 diagnoses the first switches in the same way as in the first embodiment. After completion of the diagnosis, the controller 100 supplies a high-voltage power from the first storage battery 31 to the DC-to-DC converter 70. The DC-to-DC converter 70 then steps-down the inputted power and delivers it to the low-voltage load 72.

Figure 42F:
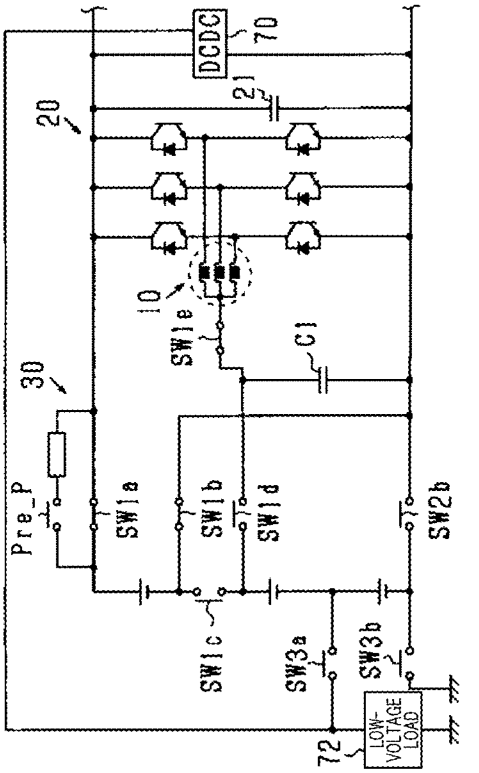
FIGS. 42(*e*), 42(*f*), 42(*g*) are views which represent a sequence of steps to change on- or off-states of switches in an in-vehicle system in the nineteenth modification.
Figure 42E:
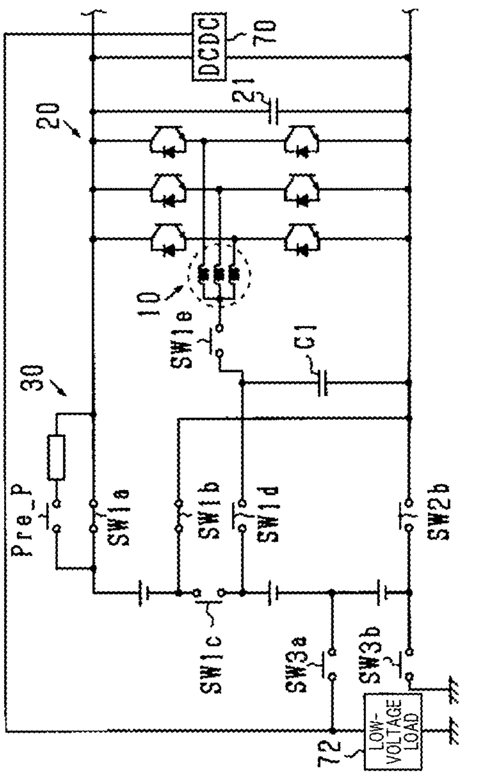
Figure 42G:
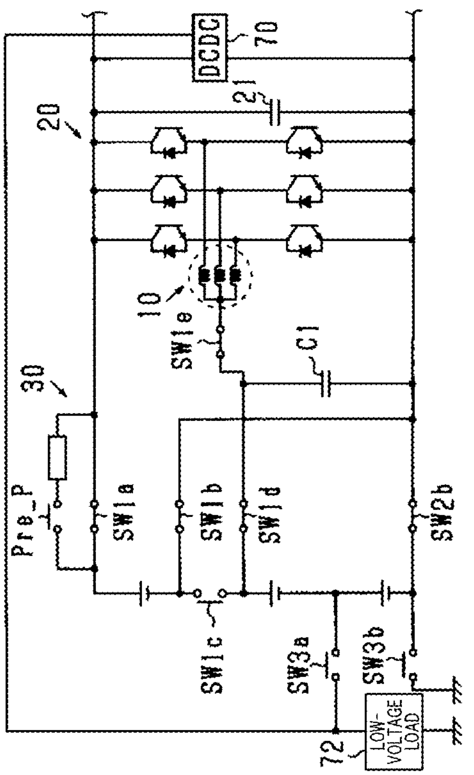
Figure 43A:
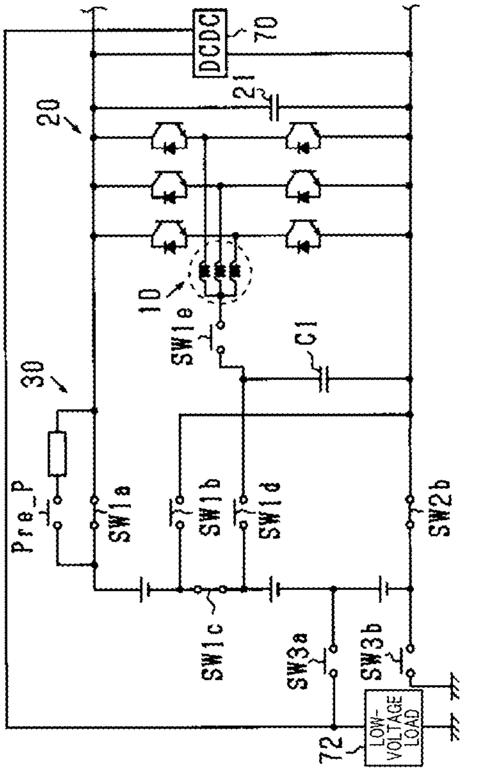
FIGS. 43(*a*), 43(*b*), 43(*c*), and 43(*d*) are views which represent a sequence of steps to change on- or off-states of switches in an in-vehicle system in the twenties modification.
Figure 43B:
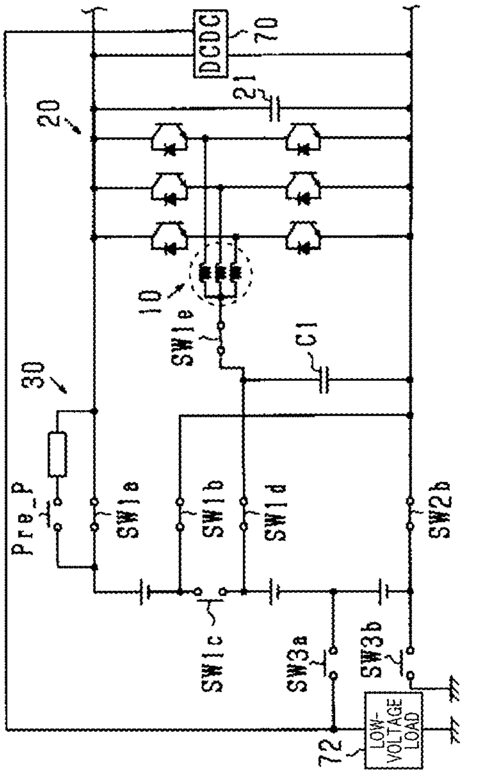
Figure 43C:
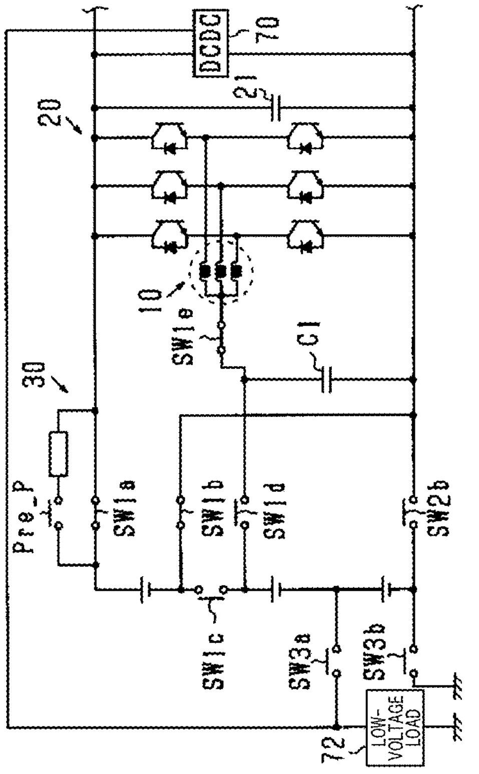
Figure 43D:
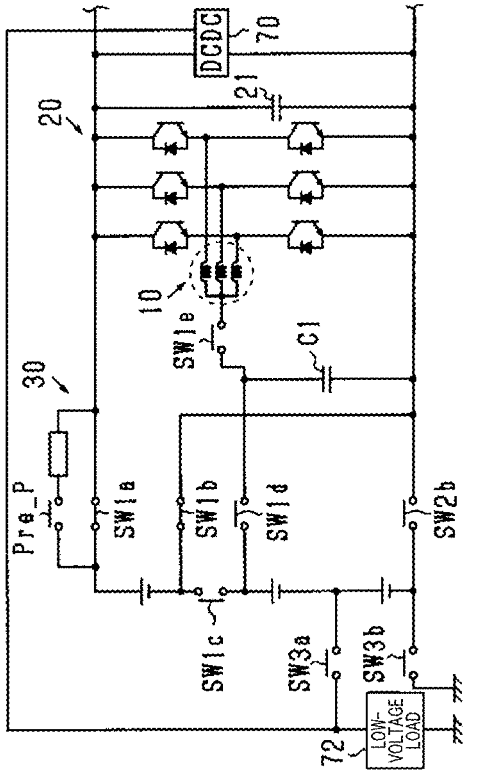
Figure 44E:
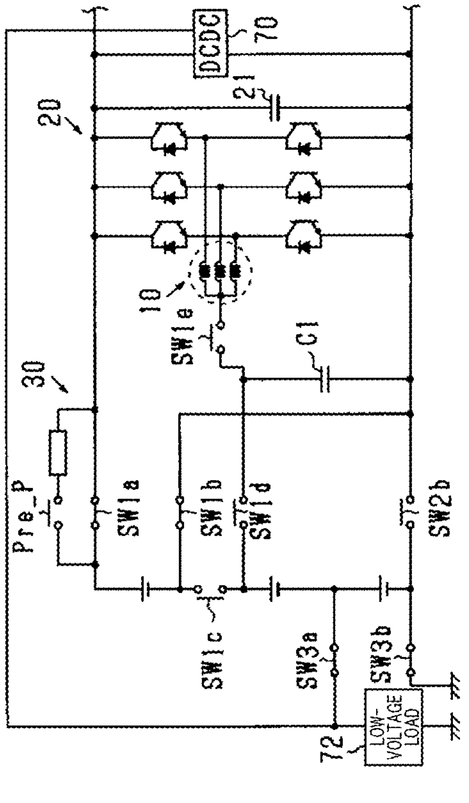
FIGS. 44(*e*), 44(*f*), 44(*g*), and 44(*h*) are views which represent a sequence of steps to change on- or off-states of switches in an in-vehicle system in the twenties modification.
Figure 44F:
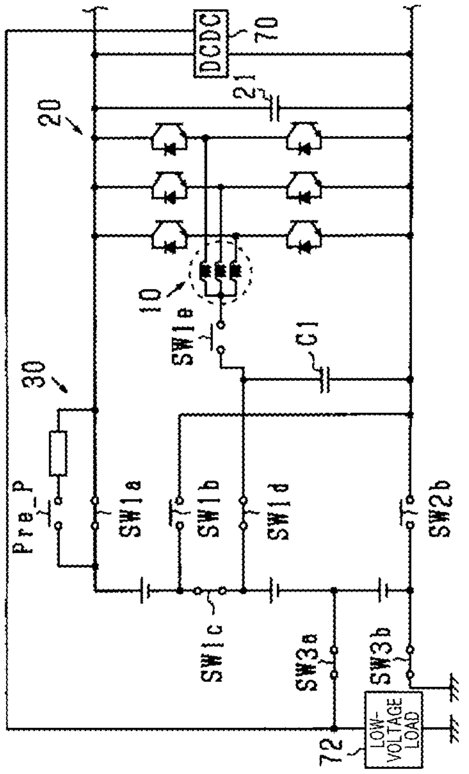
Figure 44G:
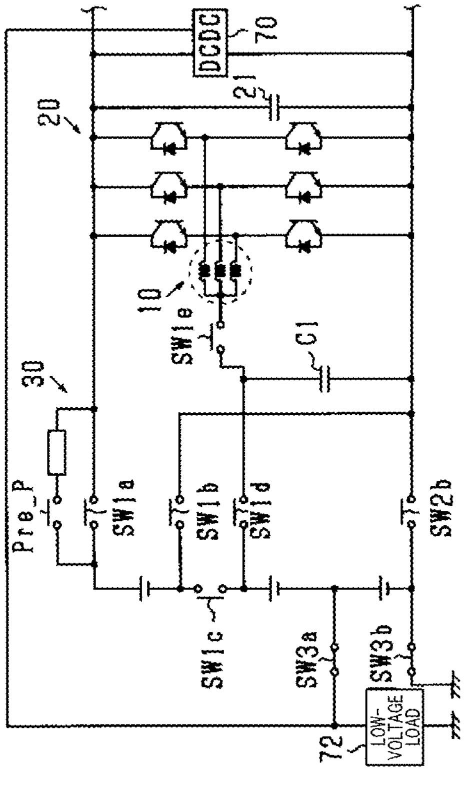
Figure 44H:
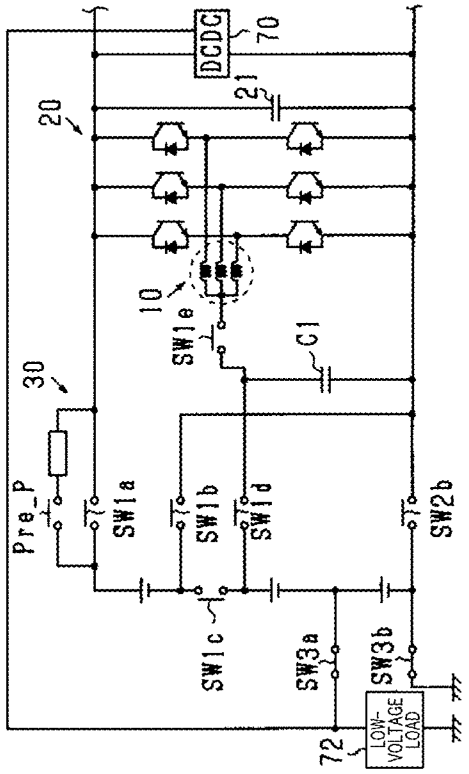
Figure 45A:
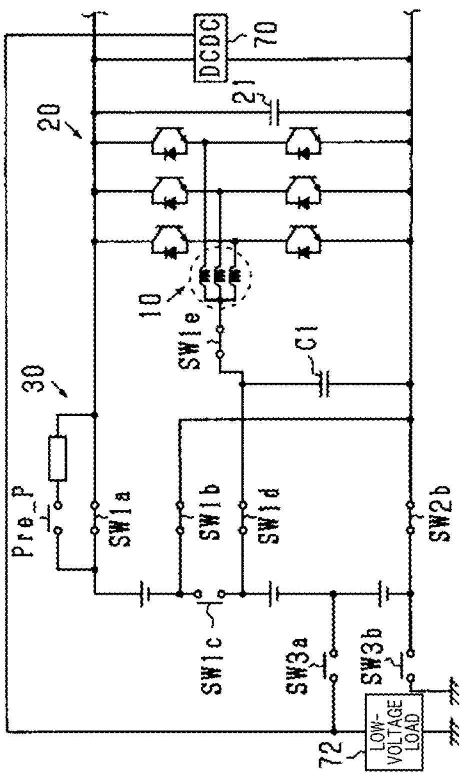
FIGS. 45(*a*), 45(*b*), 45(*c*), and 45(*d*) are views which represent a sequence of steps to change on- or off-states of switches in an in-vehicle system in the twenty-first modification.
Figure 45B:
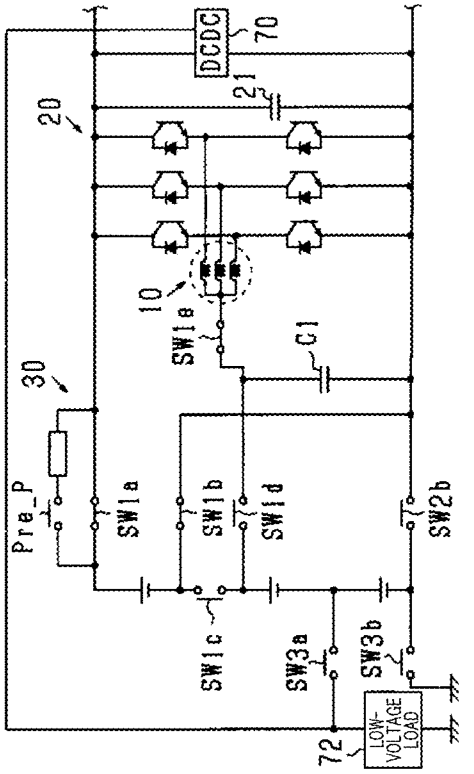
Figure 45C:
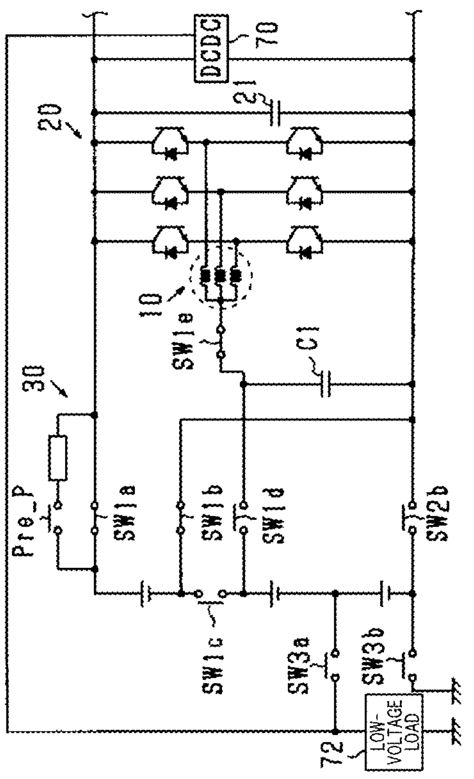
Figure 45D:
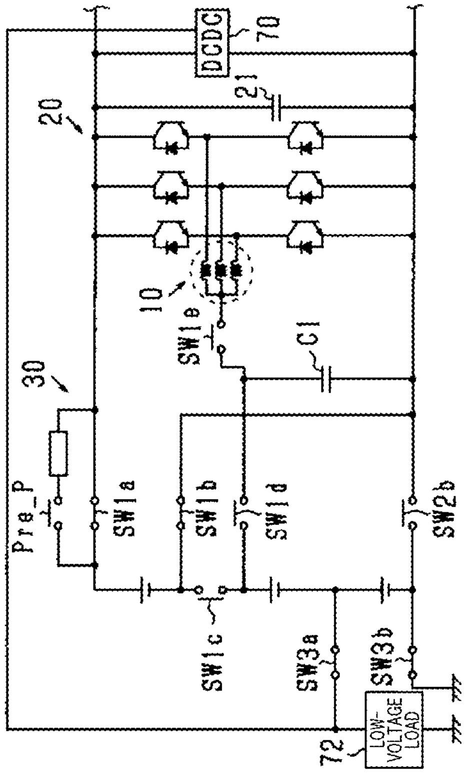

Subsequently, the controller 100, as illustrated in FIG. 42(*e*), turns off the third switches. When turning off the third switches, the controller 100 diagnoses the third switches in the same way as described in the above embodiments and modification. After completion of such diagnosis, the controller 100, as illustrated in FIG. 42(*f*), turns on the first-E switch SW1*e*. Subsequently, the controller 100 controls the operations of the motor 10 and the inverter 20 to step-down voltage supplied from the first storage battery 31 to electrically charge the neutral point-side smoothing capacitor C1. Specifically, the controller 100 charges the neutral point-side smoothing capacitor C1 until a terminal voltage at the neutral point-side smoothing capacitor C1 reaches a terminal voltage (212V) at developed the first series-connected assembly 40 made up of the second storage battery 32 and the third storage battery 33.

Afterwards, the controller 100, as illustrated in FIG. 42(*g*), turns on the first-D switch SW1*d* and the second-B switch SW2*b*. When turning on the first-D switch SW1*d* and the second-B switch SW2*b*, the controller 100 diagnoses malfunctions of the first-D switch SW1*d* and the second-B switch SW2*b* in the same way as in the above-described seventeenth modification.

After completion of the above diagnosis, the controller 100 steps up voltage, as supplied from the first series-connected assembly 40, using the motor 10 and the inverter 20 until the voltage is raised to be substantially equal to a terminal voltage developed at the first storage battery 31 and delivers it to the high-voltage power supply line H1. With the above switching operation, the first storage battery 31 and the first series-connected assembly 40 are connected in parallel to the high-voltage power supply line H1.

In this modification, the second switches include the first-C switch SW1*c* and the second-B switch SW2*b*. The neutral point connecting switch includes the first-C switch SW1*c*, the first-D switch SW1*d*, and the first-E switch SW1*e*.

Twentieth Modification

The twentieth modification is designed not to have the second-A switch SW2*a* and different from the above-described embodiments in a sequence of on- and off-operations of the switches SW. The sequence of the on- and off-operations when the vehicle is changed from the activated state to the stopped state will be described below with reference to FIGS. 43(*a*) to 44(*h*). When the vehicle is being activated, that is, before the vehicle is stopped, the switches SW are placed in on- and off-states illustrated in FIG. 43(*a*). The first-A switch SW1*a* and the second-B switch SW2*b* are turned on to create an electrical connection of the storage batteries 31 to 33 in series with the high-voltage power supply line H1.

When the vehicle is stopped from the activated state, the controller 100, as shown in FIG. 43(*b*), turns on the first-E switch SW1*e* to operate the inverter 20 to step-down input voltage to electrically charge the neutral point-side smoothing capacitor C1 until a terminal voltage at the neutral point-side smoothing capacitor C1 reaches 212V. After completion of the charging of the neutral point-side smoothing capacitor C1, the controller 100 turns on the first-D switch SW1*d* to step-up voltage from the first storage battery 31 to deliver it to the in-inverter smoothing capacitor 21.

Afterwards, the controller 100 turns off the first-C switch SW1*c* to step-down a terminal voltage at the in-inverter smoothing capacitor 21 until it reaches 400V. Subsequently, the controller 100 turns on the first-B switch SW1*b*. When turning on the first-B switch SW1*b*, the controller 100 diagnoses the first-B switch SW1*b*, the first-C switch SW1*c*, and the first-D switch SW1*d* in the same way as described above.

Subsequently, the controller 100, as shown in FIG. 43(*c*), turns off the first-D switch SW1*d* and the second-B switch SW2*b*. When turning off the first-D switch SW1*d* and the second-B switch SW2*b*, the controller 100 diagnoses the first-D switch SW1*d* and the second-B switch SW2*b* in the same way as described above. The controller 100 activates the inverter 20 to electrically discharge the neutral point-side smoothing capacitor C1 and then, as shown in FIG. 43(*d*), turns off the first-E switch SW1*e*.

Subsequently, the controller 100, as shown in FIG. 44(*e*), turns on the third switches. When turning on the third switches, the controller 100 diagnoses the third switches in the same way as described above. The controller 100 then, as illustrated in FIG. 44(*f*), deactivates the DC-to-DC converter 70 to stop the supply of electrical power from the DC-to-DC converter 70 to the low-voltage load 72.

The controller 100, as illustrated in FIG. 44(*g*), turns off the first-A switch SW1*a* and the first-B switch SW1*b*. When turning off the first-A switch SW1*a* and the first-B switch SW1*b*, the controller 100 diagnoses them in the same way as described above. Afterwards, the controller 100 activates the inverter 20 to electrically discharge the in-inverter smoothing capacitor 21. This causes the switches SW to be placed, as demonstrated in FIG. 44(*h*). The controller 100 then enters the stopped mode.

In this modification, the first switches include the first-A switch SW1*a* and the first-B switch SW1*b*. The second switches include the first-C switch SW1*c*, the first-D switch SW1*d*, and the second-B switch SW2*b*. The neutral point connecting switch includes the first-C switch SW1*c*, the first-D switch SW1*d*, and the first-E switch SW1*e*.

Twenty-First Modification

The twenty-first modification is designed not to have the second-A switch SW2*a* and different from the above-described embodiments in a sequence of on- and off-operations of the switches SW. The sequence of the on- and off-operations when the vehicle is changed from the activated state to the stopped state will be described below with reference to FIGS. 45(*a*) to 46(*g*). When the vehicle is being activated, that is, before the vehicle is stopped, the switches SW are placed in on- and off-states illustrated in FIG. 45(*a*). The first-A switch SW1*a*, the first-B switch SW1*b*, the first-D switch SW1*d*, the first-E switch SW1*e*, and the second-B switch SW2*b* are turned on. This creates electrical connection of the first storage battery 31 and the first series-connected assembly 40 in parallel to the high-voltage power supply line H1.

When the vehicle is stopped from the activated state, the controller 100, as shown in FIG. 45(*b*), turns off the first-D switch SW1*d* and the second-B switch SW2*b*. When turning off the first-D switch SW1*d* and the second-B switch SW2*b*, the controller 100 diagnoses them in the same way as described above. In this modification, the second switches include the first-C switch SW1*c*, the first-D switch SW1*d*, and the second-B switch SW2*b*.

The controller 100 electrically discharges the neutral point-side smoothing capacitor C1 using the inverter 20 in a state illustrated in FIG. 45(*c*). Subsequently, the controller 100, as shown in FIG. 45(*b*), turns on the third switches. When turning on the third switches, the controller 100 diagnoses the third switches in the same way as described above. Subsequently, the controller 100 deactivates the DC-to-DC converter 70 in a state illustrated in FIG. 46(*e*) to stop supply of electrical power from the DC-to-DC converter 70 to the low-voltage load 72.

Figure 46F:
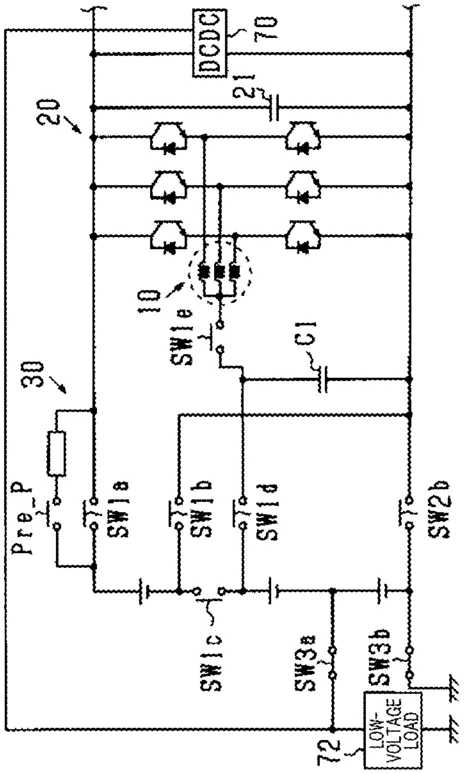
FIGS. 46(*e*), 46(*f*), 46(*g*) are views which represent a sequence of steps to change on- or off-states of switches in an in-vehicle system in the twenty-first modification.
Figure 46E:
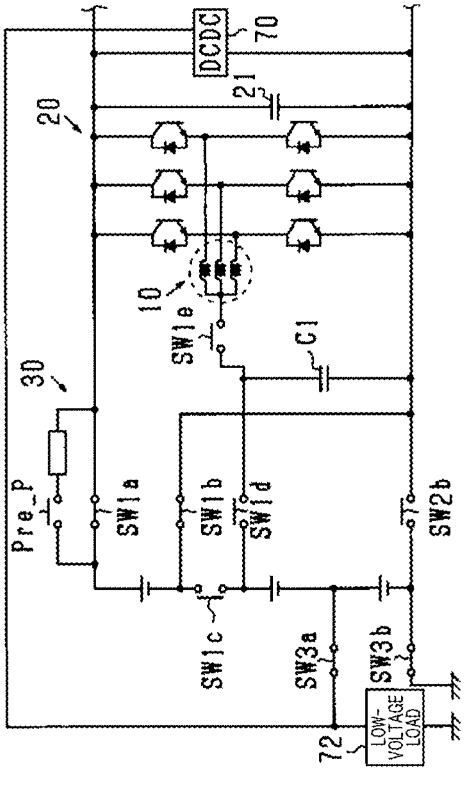
Figure 46G:
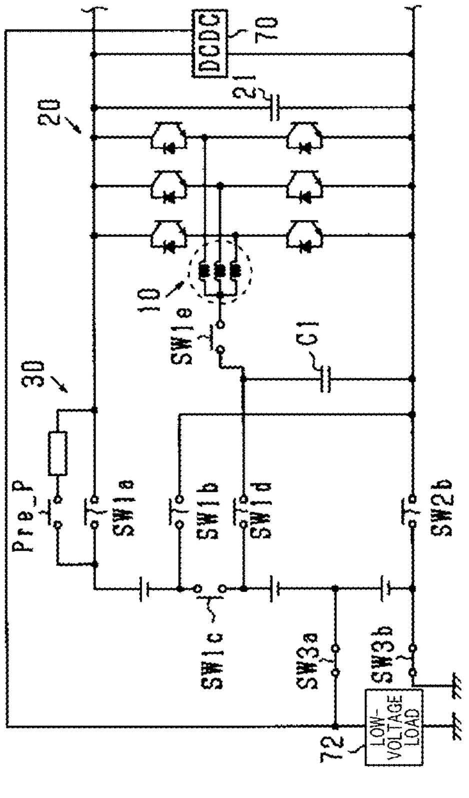
Figure 47:
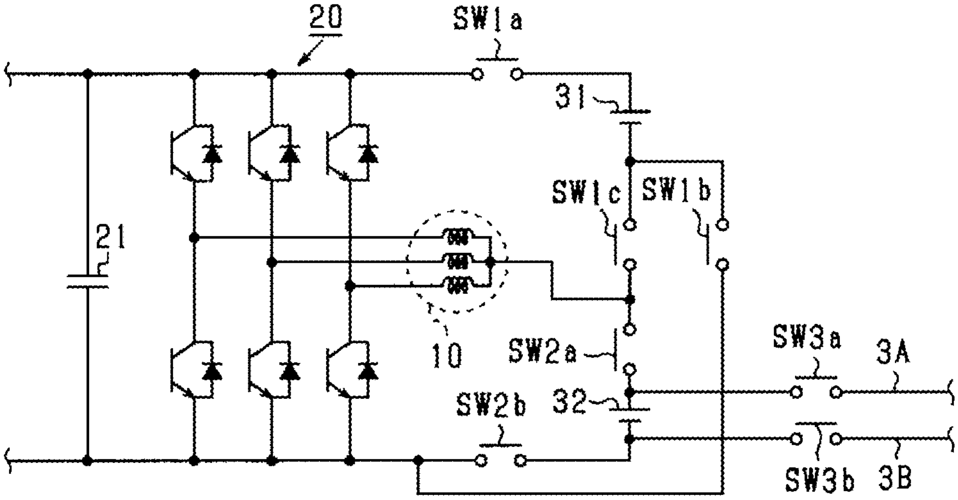
FIG. 47 is a circuit diagram which illustrates electrical connections of circuit components in a modified form of a power supply system.
Figure 48:
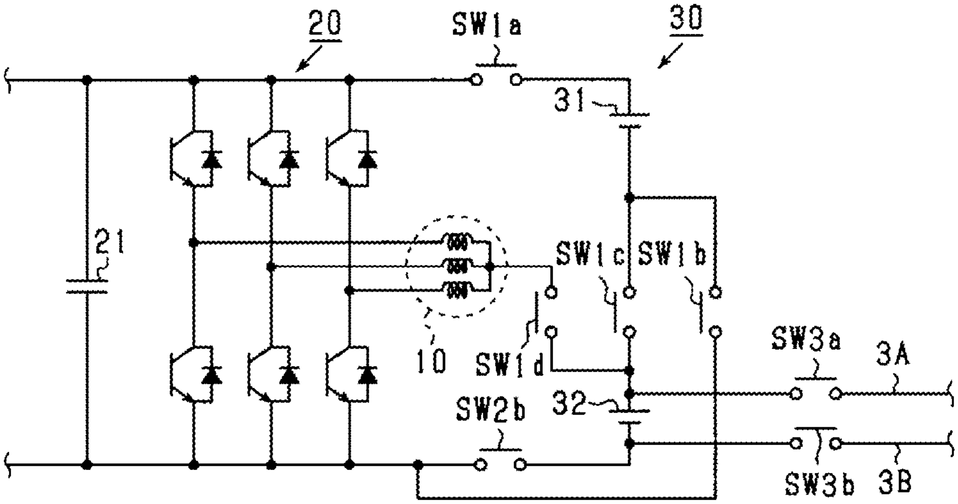
FIG. 48 is a circuit diagram which illustrates electrical connections of circuit components in a modified form of a power supply system.
Figure 49:
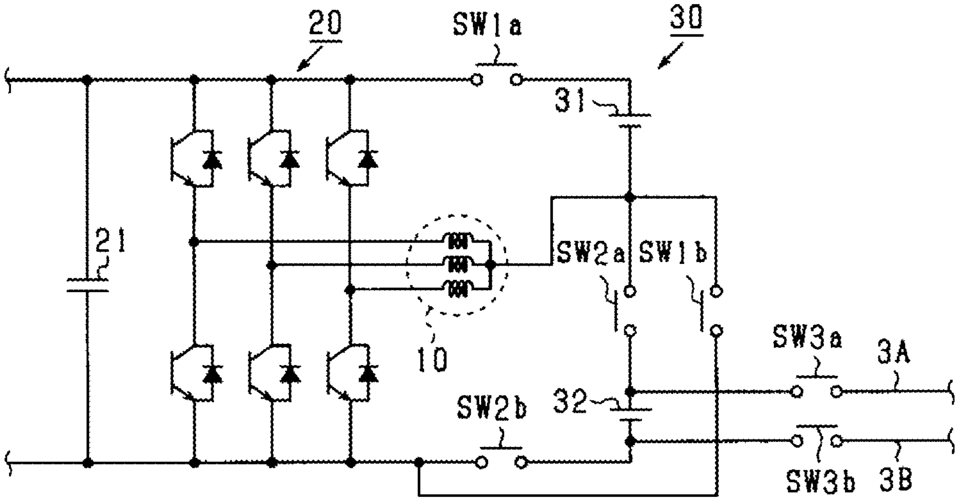
FIG. 49 is a circuit diagram which illustrates electrical connections of circuit components in a modified form of a power supply system.
Figure 50:
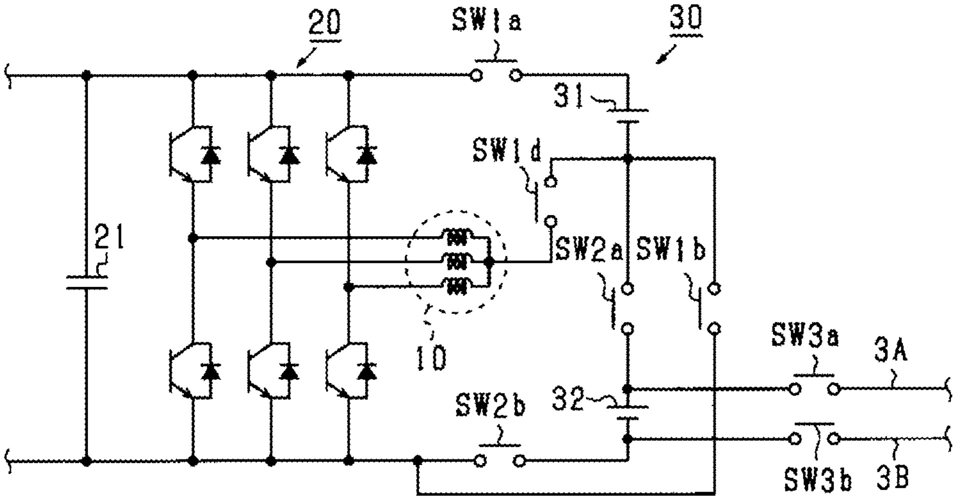
FIG. 50 is a circuit diagram which illustrates electrical connections of circuit components in a modified form of a power supply system.
Figure 51:
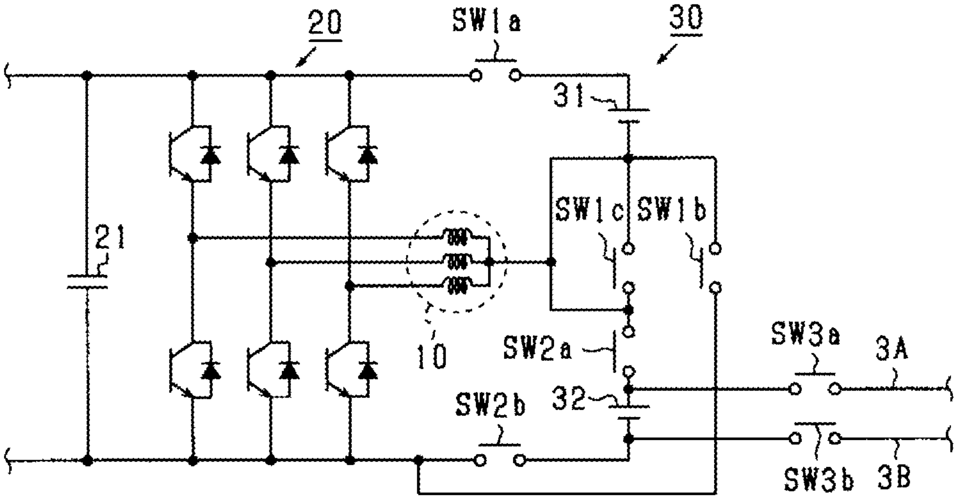
FIG. 51 is a circuit diagram which illustrates electrical connections of circuit components in a modified form of a power supply system.
Figure 52:
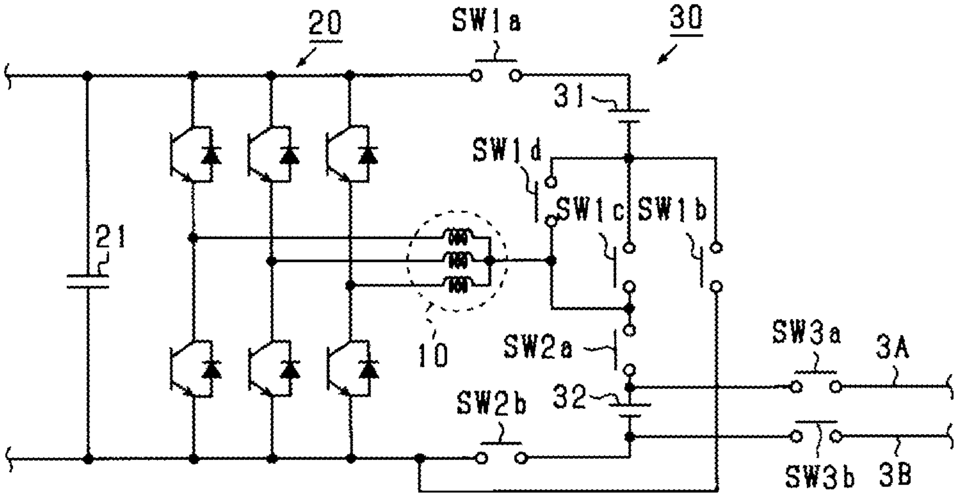
FIG. 52 is a circuit diagram which illustrates electrical connections of circuit components in a modified form of a power supply system.
Figure 53:
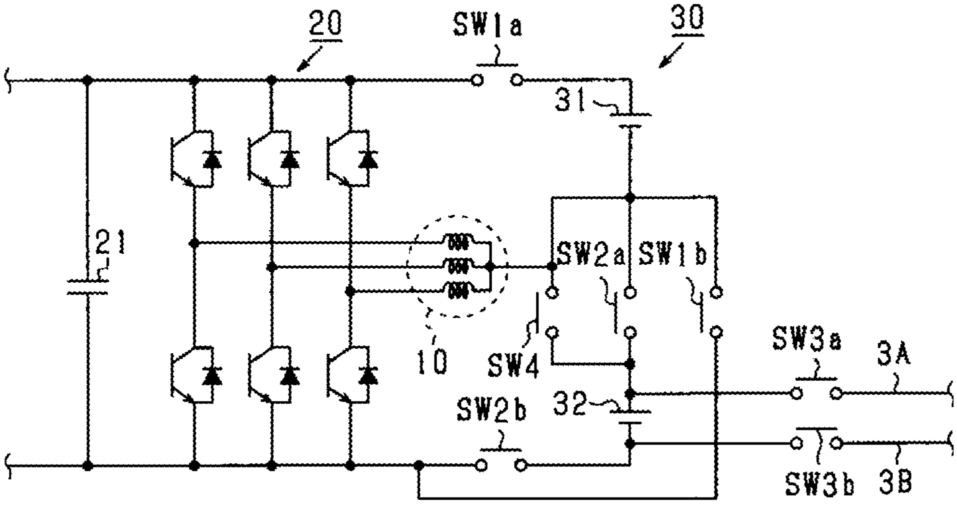
FIG. 53 is a circuit diagram which illustrates electrical connections of circuit components in a modified form of a power supply system.
Figure 54:
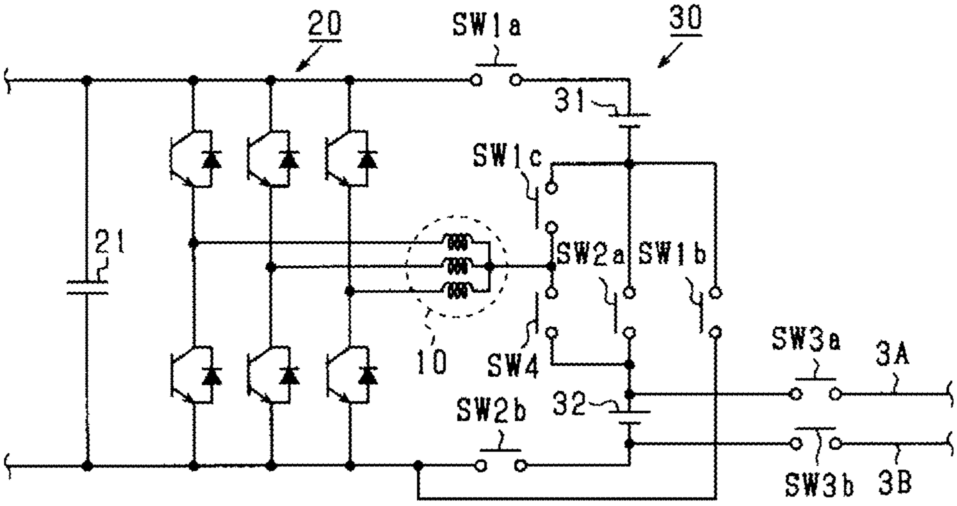
FIG. 54 is a circuit diagram which illustrates electrical connections of circuit components in a modified form of a power supply system.
Figure 55:
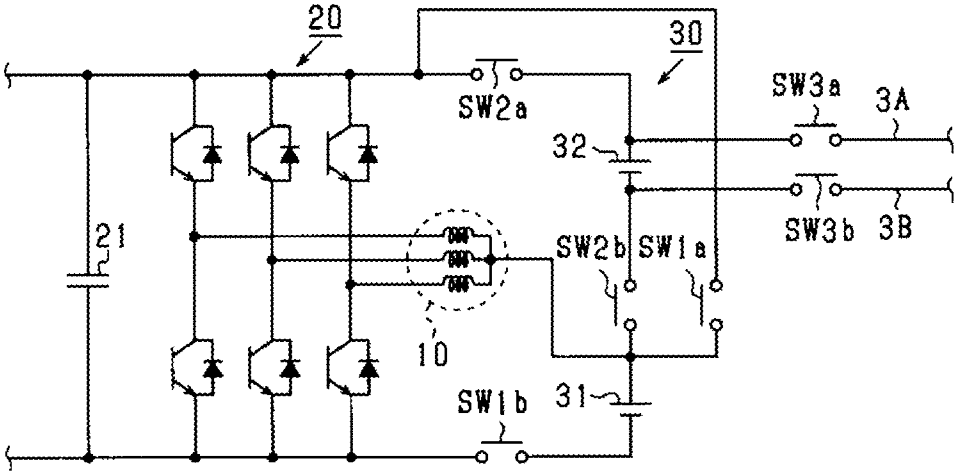
FIG. 55 is a circuit diagram which illustrates electrical connections of circuit components in a modified form of a power supply system.
Figure 56:
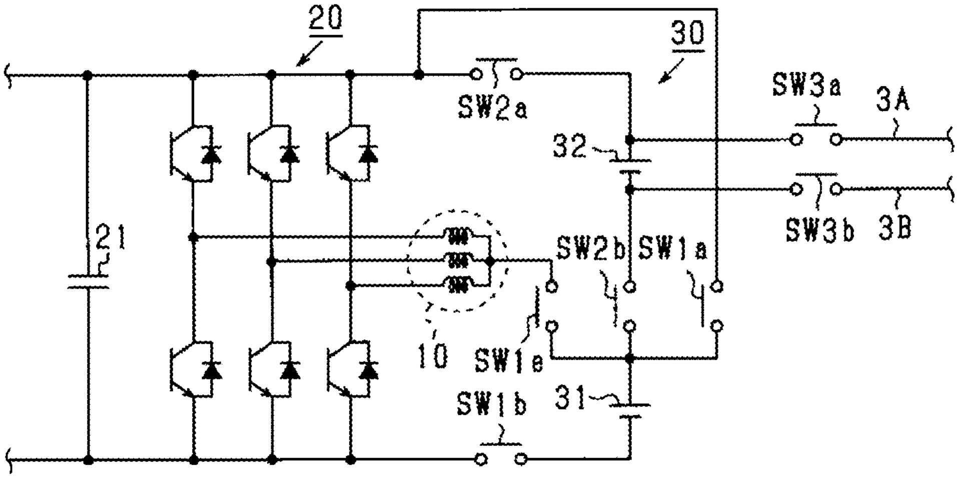
FIG. 56 is a circuit diagram which illustrates electrical connections of circuit components in a modified form of a power supply system.
Figure 57:
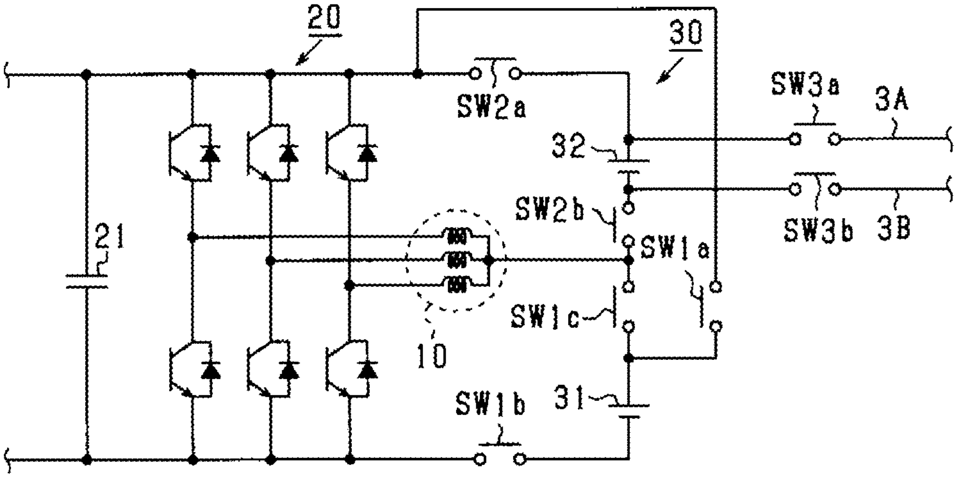
FIG. 57 is a circuit diagram which illustrates electrical connections of circuit components in a modified form of a power supply system.
Figure 58:
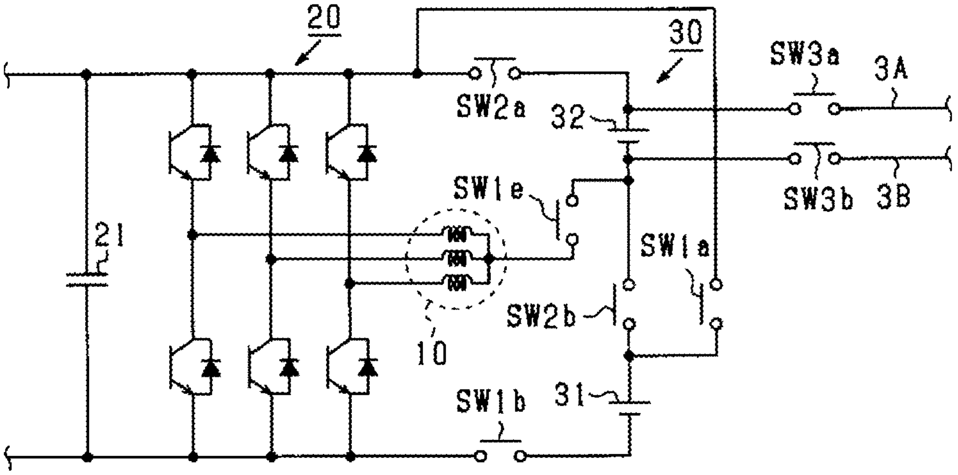
FIG. 58 is a circuit diagram which illustrates electrical connections of circuit components in a modified form of a power supply system.
Figure 59:
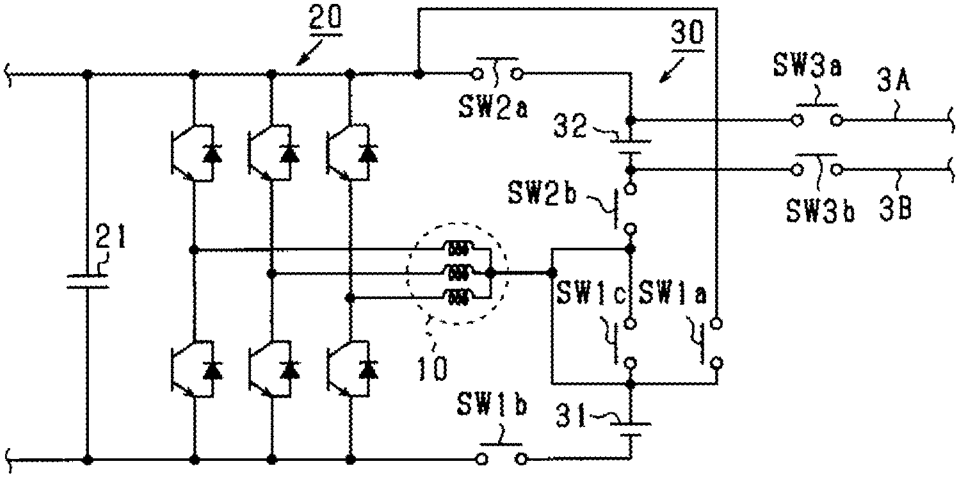
FIG. 59 is a circuit diagram which illustrates electrical connections of circuit components in a modified form of a power supply system.
Figure 60:
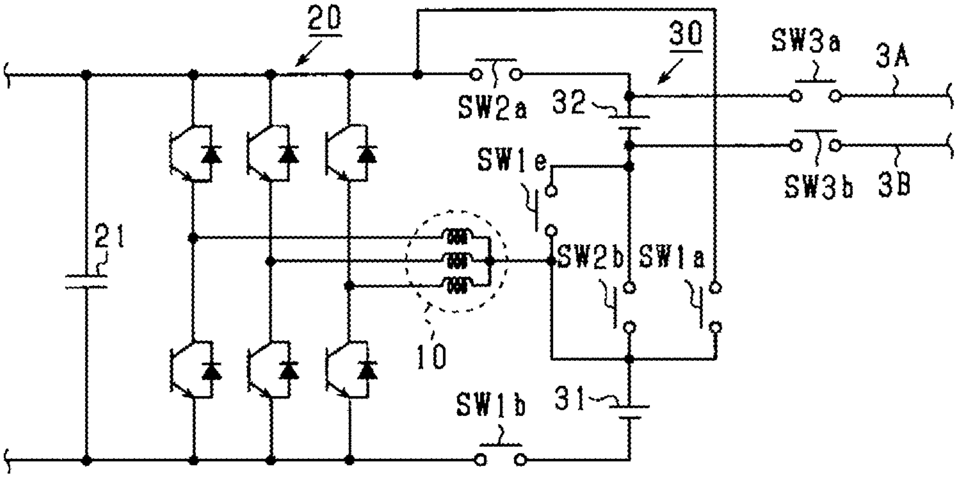
FIG. 60 is a circuit diagram which illustrates electrical connections of circuit components in a modified form of a power supply system.
Figure 61:
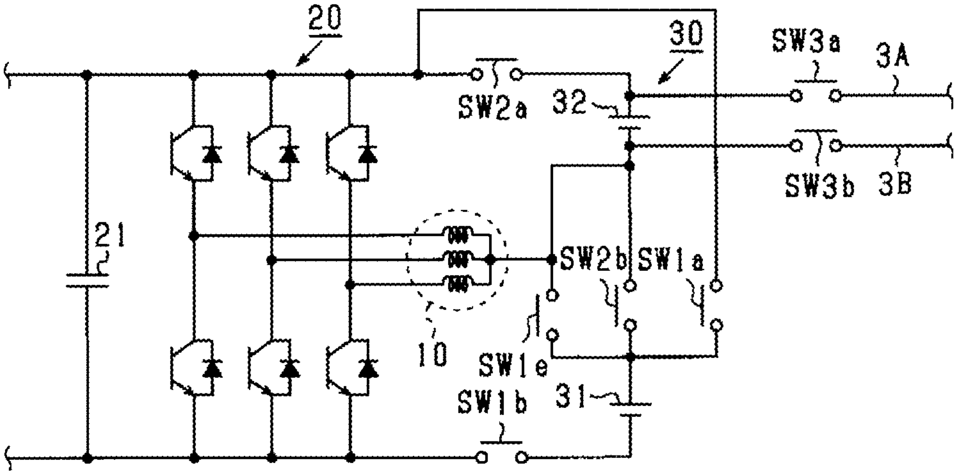
FIG. 61 is a circuit diagram which illustrates electrical connections of circuit components in a modified form of a power supply system.
Figure 62:
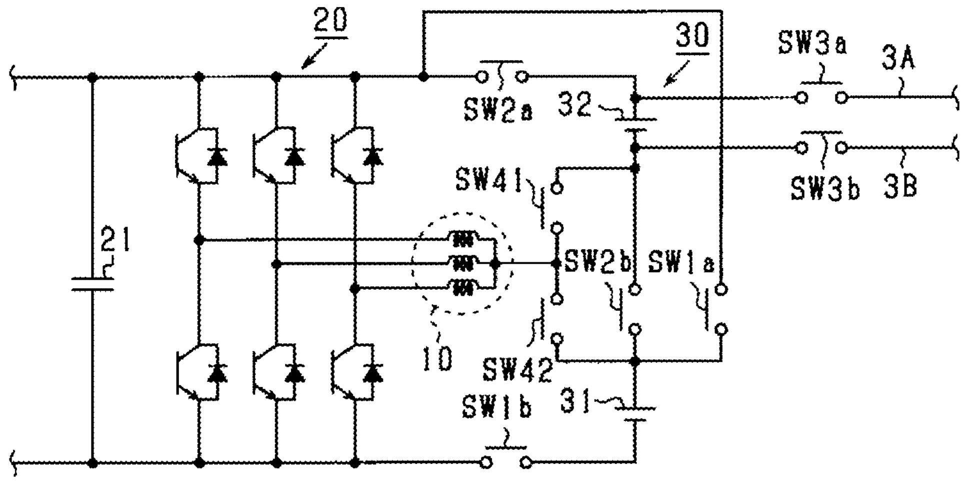
FIG. 62 is a circuit diagram which illustrates electrical connections of circuit components in a modified form of a power supply system.
Figure 63:
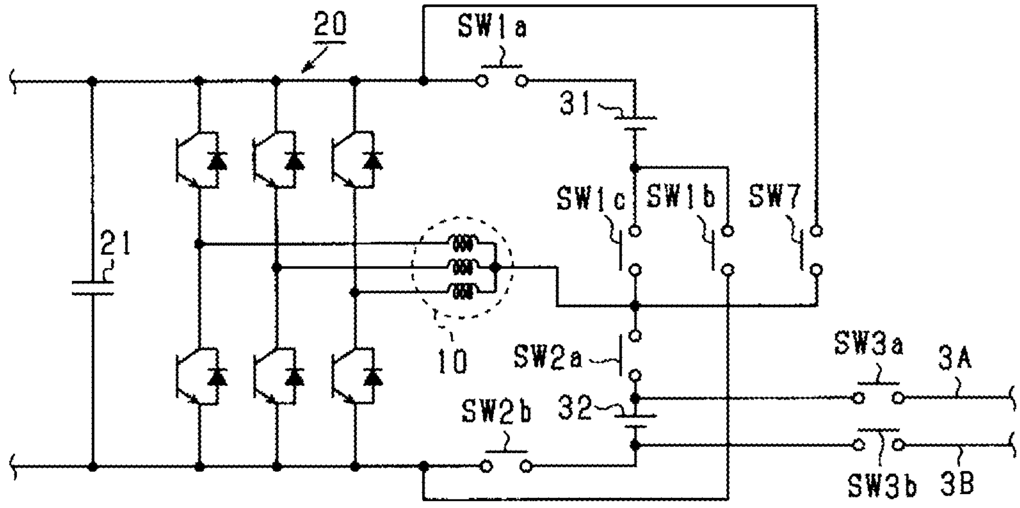
FIG. 63 is a circuit diagram which illustrates electrical connections of circuit components in a modified form of a power supply system.
Figure 64:
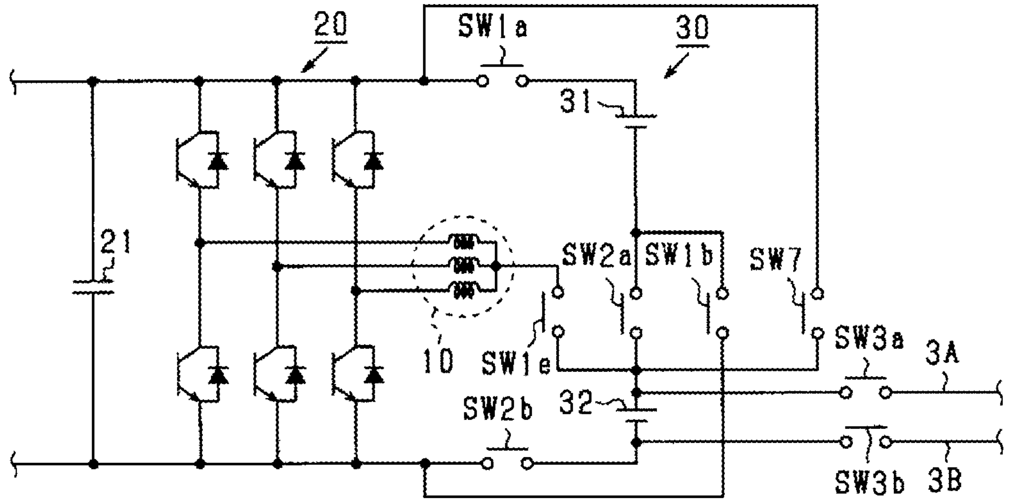
FIG. 64 is a circuit diagram which illustrates electrical connections of circuit components in a modified form of a power supply system.
Figure 65:
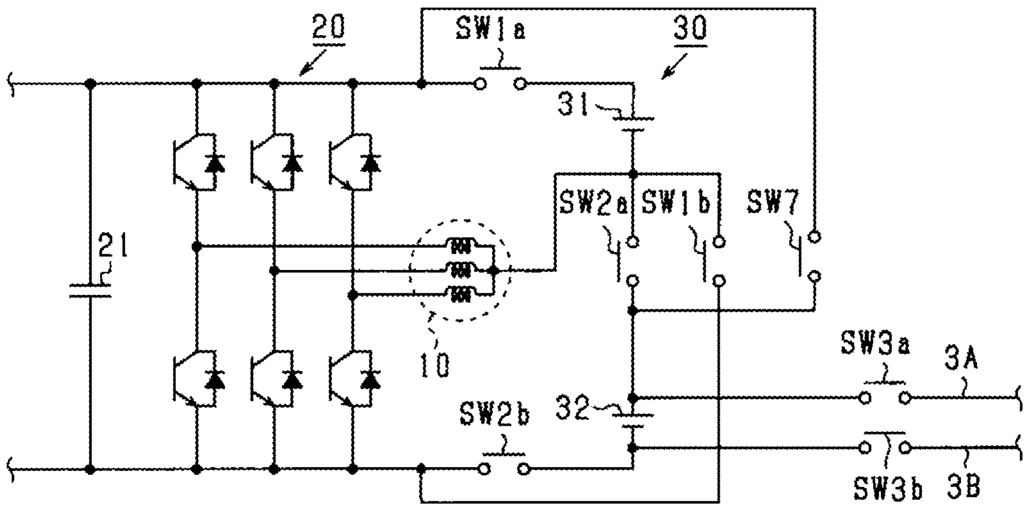
FIG. 65 is a circuit diagram which illustrates electrical connections of circuit components in a modified form of a power supply system.
Figure 66:
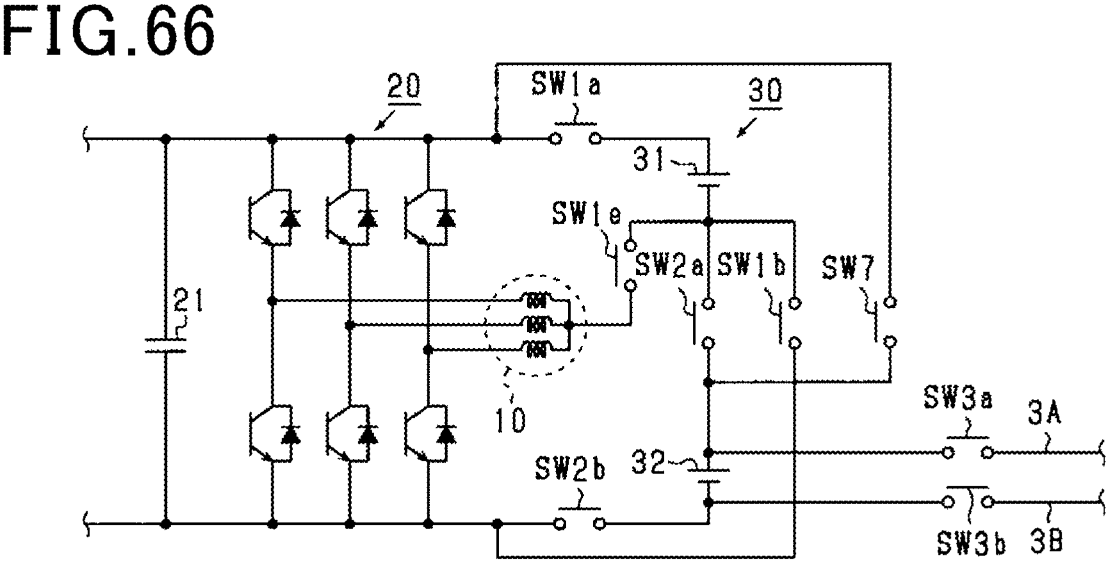
FIG. 66 is a circuit diagram which illustrates electrical connections of circuit components in a modified form of a power supply system.
Figure 67:
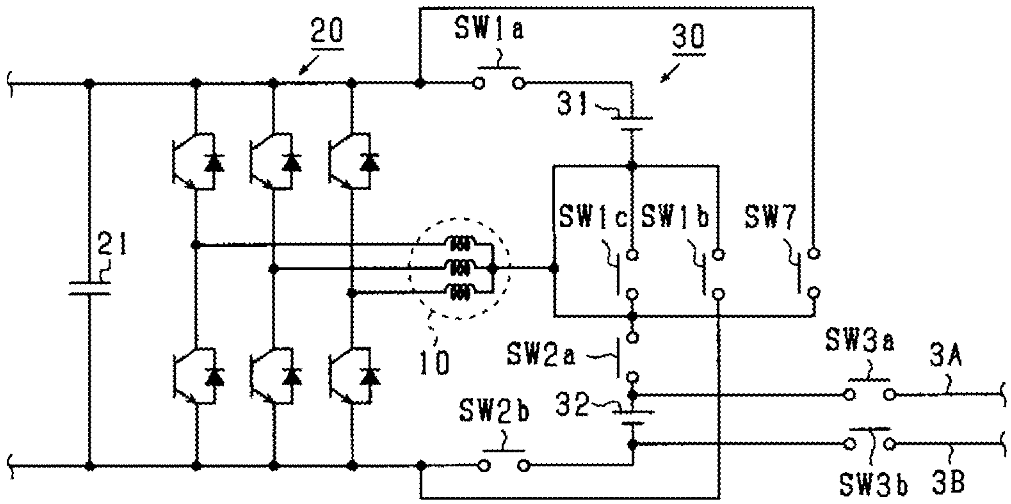
FIG. 67 is a circuit diagram which illustrates electrical connections of circuit components in a modified form of a power supply system.
Figure 68:
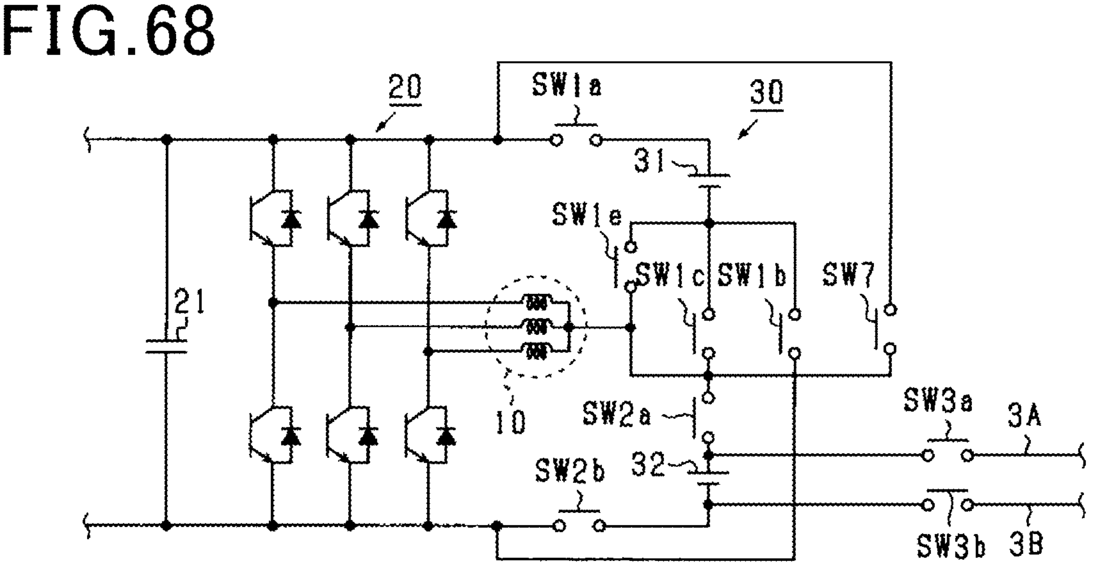
FIG. 68 is a circuit diagram which illustrates electrical connections of circuit components in a modified form of a power supply system.
Figure 69:
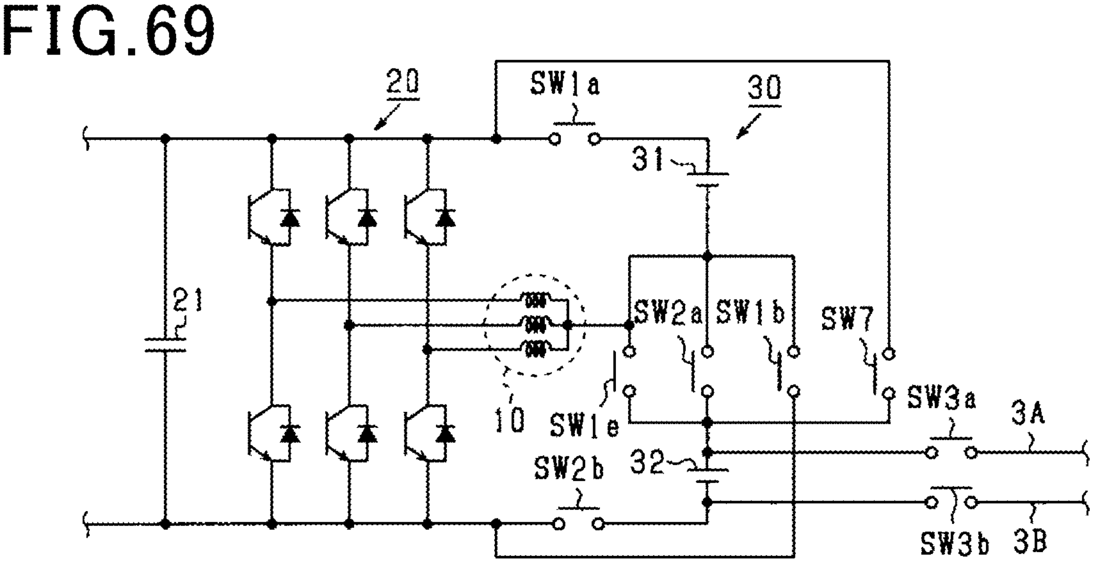
FIG. 69 is a circuit diagram which illustrates electrical connections of circuit components in a modified form of a power supply system.
Figure 70:
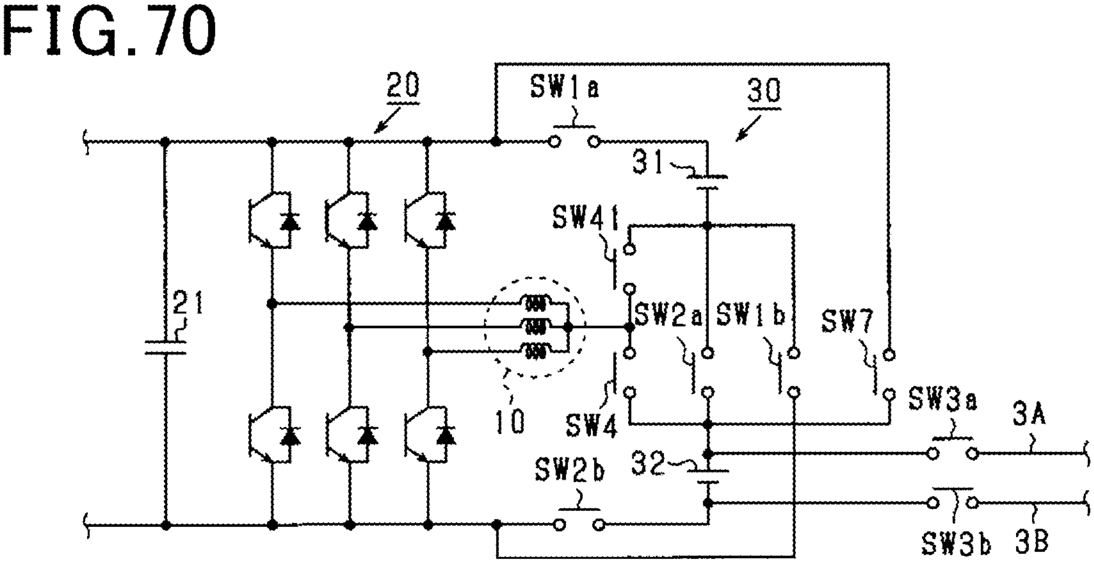
FIG. 70 is a circuit diagram which illustrates electrical connections of circuit components in a modified form of a power supply system.

The controller 100 then, as illustrated in FIG. 46(*f*), turns off the first-A switch SW1*a* and the first-B switch SW1*b*. In this modification, the first switches include the first-A switch SW1*a* and the first-B switch SW1*b*. When turning off the first-A switch SW1*a* and the first-B switch SW1*b*, the controller 100 diagnoses malfunctions of the first-A switch SW1*a* and the first-B switch SW1*b* in the same way as described above.

Afterwards, the controller 100 controls the operation of the inverter 20 to electrically discharge the in-inverter smoothing capacitor 21. This completes the switching operation in a state illustrated in FIG. 46(*g*). In this modification, the neutral point connecting switch includes the first-C switch SW1*c*, the first-D switch SW1*d*, and the first-E switch SW1*e*.

Other Modifications

In each of the above-described embodiments and modifications, a series-connected assembly of the pre-charge switch and the resistor may be connected in parallel both to the high-voltage power supply side switch and to the high-voltage ground line side switch. Alternatively, the pre-charge switch and the series-connected assembly may be connected only to the high-voltage ground line side switch. Each of the above-described embodiments and modifications may be designed not to have the series-connected assembly of the pre-charge switch and the resistor.

Instead of the first-C switch SW1*c*, the first-D switch SW1*d*, and the first-E switch SW1*e*, each of the above-described embodiments may include a first-Y switch working to establish or block an electrical connection of the first-B switch SW1*b* with a selected one of the positive terminal of the first storage battery 31 and the high-voltage power supply line H1. In this structure, a portion of the second-B electrical path 2B located between the negative terminal of the first storage battery 31 and the high-voltage ground line L1 defines a first-Y electrical path.

In the above-described embodiments where the first switch(es) is turned off to electrically disconnect between the first storage battery 31 and the high-voltage circuit 75, the controller 100 may be designed to control the on- or off-operation of the second switch(es) to diagnose the malfunction of the second switch(es).

The power supply system 30 in the first embodiment may alternatively be designed to have a circuit structure illustrated in each of FIG. 47 to FIG. 70.

In the above-described embodiments and modifications, the common path L10 is shared with the third-A electrical path 3A and the second-A electrical path 2A, but however, may alternatively be shared with at least portions of the third-B electrical path 3B and the second-B electrical path 2B. Such common path L10 may have the third current sensor A13 disposed therein.

In each of the above-described embodiments and modifications, each of the switches SW may be made of a single switch or a combination of a plurality of switches which are electrically connected in series or parallel to each other.

Each of the switches SWH and SWL of the inverter 20 in the above-described embodiments and modifications is, as described already, made of an IGBT, but may alternatively be made of an n-channel MOSFET with a body diode.

The motor 10 does not necessarily need to use star-connected windings, but may alternatively be made of delta-connected windings. The motor 10 and the inverter 20 are, as described above, designed to three phases, but may alternatively be configured for two or more than three phases. The motor 10 may be implemented by a synchronous motor equipped with permanent magnets functioning as field poles mounted on a rotor or a wound-field synchronous motor equipped with field windings functioning as magnetic poles on a rotor. Such a structure may have both field windings and permanent magnets mounted on the rotor. The motor 10 may alternatively be designed as an induction motor as well as a synchronous motor.

Instead of the first to third storage batteries 31 to 33, each of the above-described embodiments and modifications may have a high-capacitance electrical double-layer capacitor as well as an electrical energy storage or alternatively be designed to have a combination of a storage battery and an electrical double-layer capacitor.

A moving object on which the power supply system 30 is mounted is not necessarily a vehicle, such as an automobile, but may be an aircraft, a ship, or a boat. The power supply system 30 may alternatively be mounted on a stationary place.

The controller 100 in each of the above-described embodiments works to change the measurement range and the resolution of the third current sensor A13 depending on which of a first group of the second switches and a second group of the third switches is required to be diagnosed. The controller 100 may alternatively alters the measurement range and the resolution of the third current sensor A13 depending on the on- or off-state of each switch SW. For instance, when the first switches and the second switches are turned on, the third switches are tuned off, and the high-voltage circuit 75 is connected to the power supply system 30, the controller 100 may widen the measurement range and reduce the resolution of the third current sensor A13. Alternatively, when the second switches are turned off, the third switches are turned on, and the low-voltage circuit 76 is connected to the power supply system 30, the controller 100 may narrow the measurement range and raise the resolution of the third current sensor A13.

The sequence of the on- and off-operations of the switches SW to achieve the malfunction diagnosis in the above-described embodiments may be altered as needed. For instance, when it is required to diagnose the third switches at a first selected time, the controller 100 may first turn on or off the third-A switch SW3*a* and then turn on or off the third-B switch SW3*b*, while when it is required to diagnose the third switches at a second selected time, the controller 100 may first turn on or off the third-B switch SW3*b* and then turn on or off the third-A switch SW3*a*. This enables the diagnosis of each of the third-A switch SW3*a* and the third-B switch SW3*b* to be achieved when either of the third-A switch SW3*a* and the third-B switch SW3*b* is malfunctioning. The diagnosis of the second switches may be achieved in the same way as described above.

The controllers or how to construct them referred to in this disclosure may be realized by a special purpose computer which is equipped with a processor and a memory and programmed to execute one or a plurality of tasks created by computer-executed programs or alternatively established by a special purpose computer equipped with a processor made of one or a plurality of hardware logical circuits. The controllers or operations thereof referred to in this disclosure may alternatively be realized by a combination of an assembly of a processor with a memory which is programmed to perform one or a plurality of tasks and a processor made of one or a plurality of hardware logical circuits. Computer-executed programs may be stored as computer executed instructions in a non-transitory computer readable medium.

The above embodiments realize the following unique structures.

First Structure

A power supply system (30) is provided which is connected to a high-voltage circuit (75) through a high-voltage power supply line (H1) and a high-voltage ground line (L1), also connected to a low-voltage circuit (76) through a low-voltage power supply line (H2) and a low-voltage ground line (L2), and includes a plurality of electrical accumulators (31 to 32). The power supply system comprises: (a) a first switch which is configured to selectively establish or block an electrical connection of a first electrical accumulator that is one of the electrical accumulators to the high-voltage circuit; (b) a second switch which is configured to selectively establish or block an electrical connection of a second accumulator that is one of the electrical accumulators to the first electrical accumulator; (c) a third switch which is configured to selectively establish or block an electrical connection between the second electrical accumulator and the low-voltage circuit; (d) a switch controller (100) which is configured to control operations of the first switch, the second switch, and the third switch. The second switch includes a second-X switch and a second-Y switch. The second-X switch works to selectively connect or disconnect a second-X electrical path connecting between a first end of the second electrical accumulator and the first electrical accumulator. The second-Y switch works to electrically connect or disconnect a second-Y electrical path extending between a second end of the second electrical accumulator which is located away from the first end of the second electrical accumulator and one of the high-voltage power supply line and the high-voltage ground line. The third switch includes a third-X switch and a third-Y switch. The third-X switch works to electrically connect or disconnect a third-X electrical path extending between a positive terminal of the second electrical accumulator and the low-voltage power supply line. The third-Y switch works to electrically connect or disconnect a third-Y electrical path extending between a negative terminal of the second electrical accumulator and the low-voltage ground line. At least one of the third-X electrical path and the third-Y electrical path has a common path (L10). The common path of the third-X electrical path is shared with at least portions of the second-X electrical path and the second-Y electrical path. The common path of the third-Y electrical path is shared with at least portions of the second-X electrical path and the second-Y electrical path. The common path has a shared current sensor (A13) disposed therein.

Second Structure

The power supply system as set forth in the first structure, wherein the shared current sensor has a measurement range which is selectively changed depending on an on- or off-states of the first switch, the second switch, and the third switch, the shared current sensor also has a resolution which is selectively changed with a change in the measurement range.

Third Structure

The power supply system as set forth in the first or second structure, further comprising a malfunction determiner (100) which is configured to diagnose malfunctions of the first switch, the second switch, and the third switch. The malfunction determiner works to analyze an output from the shared current sensor obtained when the second switch is changed between an on-state and an off-state thereof to determine whether the second switch is malfunctioning. The malfunction determiner also works to analyze an output from the shared current sensor obtained when the third switch is changed between an on-state and an off-state thereof to determine whether the third switch is malfunctioning.

Fourth Structure

The power supply system as set forth in the third structure, wherein the measurement range of the shared current sensor is selectively changed depending upon the on- and off-states of the first switch, the second switch, and the third switch. The resolution of the shared current sensor is changed with a change in the measurement range. The malfunction determiner changes the measurement range depending upon which of the second switch and the third switch is required to be diagnosed in malfunction.

Fifth Structure

A program is provided which is executable by a controller (100) installed in a power supply system (30) which is connected to a high-voltage circuit (75) through a high-voltage power supply line (H1) and a high-voltage ground line (L1), also connected to a low-voltage circuit (76) through a low-voltage power supply line (H2) and a low-voltage ground line (L2), and includes a plurality of electrical accumulators (31 to 32). The power supply system comprises: (a) a first switch which is configured to selectively establish or block an electrical connection of a first electrical accumulator that is one of the electrical accumulators to the high-voltage circuit; (b) a second switch which is configured to selectively establish or block an electrical connection of a second accumulator that is one of the electrical accumulators to the first electrical accumulator; and (c) a third switch which is configured to selectively establish or block an electrical connection between the second electrical accumulator and the low-voltage circuit. The second switch includes a second-X switch and a second-Y switch. The second-X switch works to selectively connect or disconnect a second-X electrical path connecting between a first end of the second electrical accumulator and the first electrical accumulator. The second-Y switch works to electrically connect or disconnect a second-Y electrical path extending between a second end of the second electrical accumulator which is located away from the first end of the second electrical accumulator and one of the high-voltage power supply line and the high-voltage ground line. The third switch includes a third-X switch and a third-Y switch. The third-X switch works to electrically connect or disconnect a third-X electrical path extending between a positive terminal of the second electrical accumulator and the low-voltage power supply line. The third-Y switch works to electrically connect or disconnect a third-Y electrical path extending between a negative terminal of the second electrical accumulator and the low-voltage ground line. The program performs: (a) a switch control task to control operations of the first switch, the second switch, and the third switch; and a malfunction diagnosis task to diagnose malfunctions of the first switch, the second switch, and the third switch. At least one of the third-X electrical path and the third-Y electrical path has a common path (L10). The common path of the third-X electrical path is shared with at least portions of the second-X electrical path and the second-Y electrical path. The common path of the third-Y electrical path is shared with at least portions of the second-X electrical path and the second-Y electrical path. The common path has a shared current sensor (A13) disposed therein. The malfunction diagnosis task works to analyze an output from the shared current sensor obtained when the second switch is changed between an on-state and an off-state thereof to determine whether the second switch is malfunctioning. The malfunction diagnosis task also works to analyze an output from the shared current sensor obtained when the third switch is changed between an on-state and an off-state thereof to determine whether the third switch is malfunctioning.

This disclosure has referred to the above embodiment, but however, it is not limited to the above embodiments, but may be realized by various embodiments without departing from the purpose of the disclosure. This disclosure includes all possible combinations of the features of the above embodiments, features similar to or equivalents of the parts of the above embodiments, or modifications of the above embodiments. The structures in this disclosure may include only one or some of the features discussed in the above embodiments unless otherwise inconsistent with the aspects of this disclosure.

What is claimed is:

1. A power supply system which is connected to a high-voltage circuit through a high-voltage power supply line and a high-voltage ground line, also connected to a low-voltage circuit through a low-voltage power supply line and a low-voltage ground line, and includes a plurality of electrical accumulators, comprising:

a first switch which is configured to selectively establish or block an electrical connection of a first electrical accumulator that is one of the electrical accumulators to the high-voltage circuit;

a second switch which is configured to selectively establish or block an electrical connection of a second accumulator that is one of the electrical accumulators to the first electrical accumulator;

a third switch which is configured to selectively establish or block an electrical connection between the second electrical accumulator and the low-voltage circuit;

a switch controller which is configured to control operations of the first switch, the second switch, and the third switch, and wherein the second switch includes a second-X switch and a second-Y switch, the second-X switch working to selectively connect or disconnect a second-X electrical path connecting between a first end of the second electrical accumulator and the first electrical accumulator, the second-Y switch working to electrically connect or disconnect a second-Y electrical path extending between a second end of the second electrical accumulator which is located away from the first end of the second electrical accumulator and one of the high-voltage power supply line and the high-voltage ground line, the third switch includes a third-X switch and a third-Y switch, the third-X switch working to electrically connect or disconnect a third-X electrical path extending between a positive terminal of the second electrical accumulator and the low-voltage power supply line, the third-Y switch working to electrically connect or disconnect a third-Y electrical path extending between a negative terminal of the second electrical accumulator and the low-voltage ground line, at least one of the third-X electrical path and the third-Y electrical path has a common path, the common path of the third-X electrical path being shared with at least portions of the second-X electrical path and the second-Y electrical path, the common path of the third-Y electrical path being shared with at least portions of the second-X electrical path and the second-Y electrical path, and the common path has a shared current sensor disposed therein.

2. The power supply system as set forth in claim 1, wherein the shared current sensor has a measurement range which is selectively changed depending on an on- or off-states of the first switch, the second switch, and the third switch, the shared current sensor also has a resolution which is selectively changed with a change in the measurement range.

3. The power supply system as set forth in claim 1, further comprising a malfunction determiner which is configured to diagnose malfunctions of the first switch, the second switch, and the third switch, and wherein the malfunction determiner works to analyze an output from the shared current sensor obtained when the second switch is changed between an on-state and an off-state thereof to determine whether the second switch is malfunctioning, the malfunction determiner also works to analyze an output from the shared current sensor obtained when the third switch is changed between an on-state and an off-state thereof to determine whether the third switch is malfunctioning.

4. The power supply system as set forth in claim 3, wherein the measurement range of the shared current sensor is selectively changed depending upon the on- and off-states of the first switch, the second switch, and the third switch, the resolution of the shared current sensor is changed with a change in the measurement range, the malfunction determiner changes the measurement range depending upon which of the second switch and the third switch is required to be diagnosed in malfunction.

5. A non-transitory computer-readable medium storing a program executable by a controller installed in a power supply system which is connected to a high-voltage circuit through a high-voltage power supply line and a high-voltage ground line, also connected to a low-voltage circuit through a low-voltage power supply line and a low-voltage ground line, and includes a plurality of electrical accumulators, the power supply system comprising:

(a) a first switch which is configured to selectively establish or block an electrical connection of a first electrical accumulator that is one of the electrical accumulators to the high-voltage circuit;

(b) a second switch which is configured to selectively establish or block an electrical connection of a second accumulator that is one of the electrical accumulators to the first electrical accumulator; and (c) a third switch which is configured to selectively establish or block an electrical connection between the second electrical accumulator and the low-voltage circuit, wherein the second switch includes a second-X switch and a second-Y switch, the second-X switch working to selectively connect or disconnect a second-X electrical path connecting between a first end of the second electrical accumulator and the first electrical accumulator, the second-Y switch working to electrically connect or disconnect a second-Y electrical path extending between a second end of the second electrical accumulator which is located away from the first end of the second electrical accumulator and one of the high-voltage power supply line and the high-voltage ground line, the third switch includes a third-X switch and a third-Y switch, the third-X switch working to electrically connect or disconnect a third-X electrical path extending between a positive terminal of the second electrical accumulator and the low-voltage power supply line, the third-Y switch working to electrically connect or disconnect a third-Y electrical path extending between a negative terminal of the second electrical accumulator and the low-voltage ground line, the program causing the controller to perform:

a switch control task to control operations of the first switch, the second switch, and the third switch; and a malfunction diagnosis task to diagnose malfunctions of the first switch, the second switch, and the third switch, wherein at least one of the third-X electrical path and the third-Y electrical path has a common path, the common path of the third-X electrical path being shared with at least portions of the second-X electrical path and the second-Y electrical path, the common path of the third-Y electrical path being shared with at least portions of the second-X electrical path and the second-Y electrical path, the common path has a shared current sensor disposed therein, the malfunction diagnosis task works to analyze an output from the shared current sensor obtained when the second switch is changed between an on-state and an off-state thereof to determine whether the second switch is malfunctioning, and the malfunction diagnosis task also works to analyze an output from the shared current sensor obtained when the third switch is changed between an on-state and an off-state thereof to determine whether the third switch is malfunctioning.

6. The power supply system as set forth in claim 2, further comprising a malfunction determiner which is configured to diagnose malfunctions of the first switch, the second switch, and the third switch, and wherein the malfunction determiner works to analyze an output from the shared current sensor obtained when the second switch is changed between an on-state and an off-state thereof to determine whether the second switch is malfunctioning, the malfunction determiner also works to analyze an output from the shared current sensor obtained when the third switch is changed between an on-state and an off-state thereof to determine whether the third switch is malfunctioning.

7. The power supply system as set forth in claim 6, wherein the measurement range of the shared current sensor is selectively changed depending upon the on- and off-states of the first switch, the second switch, and the third switch, the resolution of the shared current sensor is changed with a change in the measurement range, the malfunction determiner changes the measurement range depending upon which of the second switch and the third switch is required to be diagnosed in malfunction.

* * * * *